United States Patent
Sapp

(10) Patent No.: US 8,084,327 B2
(45) Date of Patent: Dec. 27, 2011

(54) METHOD FOR FORMING TRENCH GATE FIELD EFFECT TRANSISTOR WITH RECESSED MESAS USING SPACERS

(75) Inventor: Steven Sapp, Felton, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 150 days.

(21) Appl. No.: 12/346,626

(22) Filed: Dec. 30, 2008

(65) Prior Publication Data

US 2009/0111227 A1    Apr. 30, 2009

Related U.S. Application Data

(63) Continuation of application No. 11/398,467, filed on Apr. 4, 2006, now Pat. No. 7,504,306.

(60) Provisional application No. 60/669,063, filed on Apr. 6, 2005.

(51) Int. Cl.
*H01L 21/336* (2006.01)

(52) U.S. Cl. .. 438/270; 438/272; 438/589; 257/E21.428

(58) Field of Classification Search .................. 438/270, 438/271, 272, 589, 259, 273; 257/E21.428
See application file for complete search history.

(56) References Cited

U.S. PATENT DOCUMENTS

| | | |
|---|---|---|
| 3,404,295 A | 10/1968 | Warner et al. |
| 3,412,297 A | 11/1968 | Amlinger |
| 3,497,777 A | 2/1970 | Teszner et al. |

(Continued)

FOREIGN PATENT DOCUMENTS

CN    1036666 A    10/1989

(Continued)

OTHER PUBLICATIONS

Andreini et al., "A New Integrated Silicon Gate Technology Combining Bipolar Linear, CMOS Logic, and DMOS Power Parts," IEEE Transactions on Electron Devices, Dec. 1986, pp. 2025-2030, vol. ED-33, No. 12, IEEE.

(Continued)

*Primary Examiner* — Michael Trinh
(74) *Attorney, Agent, or Firm* — Kilpatrick Townsend & Stockton LLP

(57) ABSTRACT

A method for forming a field effect transistor with an active area and a termination region surrounding the active area includes forming a well region in a first silicon region, where the well region and the first silicon region are of opposite conductivity type. Gate trenches extending through the well region and terminating within the first silicon region are formed. A recessed gate is formed in each gate trench. A dielectric cap is formed over each recessed gate. The well region is recessed between adjacent trenches to expose upper sidewalls of each dielectric cap. A blanket source implant is carried out to form a second silicon region in an upper portion of the recessed well region between every two adjacent trenches. A dielectric spacer is formed along each exposed upper sidewall of the dielectric cap, with every two adjacent dielectric spacers located between every two adjacent gate trenches forming an opening over the second silicon region. The second silicon region is recessed through the opening between every two adjacent dielectric spacers so that only portions of the second silicon region directly below the dielectric spacers remain. The remaining portions of the second silicon region form source regions.

16 Claims, 29 Drawing Sheets

U.S. PATENT DOCUMENTS

| | | |
|---|---|---|
| 3,564,356 A | 2/1971 | Wilson |
| 3,660,697 A | 5/1972 | Berglund et al. |
| 4,003,072 A | 1/1977 | Matsushita et al. |
| 4,011,105 A | 3/1977 | Paivinen et al. |
| 4,300,150 A | 11/1981 | Colak |
| 4,324,038 A | 4/1982 | Chang et al. |
| 4,326,332 A | 4/1982 | Kenney et al. |
| 4,337,474 A | 6/1982 | Yukimoto |
| 4,338,616 A | 7/1982 | Bol |
| 4,345,265 A | 8/1982 | Blanchard |
| 4,445,202 A | 4/1984 | Goetze et al. |
| 4,568,958 A | 2/1986 | Baliga |
| 4,579,621 A | 4/1986 | Hine |
| 4,636,281 A | 1/1987 | Buiguez et al. |
| 4,638,344 A | 1/1987 | Cardwell, Jr. |
| 4,639,761 A | 1/1987 | Singer et al. |
| 4,673,962 A | 6/1987 | Chatterjee et al. |
| 4,694,313 A | 9/1987 | Beasom |
| 4,698,653 A | 10/1987 | Cardwell, Jr. |
| 4,716,126 A | 12/1987 | Cogan |
| 4,745,079 A | 5/1988 | Pfiester |
| 4,746,630 A | 5/1988 | Hui et al. |
| 4,754,310 A | 6/1988 | Coe |
| 4,767,722 A | 8/1988 | Blanchard |
| 4,774,556 A | 9/1988 | Fujii et al. |
| 4,801,986 A | 1/1989 | Chang et al. |
| 4,821,095 A | 4/1989 | Temple |
| 4,823,176 A | 4/1989 | Baliga et al. |
| 4,824,793 A | 4/1989 | Richardson et al. |
| 4,853,345 A | 8/1989 | Himelick |
| 4,868,624 A | 9/1989 | Grung et al. |
| 4,893,160 A | 1/1990 | Blanchard |
| 4,914,058 A | 4/1990 | Blanchard |
| 4,941,026 A | 7/1990 | Temple |
| 4,961,100 A | 10/1990 | Baliga et al. |
| 4,967,245 A | 10/1990 | Cogan et al. |
| 4,969,028 A | 11/1990 | Baliga |
| 4,974,059 A | 11/1990 | Kinzer |
| 4,983,535 A | 1/1991 | Blanchard |
| 4,990,463 A | 2/1991 | Mori |
| 4,992,390 A | 2/1991 | Chang |
| 5,023,196 A | 6/1991 | Johnsen et al. |
| 5,027,180 A | 6/1991 | Nishizawa et al. |
| 5,034,785 A | 7/1991 | Blanchard |
| 5,065,273 A | 11/1991 | Rajeevakumar |
| 5,071,782 A | 12/1991 | Mori |
| 5,072,266 A | 12/1991 | Buluccea |
| 5,079,608 A | 1/1992 | Wodarczyk et al. |
| 5,105,243 A | 4/1992 | Nakagawa et al. |
| 5,111,253 A | 5/1992 | Korman et al. |
| 5,134,448 A | 7/1992 | Johnsen et al. |
| 5,142,640 A | 8/1992 | Iwanatsu |
| 5,156,989 A | 10/1992 | Williams et al. |
| 5,164,325 A | 11/1992 | Cogan et al. |
| 5,164,802 A | 11/1992 | Jones et al. |
| 5,168,331 A | 12/1992 | Yilmaz |
| 5,168,973 A | 12/1992 | Asayama et al. |
| 5,188,973 A | 2/1993 | Omura et al. |
| 5,208,657 A | 5/1993 | Chatterjee et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,242,845 A | 9/1993 | Baba et al. |
| 5,250,450 A | 10/1993 | Lee et al. |
| 5,262,336 A | 11/1993 | Pike, Jr. et al. |
| 5,268,311 A | 12/1993 | Euen et al. |
| 5,270,257 A | 12/1993 | Shin |
| 5,275,961 A | 1/1994 | Smayling et al. |
| 5,275,965 A | 1/1994 | Manning |
| 5,281,548 A | 1/1994 | Prall |
| 5,283,201 A | 2/1994 | Tsang et al. |
| 5,283,452 A | 2/1994 | Shih et al. |
| 5,294,824 A | 3/1994 | Okada |
| 5,298,781 A | 3/1994 | Cogan et al. |
| 5,300,447 A | 4/1994 | Anderson |
| 5,300,452 A | 4/1994 | Chang et al. |
| 5,326,711 A | 7/1994 | Malhi |
| 5,346,834 A | 9/1994 | Hisamoto et al. |
| 5,349,224 A | 9/1994 | Gilbert et al. |
| 5,350,937 A | 9/1994 | Yamazaki et al. |
| 5,365,102 A | 11/1994 | Mehrotra et al. |
| 5,366,914 A | 11/1994 | Takahashi et al. |
| 5,378,655 A | 1/1995 | Hutchings et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,434,435 A | 7/1995 | Baliga |
| 5,436,189 A | 7/1995 | Beasom |
| 5,438,007 A | 8/1995 | Vinal et al. |
| 5,438,215 A | 8/1995 | Tihanyi |
| 5,442,214 A | 8/1995 | Yang |
| 5,473,176 A | 12/1995 | Kakumoto |
| 5,473,180 A | 12/1995 | Ludikhuize |
| 5,474,943 A | 12/1995 | Hshieh et al. |
| 5,488,010 A | 1/1996 | Wong |
| 5,519,245 A | 5/1996 | Tokura et al. |
| 5,532,179 A | 7/1996 | Chang et al. |
| 5,541,425 A | 7/1996 | Nishihara |
| 5,554,552 A | 9/1996 | Chi |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A | 11/1996 | Hshieh et al. |
| 5,581,100 A | 12/1996 | Ajit |
| 5,583,060 A | 12/1996 | Hertrich et al. |
| 5,583,065 A | 12/1996 | Miwa |
| 5,592,005 A | 1/1997 | Floyd et al. |
| 5,593,909 A | 1/1997 | Han et al. |
| 5,595,927 A | 1/1997 | Chen et al. |
| 5,597,765 A | 1/1997 | Yilmaz et al. |
| 5,605,852 A | 2/1997 | Bencuya |
| 5,614,749 A | 3/1997 | Ueno |
| 5,616,945 A | 4/1997 | Williams |
| 5,623,152 A | 4/1997 | Majumdar et al. |
| 5,629,543 A | 5/1997 | Hshieh et al. |
| 5,637,898 A | 6/1997 | Baliga |
| 5,639,676 A | 6/1997 | Hshieh et al. |
| 5,640,034 A | 6/1997 | Malhi |
| 5,648,283 A | 7/1997 | Tsang et al. |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,684,320 A | 11/1997 | Kawashima |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,717,237 A | 2/1998 | Chi |
| 5,719,409 A | 2/1998 | Singh et al. |
| 5,721,148 A | 2/1998 | Nishimura |
| 5,744,372 A | 4/1998 | Bulucea |
| 5,767,004 A | 6/1998 | Balasubramanian et al. |
| 5,770,878 A | 6/1998 | Beasom |
| 5,776,813 A | 7/1998 | Huang et al. |
| 5,780,343 A | 7/1998 | Bashir |
| 5,801,082 A | 9/1998 | Tseng |
| 5,801,417 A | 9/1998 | Tsang et al. |
| 5,814,858 A | 9/1998 | Williams |
| 5,821,583 A | 10/1998 | Hshieh et al. |
| 5,877,528 A | 3/1999 | So |
| 5,879,971 A | 3/1999 | Witek |
| 5,879,994 A | 3/1999 | Kwan et al. |
| 5,891,776 A | 4/1999 | Han et al. |
| 5,894,157 A | 4/1999 | Han et al. |
| 5,895,951 A | 4/1999 | So et al. |
| 5,895,952 A | 4/1999 | Darwish et al. |
| 5,897,343 A | 4/1999 | Mathew et al. |
| 5,897,360 A | 4/1999 | Kawaguchi |

| Patent | Date | Inventor |
|---|---|---|
| 5,900,663 A | 5/1999 | Johnson et al. |
| 5,906,680 A | 5/1999 | Meyerson |
| 5,907,776 A | 5/1999 | Hshieh et al. |
| 5,917,216 A | 6/1999 | Floyd et al. |
| 5,929,481 A | 7/1999 | Hsieh et al. |
| 5,943,581 A | 8/1999 | Lu et al. |
| 5,945,708 A | 8/1999 | Tihanyi |
| 5,949,104 A | 9/1999 | D'Anna et al. |
| 5,949,124 A | 9/1999 | Hadizad et al. |
| 5,959,324 A | 9/1999 | Kohyama |
| 5,960,271 A | 9/1999 | Wollesen et al. |
| 5,960,311 A | 9/1999 | Singh et al. |
| 5,972,741 A | 10/1999 | Kubo et al. |
| 5,973,360 A | 10/1999 | Tihanyi |
| 5,973,367 A | 10/1999 | Williams |
| 5,976,936 A | 11/1999 | Miyajima et al. |
| 5,977,591 A | 11/1999 | Fratin et al. |
| 5,981,344 A | 11/1999 | Hshieh et al. |
| 5,981,354 A | 11/1999 | Spikes et al. |
| 5,981,996 A | 11/1999 | Fujishima |
| 5,998,833 A | 12/1999 | Baliga |
| 6,005,271 A | 12/1999 | Hshieh |
| 6,008,097 A | 12/1999 | Yoon et al. |
| 6,008,520 A | 12/1999 | Darwish et al. |
| 6,011,298 A | 1/2000 | Blanchard |
| 6,015,727 A | 1/2000 | Wanlass |
| 6,020,250 A | 2/2000 | Kenny et al. |
| 6,034,415 A | 3/2000 | Johnson et al. |
| 6,037,202 A | 3/2000 | Witek |
| 6,037,628 A | 3/2000 | Huang |
| 6,037,632 A | 3/2000 | Omura et al. |
| 6,037,633 A | 3/2000 | Shinohara |
| 6,040,600 A | 3/2000 | Uenishi et al. |
| 6,048,772 A | 4/2000 | D'Anna |
| 6,049,108 A | 4/2000 | Williams et al. |
| 6,051,488 A | 4/2000 | Lee et al. |
| 6,057,558 A | 5/2000 | Yamamoto et al. |
| 6,063,678 A | 5/2000 | D'Anna |
| 6,064,088 A | 5/2000 | D'Anna |
| 6,066,878 A | 5/2000 | Neilson |
| 6,069,043 A | 5/2000 | Floyd et al. |
| 6,069,385 A | 5/2000 | Blanchard |
| 6,072,215 A | 6/2000 | Kawaji et al. |
| 6,077,733 A | 6/2000 | Chen et al. |
| 6,081,009 A | 6/2000 | Neilson |
| 6,084,264 A | 7/2000 | Darwish |
| 6,084,268 A | 7/2000 | de Frésart et al. |
| 6,087,232 A | 7/2000 | Kim et al. |
| 6,096,608 A | 8/2000 | Williams |
| 6,097,063 A | 8/2000 | Fujihira |
| 6,103,578 A | 8/2000 | Uenishi et al. |
| 6,103,619 A | 8/2000 | Lai |
| 6,104,054 A | 8/2000 | Corsi et al. |
| 6,110,799 A | 8/2000 | Huang |
| 6,114,727 A | 9/2000 | Ogura et al. |
| 6,121,089 A | 9/2000 | Zeng et al. |
| 6,137,152 A | 10/2000 | Wu |
| 6,140,678 A | 10/2000 | Grabowski et al. |
| 6,150,697 A | 11/2000 | Teshigahara et al. |
| 6,156,606 A | 12/2000 | Michaelis |
| 6,156,611 A | 12/2000 | Lan et al. |
| 6,163,052 A | 12/2000 | Liu et al. |
| 6,165,870 A | 12/2000 | Shim et al. |
| 6,168,983 B1 | 1/2001 | Rumennik et al. |
| 6,168,996 B1 | 1/2001 | Numazawa et al. |
| 6,171,935 B1 | 1/2001 | Nance et al. |
| 6,174,769 B1 | 1/2001 | Lou |
| 6,174,773 B1 | 1/2001 | Fujishima |
| 6,174,785 B1 | 1/2001 | Parekh et al. |
| 6,184,092 B1 | 2/2001 | Tseng et al. |
| 6,184,545 B1 | 2/2001 | Werner et al. |
| 6,184,555 B1 | 2/2001 | Tihanyi et al. |
| 6,188,104 B1 | 2/2001 | Choi et al. |
| 6,188,105 B1 | 2/2001 | Kocon et al. |
| 6,190,978 B1 | 2/2001 | D'Anna |
| 6,191,447 B1 | 2/2001 | Baliga |
| 6,194,741 B1 * | 2/2001 | Kinzer et al. ............... 257/77 |
| 6,198,127 B1 | 3/2001 | Kocon |
| 6,201,279 B1 | 3/2001 | Pfirsch |
| 6,204,097 B1 | 3/2001 | Shen et al. |
| 6,207,994 B1 | 3/2001 | Rumennik et al. |
| 6,222,229 B1 | 4/2001 | Hebert et al. |
| 6,222,233 B1 | 4/2001 | D'Anna |
| 6,225,649 B1 | 5/2001 | Minato |
| 6,228,727 B1 | 5/2001 | Lim et al. |
| 6,229,194 B1 | 5/2001 | Lizotte |
| 6,239,463 B1 | 5/2001 | Williams et al. |
| 6,239,464 B1 | 5/2001 | Tsuchitani et al. |
| 6,246,090 B1 | 6/2001 | Brush et al. |
| 6,251,730 B1 * | 6/2001 | Luo ............................... 438/270 |
| 6,262,453 B1 | 7/2001 | Hsieh |
| 6,265,269 B1 | 7/2001 | Chen et al. |
| 6,271,082 B1 | 8/2001 | Hou et al. |
| 6,271,100 B1 | 8/2001 | Ballantine et al. |
| 6,271,552 B1 | 8/2001 | D'Anna |
| 6,271,562 B1 | 8/2001 | Deboy et al. |
| 6,274,437 B1 | 8/2001 | Evans |
| 6,274,904 B1 | 8/2001 | Tihanyi |
| 6,274,905 B1 | 8/2001 | Mo |
| 6,277,706 B1 | 8/2001 | Ishikawa |
| 6,281,547 B1 | 8/2001 | So et al. |
| 6,285,060 B1 | 9/2001 | Korec et al. |
| 6,291,298 B1 | 9/2001 | Williams et al. |
| 6,291,856 B1 | 9/2001 | Miyasaka et al. |
| 6,294,818 B1 | 9/2001 | Fujihira |
| 6,297,534 B1 | 10/2001 | Kawaguchi et al. |
| 6,303,969 B1 | 10/2001 | Tan |
| 6,307,246 B1 | 10/2001 | Nitta et al. |
| 6,309,920 B1 | 10/2001 | Laska et al. |
| 6,313,482 B1 | 11/2001 | Baliga |
| 6,316,806 B1 | 11/2001 | Mo |
| 6,326,656 B1 | 12/2001 | Tihanyi |
| 6,337,499 B1 | 1/2002 | Werner |
| 6,346,464 B1 | 2/2002 | Takeda et al. |
| 6,346,469 B1 | 2/2002 | Greer |
| 6,351,018 B1 | 2/2002 | Sapp |
| 6,689,662 B2 * | 2/2002 | Blanchard |
| 6,353,252 B1 | 3/2002 | Yasuhara et al. |
| 6,359,308 B1 | 3/2002 | Hijzen et al. |
| 6,362,112 B1 | 3/2002 | Hamerski |
| 6,362,505 B1 | 3/2002 | Tihanyi |
| 6,365,462 B2 | 4/2002 | Baliga |
| 6,365,930 B1 | 4/2002 | Schillaci et al. |
| 6,368,920 B1 | 4/2002 | Beasom |
| 6,368,921 B1 | 4/2002 | Hijzen et al. |
| 6,373,097 B1 | 4/2002 | Werner |
| 6,373,098 B1 | 4/2002 | Brush et al. |
| 6,376,314 B1 | 4/2002 | Jerred |
| 6,376,315 B1 | 4/2002 | Hshieh et al. |
| 6,376,878 B1 | 4/2002 | Kocon |
| 6,376,890 B1 | 4/2002 | Tihanyi |
| 6,384,456 B1 | 5/2002 | Tihanyi |
| 6,388,286 B1 | 5/2002 | Baliga |
| 6,388,287 B2 | 5/2002 | Deboy et al. |
| 6,392,290 B1 | 5/2002 | Kasem et al. |
| 6,396,102 B1 | 5/2002 | Calafut |
| 6,400,003 B1 | 6/2002 | Huang |
| 6,413,822 B2 | 7/2002 | Williams et al. |
| 6,426,260 B1 | 7/2002 | Hshieh |
| 6,429,481 B1 | 8/2002 | Mo et al. |
| 6,433,385 B1 | 8/2002 | Kocon et al. |
| 6,436,779 B2 | 8/2002 | Hurkx et al. |
| 6,437,399 B1 | 8/2002 | Huang |
| 6,441,454 B2 | 8/2002 | Hijzen et al. |
| 6,444,527 B1 | 9/2002 | Floyd et al. |
| 6,444,574 B1 | 9/2002 | Chu |
| 6,452,230 B1 | 9/2002 | Boden, Jr. |
| 6,455,379 B2 | 9/2002 | Brush et al. |
| 6,459,122 B2 | 10/2002 | Uno |
| 6,461,918 B1 | 10/2002 | Calafut |
| 6,465,304 B1 | 10/2002 | Blanchard et al. |
| 6,465,843 B1 | 10/2002 | Hirler et al. |
| 6,465,869 B2 | 10/2002 | Ahlers et al. |
| 6,472,678 B1 | 10/2002 | Hshieh et al. |
| 6,472,708 B1 | 10/2002 | Hshieh et al. |
| 6,475,884 B2 | 11/2002 | Hshieh et al. |
| 6,476,443 B1 | 11/2002 | Kinzer |
| 6,479,352 B2 | 11/2002 | Blanchard |

| | | | |
|---|---|---|---|
| 6,489,652 B1 | 12/2002 | Jeon et al. | |
| 6,498,071 B2 | 12/2002 | Hijzen et al. | |
| 6,501,146 B1 | 12/2002 | Harada | |
| 6,509,240 B2 | 1/2003 | Ren et al. | |
| 6,518,127 B2 | 2/2003 | Hsieh et al. | |
| 6,521,497 B2 | 2/2003 | Mo | |
| 6,534,825 B2 | 3/2003 | Calafut | |
| 6,566,804 B1 | 5/2003 | Trujillo et al. | |
| 6,580,123 B2 | 6/2003 | Thapar | |
| 6,583,010 B2 | 6/2003 | Mo | |
| 6,600,194 B2 | 7/2003 | Hueting | |
| 6,608,350 B2 * | 8/2003 | Kinzer et al. | |
| 6,621,107 B2 * | 9/2003 | Blanchard et al. | |
| 6,627,949 B2 * | 9/2003 | Blanchard | |
| 6,635,534 B2 * | 10/2003 | Madson | |
| 6,657,254 B2 * | 12/2003 | Hshieh et al. | |
| 6,677,641 B2 * | 1/2004 | Kocon | |
| 6,677,643 B2 * | 1/2004 | Iwamoto et al. | |
| 6,683,346 B2 * | 1/2004 | Zeng | |
| 6,710,402 B2 * | 3/2004 | Harada | |
| 6,710,406 B2 * | 3/2004 | Mo et al. | |
| 6,713,813 B2 * | 3/2004 | Marchant | |
| 6,720,616 B2 * | 4/2004 | Hirler et al. | |
| 6,724,042 B2 * | 4/2004 | Onishi et al. | |
| 6,734,066 B2 * | 5/2004 | Lin et al. | |
| 6,750,508 B2 * | 6/2004 | Omura et al. | |
| 6,756,636 B2 * | 6/2004 | Onishi et al. | |
| 6,762,127 B2 * | 7/2004 | Boiteux et al. | |
| 6,781,195 B2 * | 8/2004 | Wu et al. | |
| 6,806,533 B2 * | 10/2004 | Henninger et al. | |
| 6,821,824 B2 * | 11/2004 | Minato et al. | |
| 6,833,584 B2 * | 12/2004 | Henninger et al. | |
| 6,833,585 B2 * | 12/2004 | Kim | |
| 6,878,994 B2 * | 4/2005 | Thapar | |
| 6,892,098 B2 * | 5/2005 | Ayal et al. | |
| 6,921,939 B2 * | 7/2005 | Zeng | |
| 6,987,305 B2 * | 1/2006 | He et al. | 257/417 |
| 7,005,351 B2 * | 2/2006 | Henninger et al. | |
| 7,033,876 B2 * | 4/2006 | Darwish et al. | |
| 7,075,145 B2 * | 7/2006 | Williams et al. | 257/329 |
| 7,091,573 B2 * | 8/2006 | Hirler et al. | |
| 7,345,342 B2 * | 3/2008 | Challa | |
| 7,375,029 B2 | 5/2008 | Poelzl | |
| 7,504,306 B2 * | 3/2009 | Sapp et al. | |
| 2002/0008284 A1 | 1/2002 | Zeng | |
| 2002/0016062 A1 | 2/2002 | Uno | |
| 2002/0038886 A1 | 4/2002 | Mo | |
| 2002/0115257 A1 * | 8/2002 | Inagawa et al. | 438/270 |
| 2003/0040144 A1 | 2/2003 | Blanchard et al. | |
| 2003/0060013 A1 | 3/2003 | Marchant et al. | |
| 2003/0178676 A1 | 9/2003 | Henninger | |
| 2003/0235936 A1 | 12/2003 | Snyder et al. | |
| 2004/0119103 A1 | 6/2004 | Thapar | |
| 2004/0232407 A1 | 11/2004 | Calafut | |
| 2005/0017293 A1 | 1/2005 | Zundel et al. | |

FOREIGN PATENT DOCUMENTS

| | | | |
|---|---|---|---|
| DE | 4300806 C1 | 12/1993 | |
| DE | 19736981 A1 | 8/1998 | |
| DE | 10214160 A | 10/2003 | |
| DE | 102004057235 A1 | 6/2006 | |
| EP | 0133642 A1 | 3/1985 | |
| EP | 0288739 A2 | 11/1988 | |
| EP | 0292782 A3 | 11/1988 | |
| EP | 975024 A2 | 2/2000 | |
| EP | 1026749 A1 | 8/2000 | |
| EP | 1054451 A2 | 11/2000 | |
| EP | 0747967 B1 | 2/2002 | |
| EP | 1205980 A1 | 5/2002 | |
| GB | 2393325 A | 3/2004 | |
| JP | 56-058267 A | 5/1981 | |
| JP | 62-069562 | 3/1987 | |
| JP | 63-186475 | 8/1988 | |
| JP | 63-288047 | 11/1988 | |
| JP | 64-022051 | 1/1989 | |
| JP | 01-192174 A | 8/1989 | |
| JP | 05-226638 A | 9/1993 | |
| JP | 2000-040822 | 2/2000 | |
| JP | 2000-040872 | 2/2000 | |
| JP | 2000-156978 A | 6/2000 | |
| JP | 2000-277726 A | 10/2000 | |
| JP | 2000-277728 A | 10/2000 | |
| JP | 2001-015448 | 1/2001 | |
| JP | 2001-015752 | 1/2001 | |
| JP | 2001-102577 A | 4/2001 | |
| JP | 2001-111041 A | 4/2001 | |
| JP | 2001-135819 A | 5/2001 | |
| JP | 2001-144292 A | 5/2001 | |
| JP | 2001-244461 A | 9/2001 | |
| JP | 2001-313391 A | 12/2001 | |
| JP | 2002-083976 A | 3/2002 | |
| WO | WO 00/33386 A2 | 6/2000 | |
| WO | WO 00/68997 A1 | 11/2000 | |
| WO | WO 00/68998 A1 | 11/2000 | |
| WO | WO 00/75965 A2 | 12/2000 | |
| WO | WO 01/06550 A1 | 1/2001 | |
| WO | WO 01/06557 A1 | 1/2001 | |
| WO | WO 01/45155 A1 | 6/2001 | |
| WO | WO 01/59847 A2 | 8/2001 | |
| WO | WO 01/71815 A3 | 9/2001 | |
| WO | WO 01/95385 A1 | 12/2001 | |
| WO | WO 01/95398 A1 | 12/2001 | |
| WO | WO 02/01644 A2 | 1/2002 | |
| WO | WO 02/47171 A1 | 6/2002 | |
| WO | WO 2006/108011 A3 | 10/2006 | |

OTHER PUBLICATIONS

Bai et al., "Novel Automated Optimization of Power MOSFET for 12V Input, High-Frequency DC-DC Converter," *International Symposium on Power Semiconductors and ICs, Technical Digest*, Apr. 14-17, 2003, pp. 366-369, Cambridge, UK.

Baliga "New Concepts in Power Rectifiers," Physics of Semiconductor Devices, Proceedings of the Third Int'l Workshop, Madras (India), Committee on Science and Technology in Developing Countries, 1985, pp. 471-481, General Electric Company, Corporate Research and Development Center, Schenectady, NY, 12301, USA.

Baliga "Options for CVD of Dielectrics Include Low-k Materials," Technical Literature from Semiconductor International, Jun. 1998, 4 pages total.

Baliga et al., "Improving the Reverse Recovery of Power MOSFET Integral Diodes by Electron Irradiation," *Solid State Electronics*, Dec. 1983, pp. 1133-1141, vol. 26, No. 12, Pergamon Press Ltd.

Brown et al. Novel Trench Gate Structure Developments Set the Benchmark for Next Generation Power MOSFET Switching Performance, Power Electronics—May 2003 Proceedings (PCIM), pp. 275-278, vol. 47, Nurenburg.

Bulucea "Trench DMOS Transistor Technology For High Current (100 A Range) Switching," Solid-State Electronics, May 1991, pp. 493-507, vol. 34, No. 5, Head Hill Hall Oxford, GB.

Chang et al. "Numerical and experimental Analysis of 500-V Power DMOSFET with an Atomic-Lattice Layout," 47$^{th}$ Annual Device Research Conference, Jun. 19-21, 1989, Massachusetts Institute of Technology, Cambridge, Massachusetts, IEEE Transactions on Electron Devices, Nov. 1989, pp. 2598 and 2623, vol. 36 No. 11, IEEE.

Chang et al. "Self-Aligned UMOSFET's with a Specific On-Resistance of 1mΩ cm$^2$," IEEE Transactions on Electron Devices, Nov. 1987, pp. 2329-2334, vol. 34, No. 11, IEEE.

Cheng et al., "Fast Reverse Recovery Body Diode in High-Voltage VDMOSFET Using Cell-Distributed Schottky Contacts," *IEEE Transactions on Electron Devices*, May 2003, pp. 1422-1425, vol. 50, No. 5, IEEE.

"CoolMOSä the Second Generation," Infineon Technologies product information, 2000, 2 pages.

Curtis, et al. "APCVD TEOS: 03 Advanced Trench Isolation Applications," Semiconductor Fabtech, 1999, 8 pages, 9th Edition.

Darwish et al., "A New Power W-Gated Trench MOSFET (WMOSFET) with High Switching Performance," ISPSD Proceedings—Apr. 14-17, 2003, pp. 24-27, Cambridge, UK.

Djekic, O. et al., "High Frequency Synchronous Buck Converter for Low Voltage Applications," *Proc. IEEE Power Electronics Specialist Conf. (PESC)*, 1998, pp. 1248-1254, IEEE.

Fujihira "Theory of Semiconductor Superjunction Devices" Jpn. J. Appl. Phys., Oct. 1997, pp. 6254-6262, vol. 36, part 1, No. 10.

Gan et al. "Poly Flanked VDMOS (PFVDMOS): A Superior Technology for Superjunction Devices," IEEE Power Electronics Specialists Conference, Jun. 17-22, 2001, Vancouver, Canada, pp. 2156-2159, IEEE.

Glenn et al. "A Novel Vertical Deep Trench RESURF DMOS (VTR-DMOS)" ISPD 2000, May 22-25, Toulouse France, pp. 197-200, IEEE.

Heyes "Wafer-Scale Packaging for Power Discrete Products," 3 pages, Philips Semiconductors, BL Power Products, Hazel Grove, Stockport, UK.

International Preliminary Report on Patentability for Application No. PCT/US2006/012581, Mailed Oct. 9, 2007, 14 pages.

International Search Report of the International Searching Authority for Application No. PCT/US2006/012581, Mailed Feb. 6, 2007, 2 pages.

"IR develops CoolMOSä—equivalent technology, positions it at the top of a 3-tiered line of new products for SMPS," International Rectifiers company information, Apr. 1999, 3 pages, at URL: http://www.irf.com/whats-new/archive/nr990403.html, printed on Dec. 4, 2008.

Kao et al. "Two Dimensional Thermal Oxidation of Silicon-I. Experiments,", IEEE Transactions on Electron Devices, May 1987, pp. 1008-1017, vol. 34,No. 5, IEEE.

Kao et al. "Two Dimensional Thermal Oxidation of Silicon-II. Modeling Stress Effects in Wet Oxides," IEEE Transactions on Electron Devices, Jan. 1988, pp. 25-37, vol. 35, No. 1,IEEE.

Kassakian, J.G. et al., "High-Frequency High-Density Converters for Distributed Power Supply Systems," Proceedings of the IEEE, Apr. 1988, pp. 362-376, vol. 76, No. 4, IEEE.

Korman, C.S. et al., "High Performance Power DMOSFET With Integrated Schottky Diode," Proc. IEEE Power Electronics Specialist Conf. (PESC), 1989, pp. 176-179, GE Corporate Research and Development Schenectady, NY, IEEE.

Lorenz et al., "Cool MOS—An Important Milestone Towards a New Power MOSFET Generation," Power Conversion, May 1988, pp. 151-160.

Maksimovic, A.M. et al., "Modeling and Simulation of Power Electronic Converters," Proceedings of the IEEE, Jun. 2001, pp. 898-912, vol. 89, No. 6, IEEE.

Mehrotra, M. et al., "Very low forward drop JBS rectifiers fabricated using submicron technology," IEEE Transactions on Electron Devices, Nov. 1993, pp. 2131-2132 vol. 40, No. 11, IEEE.

Miller, "Power Management & Supply—Market, Applications Technologies—an Overview," May 5, 2003, 53 pages, at URL: <<http://www.ewh.ieee.org/r8/germany/ias-pels/m_regensburg/overview_miller.pdf>>, Infineon Technologies.

Mirchandani et al. "A Novel N-Channel MOSFET Featuring an Integrated Schottky and No Internal P-N Junction," Power Semiconductor Devices and ICs, 2004. Proceedings. ISPSD 2004, The 16th International Symposium on May 24-27, 2004, pp. 405-408.

Moghadam "Delivering Value Around New Industry Paradigms," Technical Literature from Applied Materials, Nov. 1999, pp. 1-11, vol. 1, Issue 2.

Park et al., "Lateral Trench Gate Super-Junction SOI-LDMOSFETs with Low On-Resistance," Institute for Microelectronics, 2002, pp. 283-285, University of Technology Vienna, Austria.

Sakai et al., "Experimental investigation of dependence of electrical characteristics of device parameters in trench MOS barrier, schottky diodes," (1998) International Symposium on Power Semiconductors and ICs, Technical Digest, pp. 293-296.

Shenai et al., "Current transport mechanisms in atomically abrupt metal-semiconductor interfaces," IEEE Transactions on Electron Devices, Apr. 1988, pp. 468-482, vol. 35, No. 4, IEEE.

Shenai et al., "Monolithically integrated power MOSFET and schottky diode with improved reverse recovery characteristics," IEEE Transactions on Electron Devices, Apr. 1990, pp. 1167-1169, vol. 37, No. 4, IEEE.

Shenoy et al."Analysis of the Effect of Charge Imbalance on the Static and Dynamic Characteristic of the Super Junction MOSFET," IEEE International Symposium on Power Semiconductor Devices 1999, pp. 99-102, IEEE.

Singer "Empty Spaces in Silicon (ESS): An Alternative to SOI," Semiconductor International, Dec. 1999, p. 42.

Tabisz et al., "A MOSFET resonant synchronous rectifier for high-frequency dc/dc converters," Proc. IEEE Power Electronics Specialist Conf. (PESC), 1990, pp. 769-779, IEEE.

Technical Literature from Quester Technology, Model APT-4300 300mm Atmospheric TEOS/Ozone CVD System, (unknown date), 3 pages.

Technical Literature from Quester Technology, Model APT-6000 Atmospheric TEOS-Ozone CVD System, (unknown date), 2 pages.

Technical Literature from Silicon Valley Group Thermal Systems, APNext, High Throughput APCVD Cluster Tool for 200 mm/300 mm Wafer Processing, (unknown date), 2 pages.

Tu et al. "On the Reverse Blocking Characteristics of Schottky Power Diodes," IEEE Transactions on Electron Devices, Dec. 1992, pp. 2813-2814, vol. 39, No. 12, IEEE.

Ueda et al. "An Ultra-Low On-Resistance Power MOSFET Fabricated by Using a Fully Self-Aligned Process," IEEE Transactions on Electron Devices, Apr. 1987, pp. 926-930, vol. 34, No. 4, IEEE.

Wilamowski "Schottky Diodes with High Breakdown Voltages," Solid-State Electronics 1983, pp. 491-493, vol. 26, No. 5, IEEE.

Wolf et al., "Silicon Processing for The VLSI Era," Process Technology, Second Edition, 1990, p. 658, vol. 1.

Wolf, "Silicon Processing for The VLSI Era" 1990, 3 pages, vol. 2 Process Integration Lattice Press.

Written Opinion of the International Searching Authority for Application No. PT/US2006/012581, Mailed Feb. 6, 2007, 13 pages.

Yamashita et al., Conduction Power loss in MOSFET synchronous rectifier with parallel-connected schottky barrier diode, IEEE Transactions on Power electronics, Jul. 1998, pp. 667-673, vol. 13, No. 4, IEEE.

Zeng "An Improved Power MOSFET Using a Novel Split Well Structure". Harris Corporation, Semiconductor Section, Technical Publication, 1999, pp. 205-208, IEEE.

Zeng et al. "An Ultra Dense Trench-Gated Power MOSFET Technology Using a Self-Aligned Process," Proceedings of 2001 International Symposium on Power Semiconductor Devices & ICs, pp. 147-150.

Austrian Official Letter and Search Report for Application No. A9127/2006, dated Oct. 23, 2009, 8 pages, including English translation.

Notice of Allowance of Sep. 22, 2008 for U.S. Appl. No. 11/398,467, 26 pages.

* cited by examiner

METHOD FOR FORMING TRENCH GATE FIELD EFFECT TRANSISTOR WITH RECESSED MESAS USING SPACERS

CROSS-REFERENCES TO RELATED APPLICATIONS

This application is a continuation of U.S. application Ser. No. 11/398,467, filed Apr. 4, 2006, which claims the benefit of U.S. Provisional Application No. 60/669,063, filed Apr. 6, 2005, both of which are incorporated herein by reference in their entirety for all purposes.

The following patent applications are also incorporated herein by reference in their entirety for all purposes: U.S. Provisional Application No. 60/588,845, filed Jul. 15, 2004, U.S. application Ser. No. 11/026,276, filed Dec. 29, 2004, and U.S. application Ser. No. 09/844,347, filed Apr. 27, 2001 (Publication No. US 2002/0008284).

BACKGROUND OF THE INVENTION

The present invention relates in general to power semiconductor technology, and more particularly to accumulation-mode and enhancement-mode trenched-gate field effect transistors (FETs) and their methods of manufacture.

The key component in power electronic applications is the solid state switch. From ignition control in automotive applications to battery-operated consumer electronic devices, to power converters in industrial applications, there is a need for a power switch that optimally meets the demands of the particular application. Solid state switches including, for example, the power metal-oxide-semiconductor field effect transistor (power MOSFET), the insulated-gate bipolar transistor (IGBT) and various types of thyristors have continued to evolve to meet this demand. In the case of the power MOSFET, for example, double-diffused structures (DMOS) with lateral channel (e.g., U.S. Pat. No. 4,682,405 to Blanchard et al.), trenched gate structures (e.g., U.S. Pat. No. 6,429,481 to Mo et al.), and various techniques for charge balancing in the transistor drift region (e.g., U.S. Pat. Nos. 4,941,026 to Temple, 5,216,275 to Chen, and 6,081,009 to Neilson) have been developed, among many other technologies, to address the differing and often competing performance requirements.

Some of the defining performance characteristics for the power switch are its on-resistance, breakdown voltage and switching speed. Depending on the requirements of a particular application, a different emphasis is placed on each of these performance criteria. For example, for power applications greater than about 300-400 volts, the IGBT exhibits an inherently lower on-resistance as compared to the power MOSFET, but its switching speed is lower due to its slower turn off characteristics. Therefore, for applications greater than 400 volts with low switching frequencies requiring low on-resistance, the IGBT is the preferred switch while the power MOSFET is often the device of choice for relatively higher frequency applications. If the frequency requirements of a given application dictate the type of switch that is used, the voltage requirements determine the structural makeup of the particular switch. For example, in the case of the power MOSFET, because of the proportional relationship between the drain-to-source on-resistance RDSon and the breakdown voltage, improving the voltage performance of the transistor while maintaining a low RDSon poses a challenge. Various charge balancing structures in the transistor drift region have been developed to address this challenge with differing degrees of success.

Two varieties of field effect transistors are accumulation mode FET and enhancement mode FET. In conventional accumulation FETs because no inversion channel is formed, the channel resistance is eliminated thus improving the transistor power handling capability and its efficiency. Further, with no pn body diode, the losses in synchronous rectification circuits attributable to the pn diode are reduced. A drawback of conventional accumulation transistors is that the drift region needs to be lightly doped to support a high enough reverse bias voltage. However, a lightly doped drift region results in a higher on-resistance and lower efficiency. Similarly, in enhancement mode FETs, improving the transistor break down voltage often comes at the price of higher on-resistance or vice versa.

Device performance parameters are also impacted by the fabrication process. Attempts have been made to address some of these challenges by developing a variety of improved processing techniques. Whether it is in ultra-portable consumer electronic devices or routers and hubs in communication systems, the varieties of applications for the power switch continue to grow with the expansion of the electronic industry. The power switch therefore remains a semiconductor device with high development potential.

BRIEF SUMMARY OF THE INVENTION

In accordance with an embodiment of the invention, a method for forming a field effect transistor with an active area and a termination region surrounding the active area, includes forming a well region in a first silicon region, where the well region and the first silicon region are of opposite conductivity type. Gate trenches extending through the well region and terminating within the first silicon region are formed. A recessed gate is formed in each gate trench. A dielectric cap is formed over each recessed gate. The well region is recessed between adjacent trenches to expose upper sidewalls of each dielectric cap. A blanket source implant is carried out to form a second silicon region in an upper portion of the recessed well region between every two adjacent trenches. The second silicon region is of the same conductivity type as first silicon region. A dielectric spacer is formed along each exposed upper sidewall of the dielectric cap. Every two adjacent dielectric spacers located between every two adjacent gate trenches form an opening over the second silicon region. The second silicon region is recessed through the opening between every two adjacent dielectric spacers so that only portions of the second silicon region directly below the dielectric spacers remain. The remaining portions of the second silicon region form source regions.

In one embodiment, the dielectric spacers are removed before forming the top-side conductor layer so that the top-side conductor layer contacts a top surface of each source region.

In another embodiment, prior to forming the recessed gate, a thick bottom dielectric is formed along a bottom portion of each gate trench. Prior to forming the recessed gate, a gate dielectric lining the sidewalls of each gate trench is formed. The thick bottom dielectric is thicker than the gate dielectric.

In another embodiment, prior to forming the recessed gate, a shield electrode is formed along a bottom portion of each gate trench. Prior to forming the recessed gate, a dielectric layer is formed over each shield electrode.

In yet another embodiment, a wide trench is formed in the termination region, and the wide trench is filled with LOCOS.

In another embodiment, a surface gate is formed in the termination region simultaneously with forming the recessed gate in the gate trenches.

In another embodiment, an opening is formed over the surface gate, and a gate conductor contacting the surface gate is formed through the opening.

In another embodiment, a termination trench is formed in the termination region simultaneously with forming the gate trenches. A recessed gate is formed in the termination trench simultaneously with forming the recessed gate in the gate trenches. An opening is formed over the recessed gate in the termination trench. A gate conductor contacting the recessed gate is formed in the termination trench through the opening.

These and other aspects of the invention are described below in greater detail in connection with the accompanying drawings.

BRIEF DESCRIPTION OF THE DRAWINGS

FIG. 3EE is a simplified cross section view of the an alternate embodiment wherein the dielectric spacers in the process sequence in FIGS. 3A-3E are removed prior to forming the top-side conductor layer;

FIGS. 9A-9H, 9I-1, and 9J-1 are simplified cross section depicting various process steps for forming the FET-Schottky diode structure in FIG. 8 in accordance with an exemplary embodiment of the invention;

FIGS. 9I-2 and 9J-2 are simplified cross section views depicting alternate processing steps to the steps corresponding to FIGS. 9I-1 and 9J-1, resulting in a variation of the FET-Schottky diode structure in FIG. 8;

FIGS. 17A, 17B-1, and 17B-2 are cross section views for two abbreviated process sequences for forming the FET in FIG. 16;

DETAILED DESCRIPTION OF THE INVENTION

The power switch can be implemented by any one of power MOSFET, IGBT, various types of thyristors and the like. Many of the novel techniques presented herein are described in the context of the power MOSFET for illustrative purposes. It is to be understood however that the various embodiments of the invention described herein are not limited to the power MOSFET and can apply to many of the other types of power switch technologies, including, for example, IGBTs and other types of bipolar switches. Further, for the purposes of illustration, the various embodiments of the invention are shown to include specific p and n type regions. It is understood by those skilled in the art that the teachings herein are equally applicable to devices in which the conductivities of the various regions are reversed.

Figure 1:
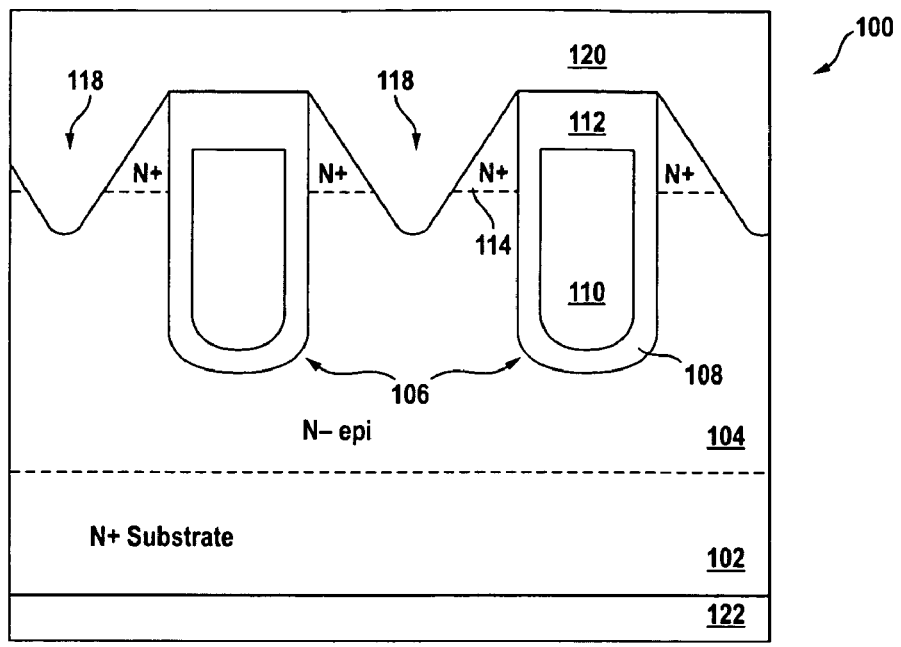
FIG. 1 is a simplified cross section view of a trenched-gate accumulation FET with integrated Schottky in accordance with an exemplary embodiment of the invention.

FIG. 1 shows a simplified cross section view of a trenched-gate accumulation field effect transistor (FET) optimally integrated with a Schottky diode in a single cell, in accordance with an exemplary embodiment of the invention. A lightly doped n-type epitaxial layer 104 extends over and is in contact with a highly doped n-type substrate 102. Gate trenches 106 extend into and terminate within epitaxial layer 104. Each gate trench 106 is lined with a dielectric layer 108 along its sidewalls and bottom, and includes a recessed gate 110 and insulating material 112 atop recessed gate 110. Triangular-shaped source regions 114 of n-type conductivity flank each side of trenches 106. Source regions 114 overlap polysilicon gate 110 along the vertical dimension. This overlap is not necessary in such applications as high-voltage FETs wherein the absence of the overlap would have minimal impact on the transistor on-resistance Rdson. The absence of the gate-source overlap has more of an impact on Rdson in low voltage transistors, and as such its presence would be advantageous in such transistors.

Recessed portions of epitaxial layer 104 together with source regions 114 form V-shaped contact openings 118 with rounded bottoms. A Schottky barrier metal 120 extends over the structure and fills contact openings 118 to make contact with source regions 114 along the sloped sidewalls of source regions 114, and to contact epitaxial layer 104 in the recessed portions thereof. Since source regions 114 are highly doped and epitaxial layer 104 is lightly doped, top-side conductor layer 120 forms an ohmic contact with source regions 114 and a Schottky contact with epitaxial layer 104. In one embodiment, Schottky barrier metal 120 comprises titanium. A back-side conductor layer 122, e.g., comprising aluminum (or titanium), contacts substrate 102.

Unlike enhancement-mode transistors, the accumulation-mode transistor in structure 100 in FIG. 1 does not include a blocking (p-type in this example) well or body region inside which the conduction channel is formed. Instead a conducting channel is formed when an accumulation layer is formed in epitaxial layer 104 along the trench sidewalls. The transistor in structure 100 is normally on or off depending on the doping concentration of the channel region and the doping type of gates 110. It is turned off when the channel regions are entirely depleted and lightly inverted. Also, because no inversion channel is formed, the channel resistance is eliminated thus improving the transistor power handling capability and its efficiency. Further, with no pn body diode, the losses in synchronous rectification circuits attributable to the pn diode are eliminated.

In the FIG. 1 embodiment, the FET in structure 100 is a vertical trenched-gate accumulation MOSFET with the top-side conductor layer 120 forming the source conductor and the bottom-side conductor layer 120 forming the drain conductor. In another embodiment, substrate 102 is p-type thereby forming an accumulation IGBT.

Figure 2A:
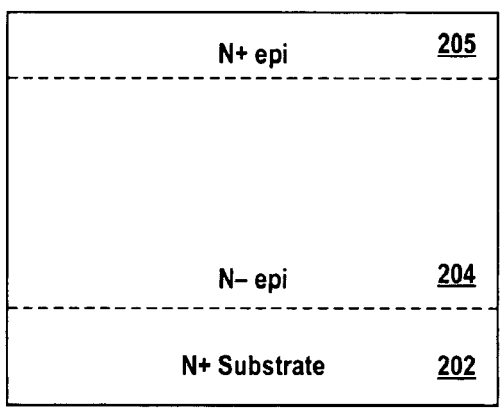
FIGS. 2A-2I are simplified cross section views depicting various process steps for forming the integrated FET-Schottky diode structure in FIG. 1 according to an exemplary embodiment of the invention.
Figure 2B:
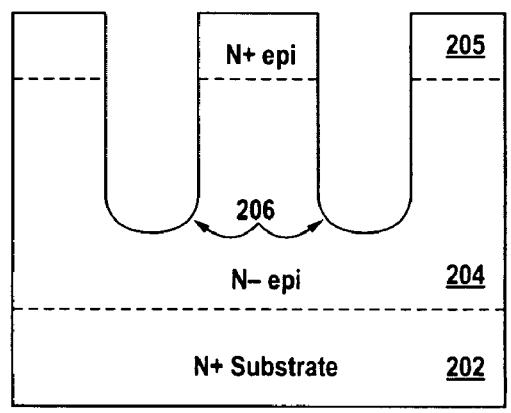
Figure 2C:
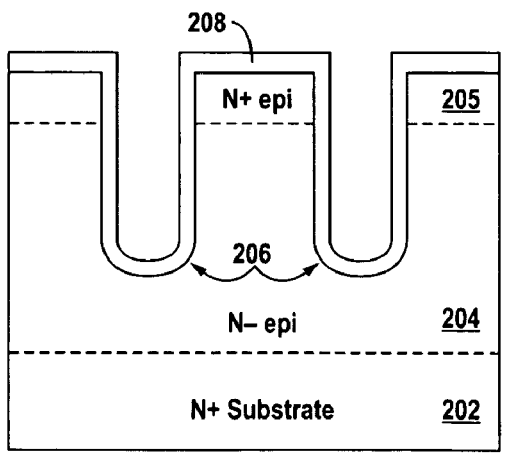

FIGS. 2A-2I are simplified cross section views illustrating various process steps for forming the integrated FET-Schottky diode structure 100 in FIG. 1, in accordance with an exemplary embodiment of the invention. In FIG. 2A, lower epitaxial layer 204 and upper epitaxial layer 205 are sequentially formed over n-type substrate 202 using conventional methods. Alternatively, a starting wafer material which includes epitaxial layers 204, 205 may be used. The upper n-type epitaxial layer 205 has a higher doping concentration than the lower n-type epitaxial layer 204. In FIG. 2B, a mask (not shown) is used to define and etch the silicon to form trenches 206 extending through upper epitaxial layer 205 and terminating within lower epitaxial layer 204 using known techniques. A conventional dry or wet etch may be used in forming the trenches. In FIG. 2C, a dielectric layer 208, e.g., comprising oxide, is grown or deposited over the structure whereby the sidewalls and bottom of trenches 206 are lined with dielectric layer 208.

Figure 2D:
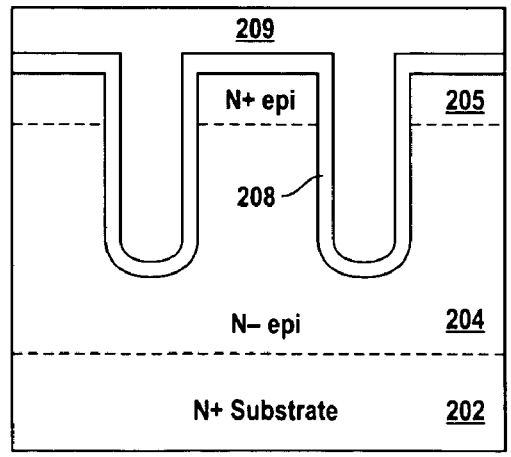
Figure 2E:
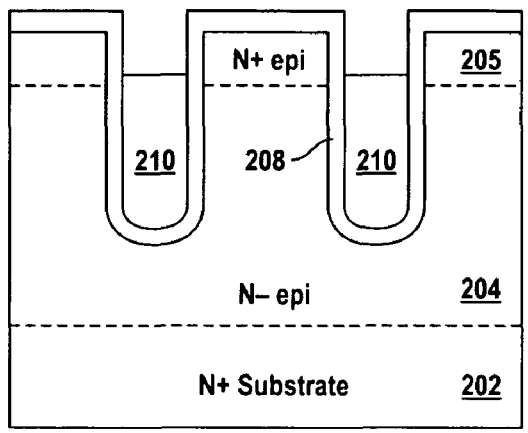

In FIG. 2D, a layer of polysilicon 209 is then deposited to fill trenches 206 using conventional techniques. Polysilicon layer 209 may be in-situ doped to obtain the desired gate doping type and concentration. In FIG. 2E, polysilicon layer 209 is etched back and recessed within trenches 206 to form gates 210, using conventional techniques. Recessed gates 210 overlap upper epitaxial layer 205 along the vertical dimension. As mentioned above, depending on the target application and the design goals, recessed gates 210 need not overlap upper epitaxial layer 205 (i.e., the process sequence and the final structure need not be limited by this overlap). In other embodiments, gate 210 comprises polysilicon carbide or metal.

Figure 2F:
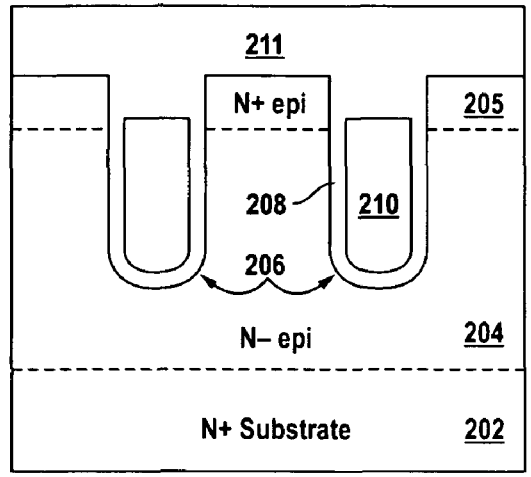
Figure 2G:
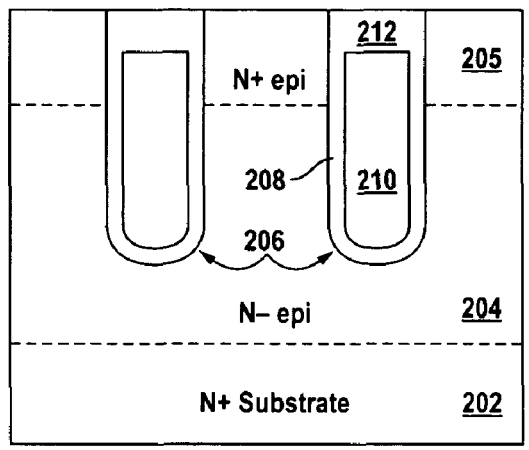
Figure 2H:
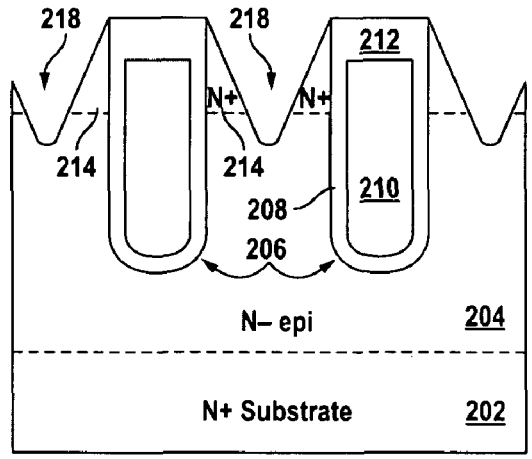

In FIG. 2F, a dielectric layer 211, e.g., from oxide, is formed over the structure and then planarized using conventional techniques. In FIG. 2G, a blanket etch of the planarized dielectric layer 211 (in the active region) is carried out at least in the active area of the device to expose surface areas of upper epitaxial layer 205 while portions 212 of dielectric layer 211 remain over recessed gates 210. In FIG. 2H, a blanket angled silicon etch (e.g., dry etch in the active region) is carried out at least in the active area to form the V-shaped contact openings 218 with rounded bottoms using conventional techniques. Contact openings 218 extend clear through upper epitaxial layer 205 thus forming two source regions 214 between every two adjacent trenches. Contact openings 218 extend into and terminate within an upper half of lower epitaxial layer 204.

Figure 2I:
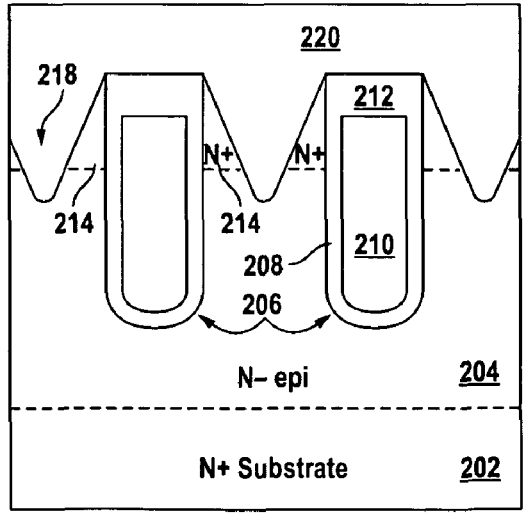

In FIG. 2I, top-side conductor layer 220 is formed using conventional techniques. Top-side conductor layer 220 comprises a Schottky barrier metal. As shown, top-side conductor layer 220 fills contact openings 218 so as to make contact with source regions 214 along the slanted sidewalls of source regions 214, and with lower epitaxial layer 204 along the bottom of contact openings 218. Since source regions 214 are highly doped and lower epitaxial layer 204 is lightly doped, top-side conductor layer 220 forms an ohmic contact with source regions 214, and forms a Schottky contact with lower epitaxial layer 204. As can be seen, source regions 214 and the Schottky contacts are self-aligned to trenches 206.

Figure 3A:
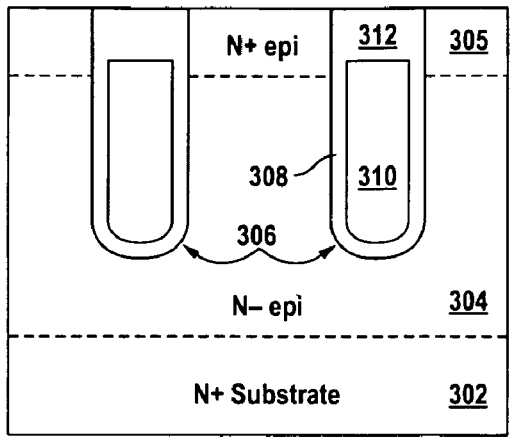
FIGS. 3A-3E are simplified cross section views depicting alternate process steps to those in the latter portion of the process sequence depicted by FIGS. 2G-2I, according to another exemplary embodiment of the invention.
Figure 3B:
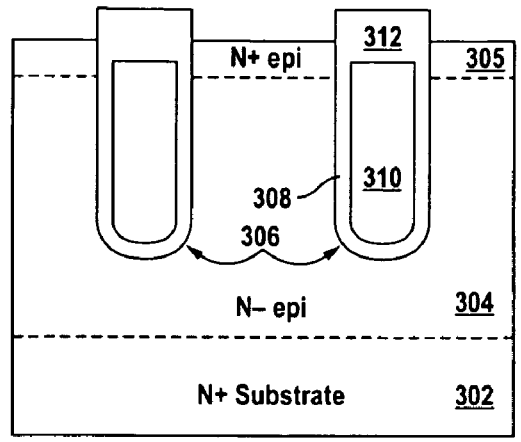
Figure 3C:
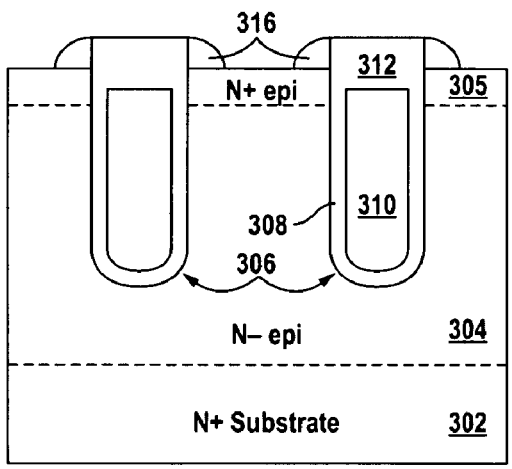

FIGS. 3A-3E are simplified cross section views depicting alternate process steps to those in the latter portion of the process sequence depicted by FIGS. 2G-2I, according to another exemplary embodiment of the invention. Thus, in this embodiment, the same process steps depicted by FIGS. 2A through 2G are carried out leading to the step depicted by FIG. 3B (the step depicted by FIG. 3A is the same as the step depicted by FIG. 2G). In FIG. 3B, upper epitaxial layer 305 is etched back to expose upper sidewalls of dielectric material 312 sufficiently to accommodate the subsequent formation of dielectric spacers 316. In one embodiment, second epitaxial layer 305 is etched back by an amount in the range of 0.05-0.5 µm. In FIG. 3C, spacers 316 are formed adjacent to the exposed upper sidewalls of dielectric material 312 using conventional techniques. Spacers 316 are from a dielectric material different than that of dielectric material 312. For example, if dielectric material 312 is from oxide, spacers 316 may be from nitride.

Figure 3D:
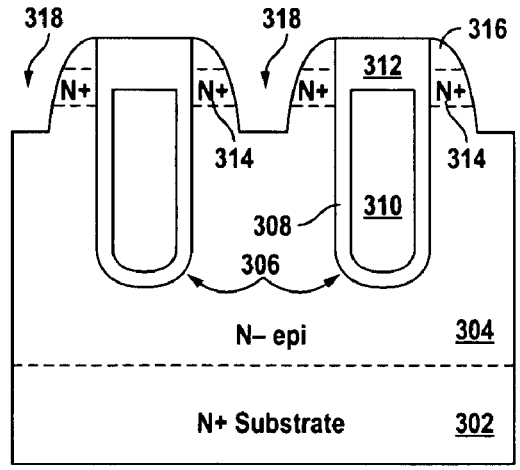
Figure 3E:
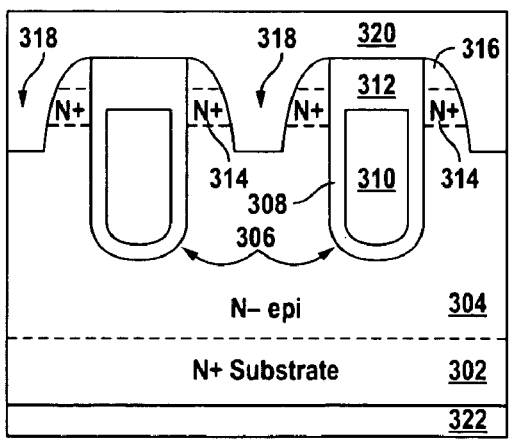
Figure 3E:
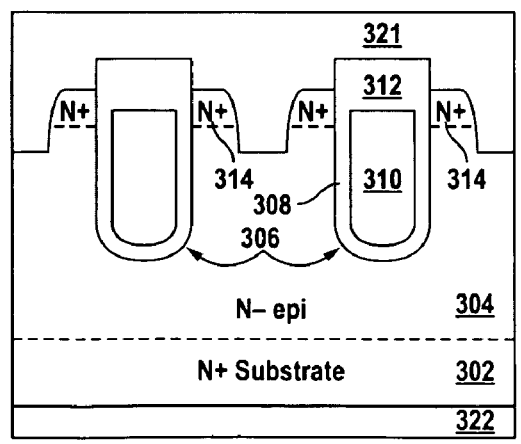

In FIG. 3D, the exposed surface areas of upper epitaxial layer 305 are recessed clear through epitaxial layer 305 thus forming contact openings 318 which extend into lower epitaxial layer 304. By recessing clear through upper epitaxial layer 305, only portions 314 of upper epitaxial layer 305 directly below spacers 316 remain. Portions 314 form the transistor source regions. As can be seen, contact openings 318 and thus source regions 314 are self-aligned to trenches 306. In FIG. 3E, top-side conductor layer 320 and bottom-side conductor layer 322 are formed using conventional techniques. Conductor layer 320 comprises a Schottky barrier metal. As shown, top-side conductor 320 fills contact openings 318 so as to make contact with source regions 314 along sidewalls of source regions 314, and with the recessed portions of lower epitaxial layer 304. Since source regions 314 are highly doped and lower epitaxial layer 304 is lightly doped, top-side conductor layer 320 forms an ohmic contact with source regions 314, and forms a Schottky contact with lower epitaxial layer 304.

In an alternate embodiment shown in FIG. 3EE, prior to forming the top-side conductor layer, dielectric spacers 316 are removed thus exposing the top surfaces of source regions 314. Top-side conductor layer 321 thus makes contact along the top surface and sidewalls of source regions 314. The source contact resistance is thus reduced. In an alternate variation of the various embodiments described above, known techniques are used to form a thick bottom dielectric along the bottom of each trench before forming the gates. The thick bottom dielectric reduces the miller capacitance.

As can be seen from the various embodiments described herein, a Schottky diode is optimally integrated with a FET in a single cell which is repeated many times in an array of such cells. Also, the Schottky contact and the source regions are self-aligned to the trenches. Further, the Schottky contact results in lower on resistance Rdson and thus lower on-state losses, and also improves the transistor reverse recovery characteristics. Good blocking capability is also obtained without the need for a tight cell pitch.

In the exemplary process sequences depicted by FIGS. 2A-2I and FIGS. 3A-3E no diffusion or implantation processes are used. While these process sequences can be used with conventional crystalline silicon material, they are particularly suitable for use with such other types of materials as silicon carbide (SiC), gallium nitride (GaN), and gallium arsenide (GaAs) where diffusion, implantation, and dopant activation processes are difficult to accomplish and control. In such embodiments, the substrate, the lower and upper epitaxial layers, as well as other regions of the transistor may comprise one of SiC, GaN, and GaAs. Further, in conventional silicon carbide based enhancement mode FETs, the contribution of the inversion channel to the on resistance is particularly high. In contrast, the contribution to the on resistance of the accumulated channel in the silicon carbide embodiment of the accumulation transistors in FIGS. 2I and 3E is substantially low.

Figure 4:
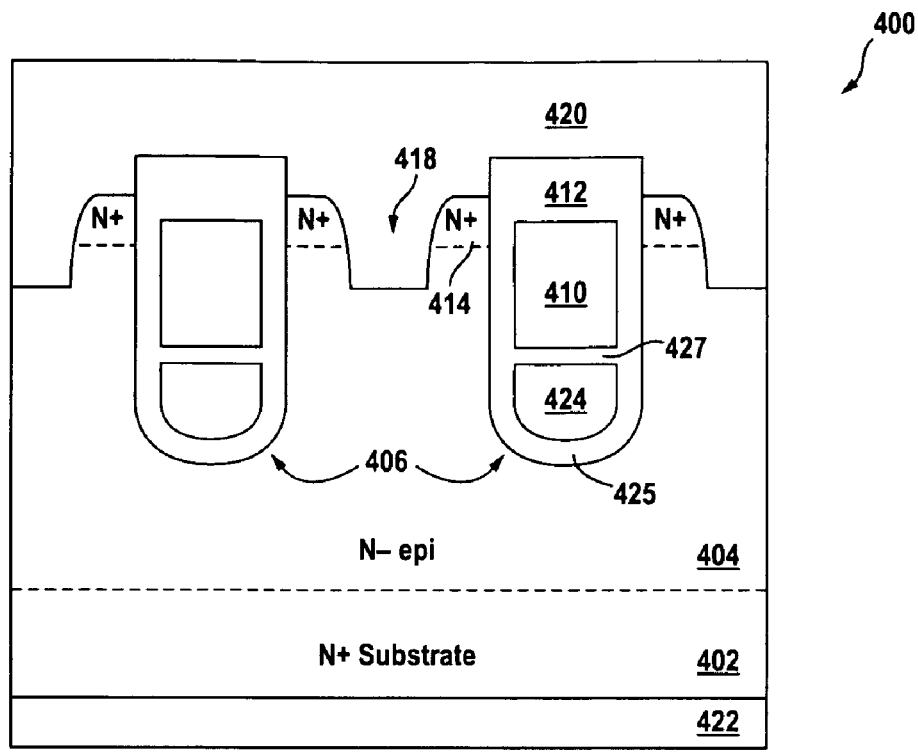
FIG. 4 is a simplified cross section view of a variation of the structure in FIG. 3EE wherein shield electrodes are formed underneath the gates.

FIG. 4 shows a cross section view of another embodiment of the present invention. In FIG. 4, shield electrodes 424 are formed below gates 410. Shield electrode 424 is insulated from lower epitaxial layer 404 by a shield dielectric 425, and is insulated from the overlying gate 410 by an inter-electrode dielectric 427. Shield electrodes 424 help reduce miller capacitance to a negligible amount and thereby drastically reduce transistor switching losses. Though not shown in FIG. 4, shield electrodes 424 are electrically connected to source regions 414, or to the ground potential, or to other potentials as the design and performance requirements dictate. More than one shield electrode biased to the same or different potentials may be formed below each gate 410 if desired. One or more methods for forming such shield electrodes are disclosed in the above-referenced commonly assigned application Ser. No. 11/026,276. Also, other charge balance structures disclosed in application Ser. No. 11/026,276 may be combined with the various embodiments disclosed herein to further improve the performance characteristics of the device.

Figure 5:
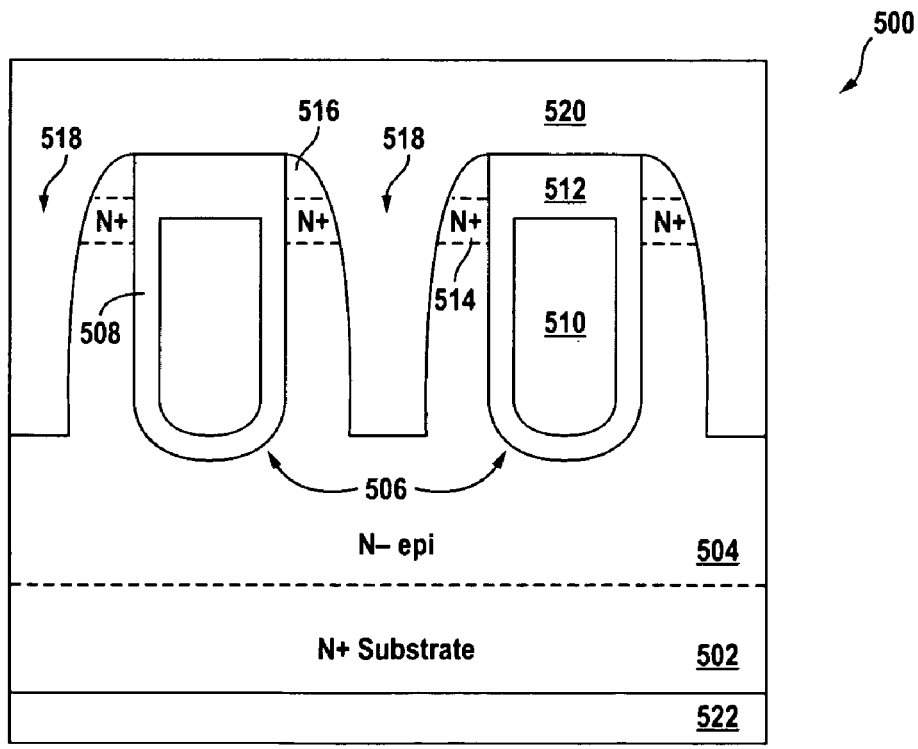
FIG. 5 is a simplified cross section view of a variation of the structure in FIG. 3E wherein the contact openings are extended to about the same depth as the gate trenches.
Figure 7A:
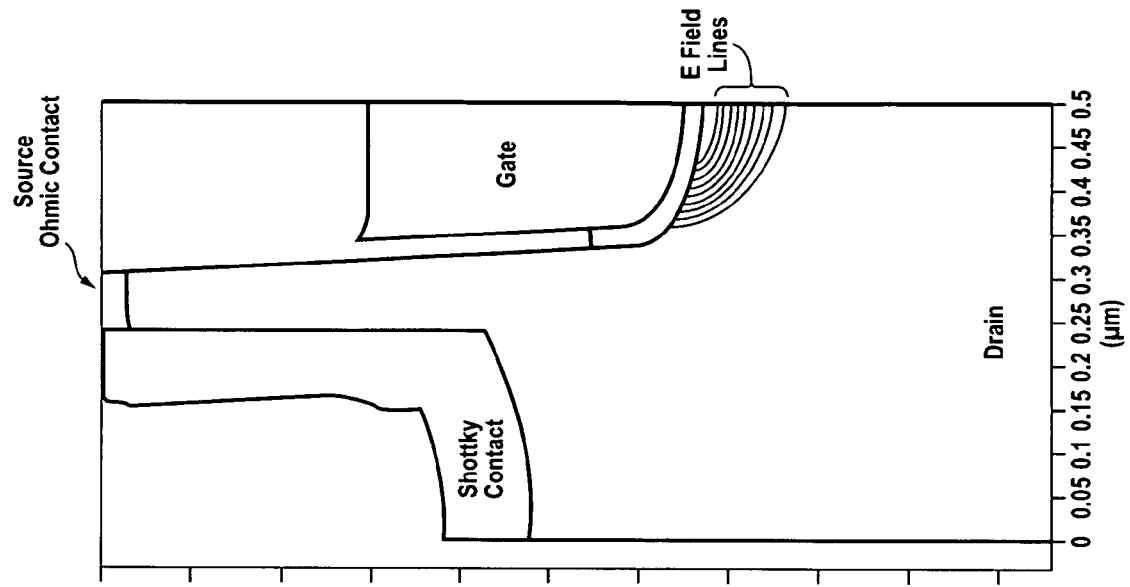
FIG. 7A depicts simulation results wherein the electric filed lines are shown for two SiC based accumulation FETs one with a deeper Schottky contact recess than the other.

A limitation of some conventional silicon carbide based trenched-gate transistors is the low gate oxide breakdown voltage. In accordance with the invention, this problem is addressed by extending the Schottky contact recess deeper, e.g., to a depth greater than one half of the depth of the gate trenches. FIG. 5 shows an exemplary embodiment wherein the Schottky contact recess is extended to approximately the same depth as gate trenches 506. The deep Schottky contact serves to shield gate oxide 508 from high electric fields and thus improves the gate oxide breakdown. This can be seen in FIG. 7A which shows simulation results for two SiC based accumulation FETs one of which has a deeper Schottky contact recess. The electric field lines present along the bottom of the trench in the transistor with a shallower Schottky contact recess (right diagram) are eliminated in the transistor with a deeper Schottky contact recess case (left diagram). The electric field lines below the gate trench in the right diagram reflect increasing electric field from bottom to top. That is, the lowest-most electric field line corresponds to the highest electric filed and the upper-most electric field line corresponds to lowest electric field.

Figure 7A:
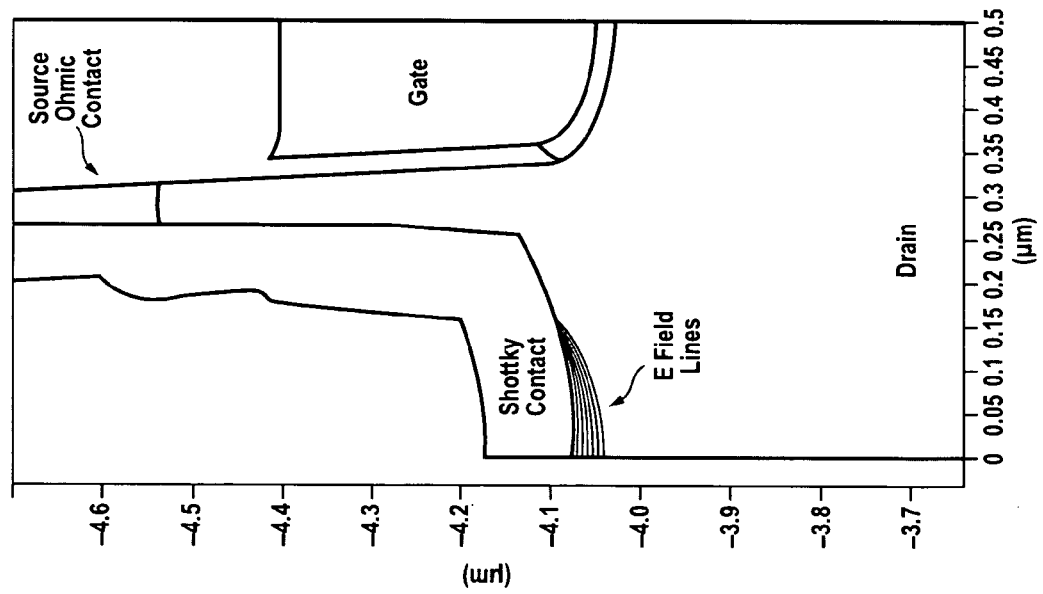
Figure 7B:
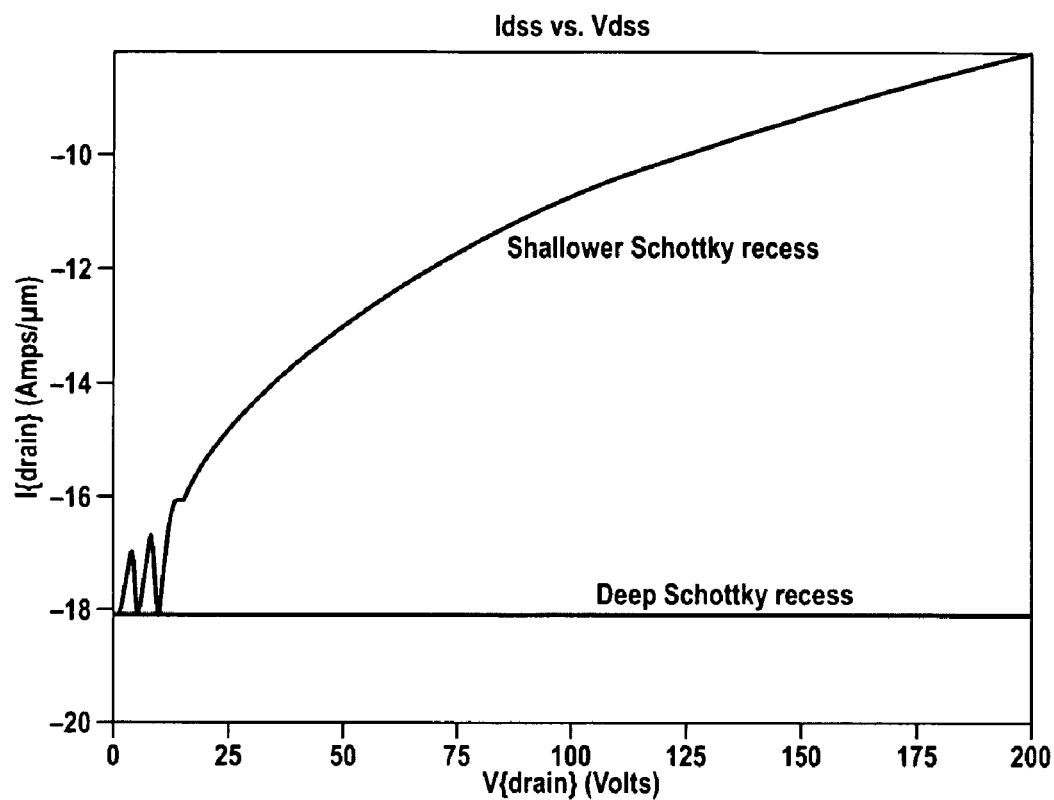
FIG. 7B is a simulated plot of the drain current versus drain voltage for the two cases of deeper and shallower Schottky contact recesses.

A further advantage of the deep Schottky contact recess is reduction in transistor leakage in the blocking state. This is more clearly shown in the simulation results in FIG. 7B wherein the drain current versus drain voltage is plotted for a deeper Schottky contact recess versus a shallower Schottky contact recess. As can be seen, as the drain voltage is increased from 0V to 200V, the drain current continuously rises in the case of shallower Schottky contact recess while the drain current remains flat for the deeper Schottky contact recess. Thus, a substantial reduction in transistor leakage as well as a higher gate oxide breakdown is achieved by recessing the Schottky contact deeper into epitaxial layer 504.

The deeply recessed Schottky contact structure (e.g., that in FIG. 5) is particularly suitable in the silicon carbide based transistors because the gate trenches need not extend as deep in the epitaxial layer as compared to the silicon based transistors. This allows shallower Schottky contact recesses which are easier to define and etch. However, similar improvements in gate oxide breakdown and transistor leakage can be obtained for similar structures using other types of material such as SiC, GaN and GaAs.

Figure 6:
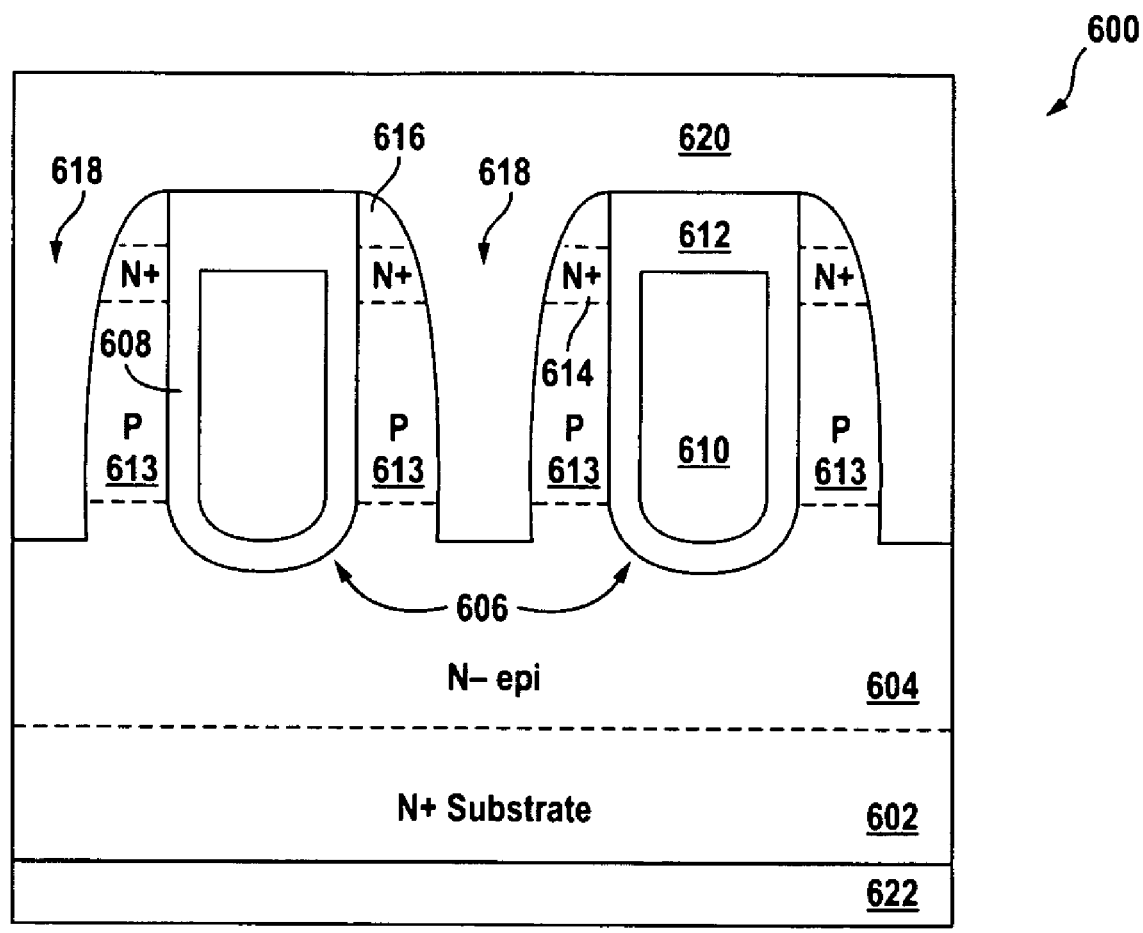
FIG. 6 is a simplified cross section view of an enhancement mode variation of the accumulation FET-Schottky diode structure in FIG. 5.

FIG. 6 shows an enhancement mode FET variation of the accumulation FET in the FIG. 5 structure. In FIG. 6, a p-type body region 613 extends along each trench sidewall directly below a corresponding source region 614. As shown, the deep contact openings 618 extends below a bottom surface of body regions 613 to enable formation of the Schottky contact between top-side conductor layer 620 and N− epitaxial layer 604. As in conventional MOSFETs, when the MOSFET in FIG. 6 is in the on state, a current flows through a channel extending along each trench sidewall in body regions 613. In a variation of the FIG. 6 embodiment, spacers 616 are removed so that top-side conductor layer 620 contacts source regions 614 along their top surface.

Figure 8:
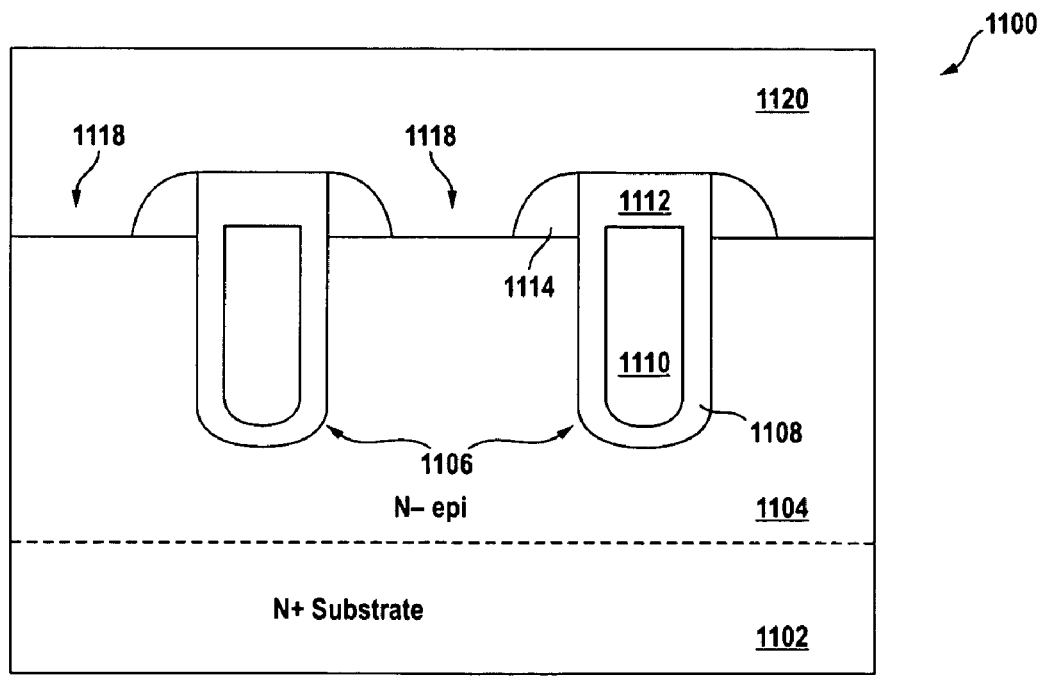
FIG. 8 is a simplified cross section view of a trenched-gate accumulation FET with polysilicon source spacers, according to an exemplary embodiment of the invention.

FIG. 8 shows a cross section view of an accumulation mode FET with spacer source regions optimally integrated with a Schottky diode in a single cell, in accordance with another exemplary embodiment of the invention. An n-type epitaxial layer 1104 extends over and is in contact with an n-type substrate 1102. Gate trenches 1106 extend into and terminate within epitaxial layer 1104. Each gate trench 1106 is lined with a dielectric layer 1108 along its sidewalls and bottom, and includes a gate 1110 and insulating material 1112 atop gate 1110. Spacer source regions 1114 of n-type material, for example, n-type polysilicon, are over epitaxial layer 1104 and flank each side of trenches 1106.

Spacer source regions 1114 form contact openings 1118 through which a top-side conductor layer 1120 electrically contacts both epitaxial layer 1104 and source regions 1114. Top-side conductor layer 1120 comprises Schottky barrier metal. Since epitaxial layer 1104 is lightly doped, top-side conductor layer 1120 forms a Schottky contact with epitaxial layer 1104.

As in previous embodiments, the accumulation-mode transistor in structure 1100 does not include a blocking (p-type in this example) well or body region inside which the conduction channel is formed. Instead a conducting channel is formed when an accumulation layer is formed in epitaxial layer 1104 along trench sidewalls. The FET in structure 1100 is normally on or off depending on the doping concentration of the channel region and the doping type of gates 1110. It is turned off when channel regions are entirely depleted and lightly inverted. Also, because no inversion channel is formed, the channel resistance is eliminated thus improving the transistor power handling capability and its efficiency. Further, with no pn body diode, the losses in synchronous rectification circuits attributable to the pn diode are eliminated.

In the FIG. 8 embodiment the FET in structure 1100 is a vertical trenched-gate accumulation MOSFET with the top-side conductor layer 1120 forming the source conductor and the bottom-side conductor layer (not shown) forming the drain conductor. In another embodiment, substrate 1102 may be p-type to form an accumulation IGBT.

Figure 9A:
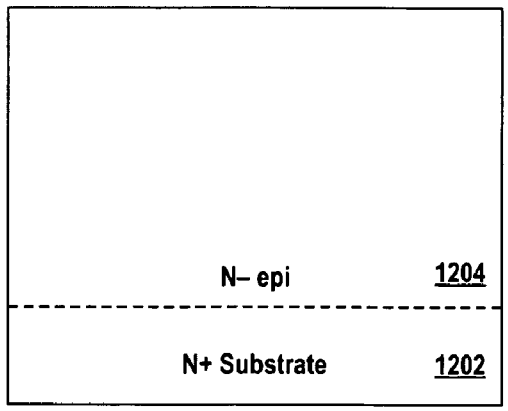
Figure 9B:
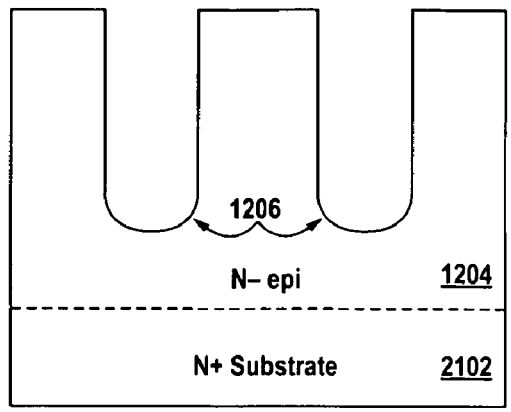
Figure 9C:
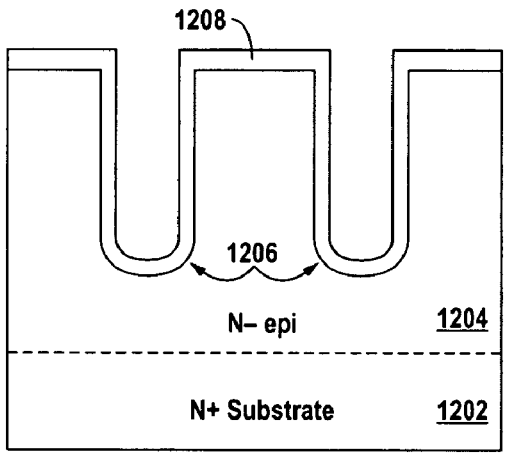

FIGS. 9A to 9H, 9I-1, and 9J-1 show cross section views at different processing steps for forming the integrated FET/Schottky diode structure 1100 in FIG. 8 in accordance with an embodiment of the invention. In FIG. 9A, n-type epitaxial layer 1204 is formed over n-type substrate 1202 using conventional methods. Alternatively, a starting wafer which includes epitaxial layer 1204 may be used. In FIG. 9B, a mask (not shown) is used to define and etch silicon to form trenches 1206 using conventional techniques. A conventional dry or wet etch may be used in forming the trenches. Trenches 1206 extend through and terminate within epitaxial layer 1204. In FIG. 9C, a dielectric layer 1208, e.g., comprising oxide, is grown or deposited over the structure such that the sidewalls and bottom of trenches 1206 are lined with dielectric layer 1208.

Figure 9D:
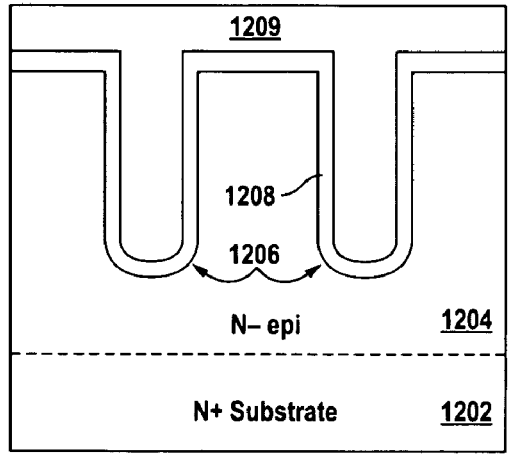
Figure 9E:
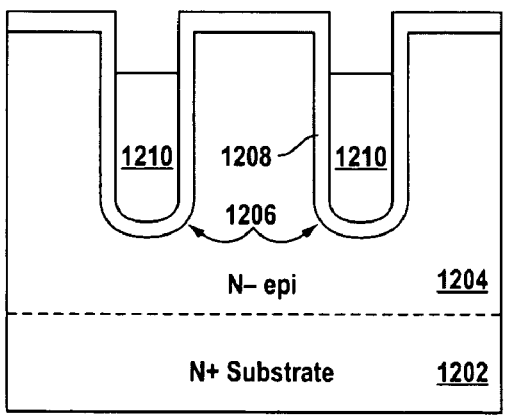

In FIG. 9D, a layer of polysilicon 1209 is deposited to fill trenches 1206 using conventional techniques. Polysilicon layer 1209 may be in-situ doped to obtain the desired gate doping type and concentration. In FIG. 9E, polysilicon layer 1209 is etched back and recessed within trenches 1206 to form recessed gates 1210 using conventional techniques.

Figure 9F:
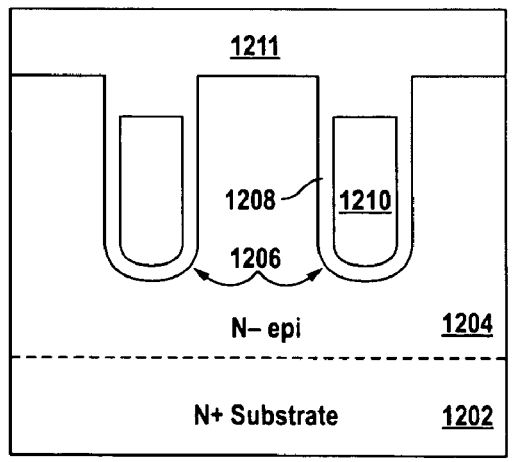
Figure 9G:
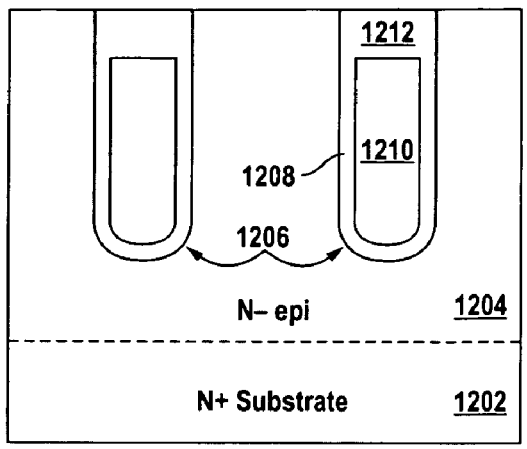
Figure 9H:
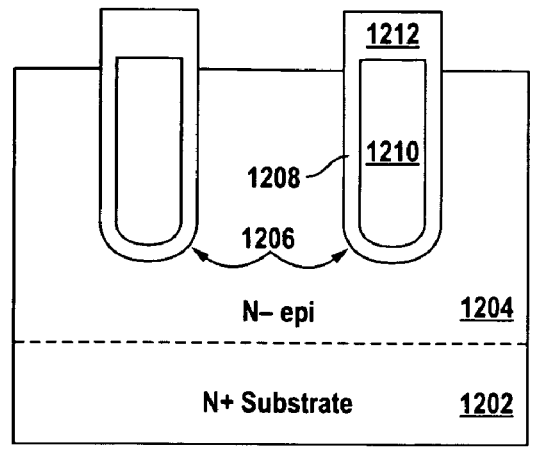
Figures 1, 9I:
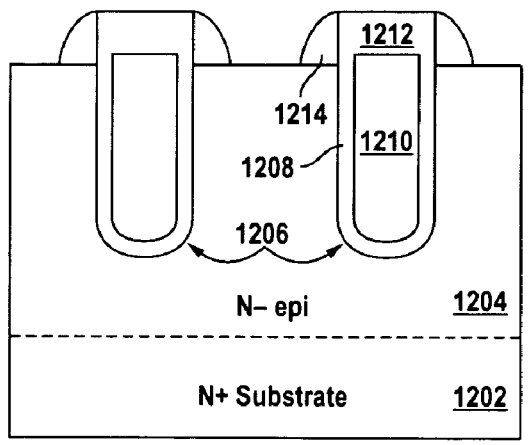
Figures 1, 9J:
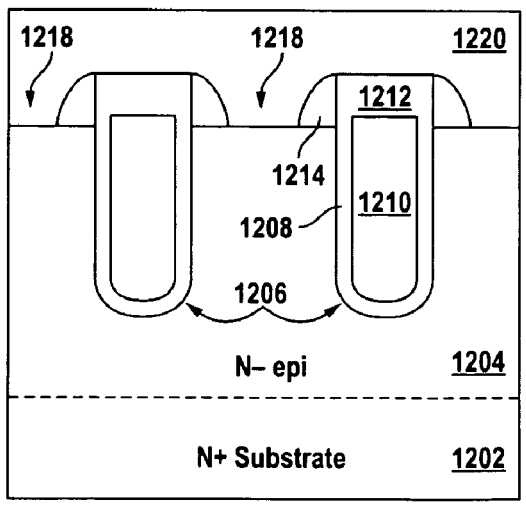

In FIG. 9F, a dielectric layer 1211, e.g., comprising oxide, is formed over the structure and then planarized using conventional techniques. In FIG. 9G, a blanket etch of the planarized dielectric layer 1211 (at least in the active region) is carried out to expose surface areas of epitaxial layer 1204 while portions 1212 of dielectric layer 1211 remain over gates 1210. In FIG. 9H, epitaxial layer 1204 is etched back exposing sidewalls of dielectric material 1212 sufficiently to accommodate the subsequent formation of source spacers 1214. In FIG. 9I-1, a conductive layer, e.g., polysilicon, is deposited and then etched back to form highly-doped source spacers 1214 adjacent to the exposed sidewalls of dielectric material 1212. Where polysilicon is used to form source spacers 1214, the polysilicon may be in-situ doped to obtain highly doped source spacers. In FIG. 9J-1, a top-side conductor layer 1220 is formed using conventional techniques. Conductor layer 1220 comprises Schottky barrier metal. In one embodiment, conductor layer 1220 comprises titanium. As shown, source spacers 1214 form contact openings 1218 through which top-side conductor layer 1220 contacts epitaxial layer 1204. Conductor layer 1220 also contacts source spacers 1214. Since source spacers 1214 are highly doped and epitaxial layer 1204 is lightly doped, top-side conductor layer 1220 forms an ohmic contact with source spacers 1214 and a Schottky contact with epitaxial layer 1204.

Figures 2, 9I:
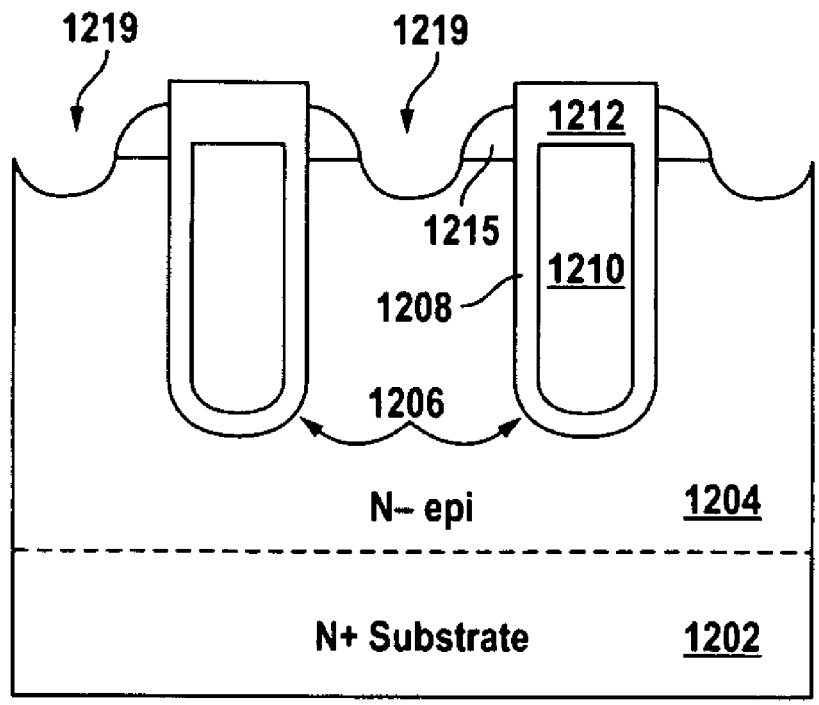
Figures 2, 9J:
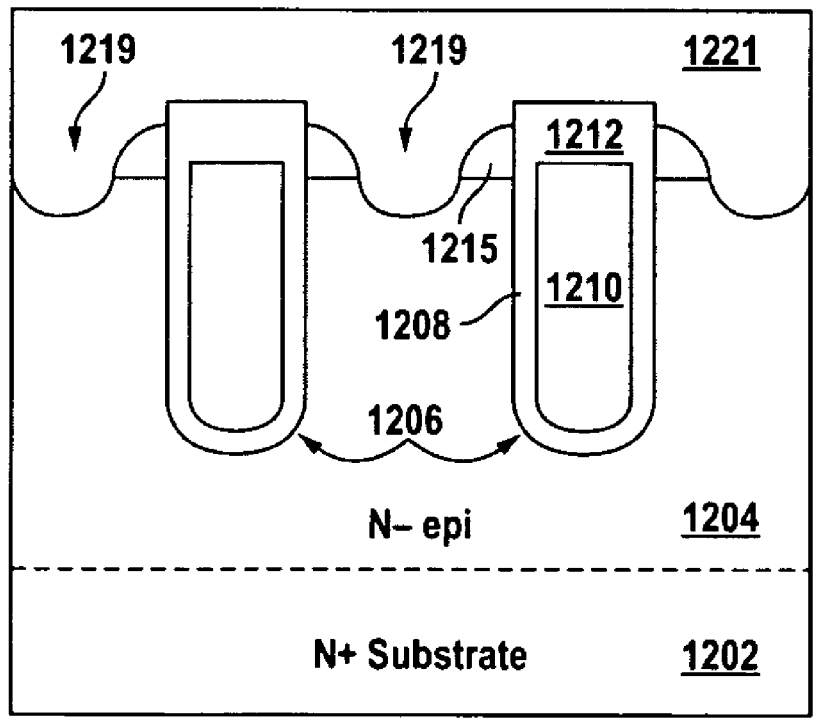

FIGS. 9I-2 and 9J-2 are cross section views depicting alternate processing steps to the steps depicted by FIGS. 9I-1 and 9J-1, resulting in a variation of the structure in FIG. 8. In contrast to the step in FIG. 9I-1 wherein the polysilicon etch is stopped when the surface of epitaxial layer 1204 is exposed, in the step shown in FIG. 9I-2, the polysilicon etch is continued to recess the exposed epitaxial layer regions between the source spacers. As can be seen, because of the additional etch, source spacers 1215 in FIG. 9I-2 are smaller than source spacers 1214 in FIG. 9I-1. In FIG. 9J-2, a top-side conductor layer 1221 is formed over the structure using conventional methods. Top-side conductor layer 1221 forms an ohmic contact with source spacers 1215 and a Schottky contact with epitaxial layer 1204 in regions 1219.

As can be seen, the Schottky contact and source spacers are self-aligned to trenches 1406. Further, the Schottky contact results in lower on resistance Rdson and thus lower on-state losses, and also improves the transistor reverse recovery characteristics. Also, good blocking capability is achieved without the need for a tight cell pitch. Moreover, as described in connection with the FIG. 7 diagram, a further advantage of the recessed Schottky contact of the FIGS. 9I-2, 9J-2 embodiment is reduction in transistor leakage in the blocking state. Also, the polysilicon source spacers consume a smaller area than the conventional diffused source regions. This advantageously results in a larger Schottky contact area.

Figure 10:
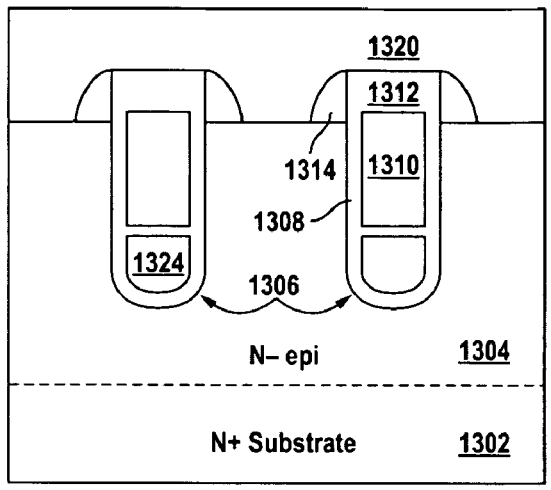
FIGS. 10 and 11 are simplified cross section views respectively illustrating variations of the FET-Schottky structures in FIGS. 9J-1 and 9J-2 wherein shield electrodes are formed underneath the gates.

FIG. 10 shows a cross section view of a variation of the FIG. 8 embodiment wherein shield electrodes 1324 are formed below gates 1310. Shield electrodes 1324 help reduce miller capacitance to a negligible amount and thereby drastically reduce transistor switching losses. Shield electrodes 1324 may be electrically biased to the same potential as the source spacers, or to the ground potential, or to other potentials as the design and performance requirements dictate. More than one shield electrode biased to the same or different potentials may be formed below each gate 1310 if desired. One or more methods for forming such shield electrodes are disclosed in the above-referenced commonly assigned application Ser. No. 11/026,276.

Figure 11:
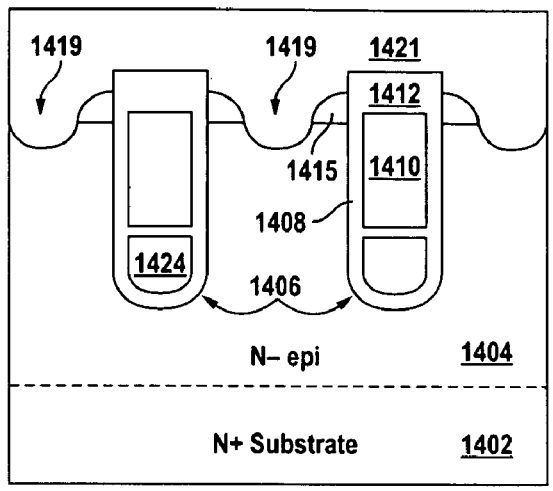
Figure 12:
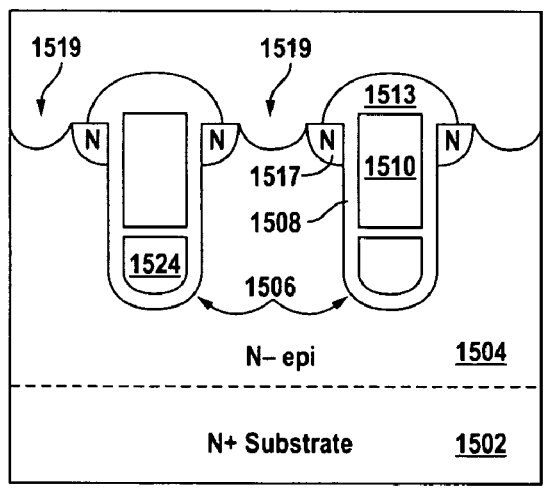
FIG. 12 is a simplified cross section view of a trenched-gate accumulation FET-Schottky structure with shield electrodes underneath the gates in accordance with another embodiment of the invention.
Figure 13:
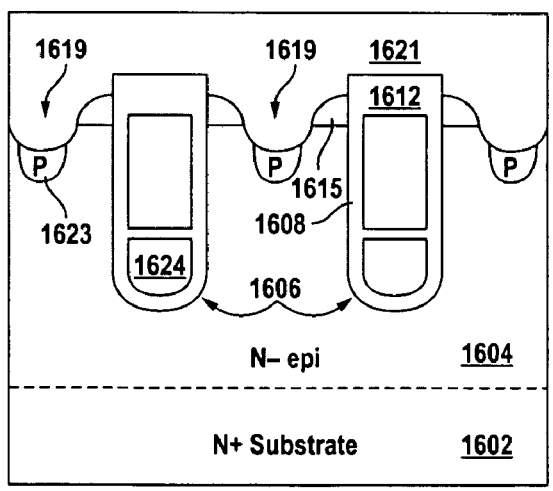
FIG. 13 is a simplified cross section view illustrating a variation of the FIG. 11 embodiment wherein the Schottky region between adjacent trenches is modified to form a MPS structure.

The advantages in using a recessed Schottky contact and in using shield electrodes may be realized by combining them in a single structure as shown by the two examples in FIGS. 11 and 12. FIG. 11 shows use of the recessed Schottky contact and the shield electrode in an accumulation mode FET with polysilicon source spacers 1415. FIG. 12 shows use of the recessed Schottky and shield electrode in an accumulation mode FET with source regions 1517 formed using conventional diffusion methods. FIG. 13 shows a variation of the FIG. 11 embodiment wherein the Schottky region is modified to incorporate p-type regions 1623. P-type regions 1623 may be formed by implanting p-type dopants in the Schottky region prior to forming top-side conductor layer 1620. The well-known Merged P-i-N Schottky (MPS) structure is thus formed in the region between adjacent trenches. In effect, a blocking junction is introduced in an accumulation transistor.

As is well understood in this art, the MPS structure reduces the transistor leakage when in blocking state.

Figure 14:
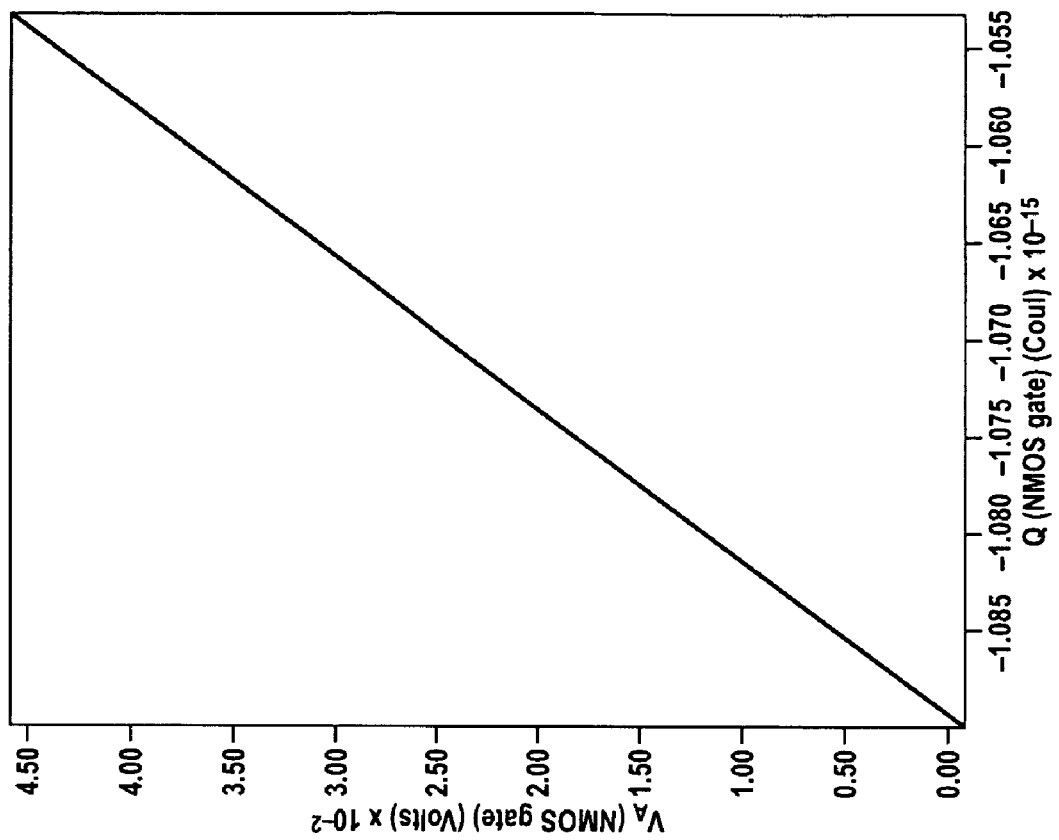
FIG. 14 shows simulated plots of the drain current versus drain voltage characteristics (left plot) and the gate voltage versus the gate charge (right plot) for the FET-Schottky structure in FIG. 1.
Figure 14:
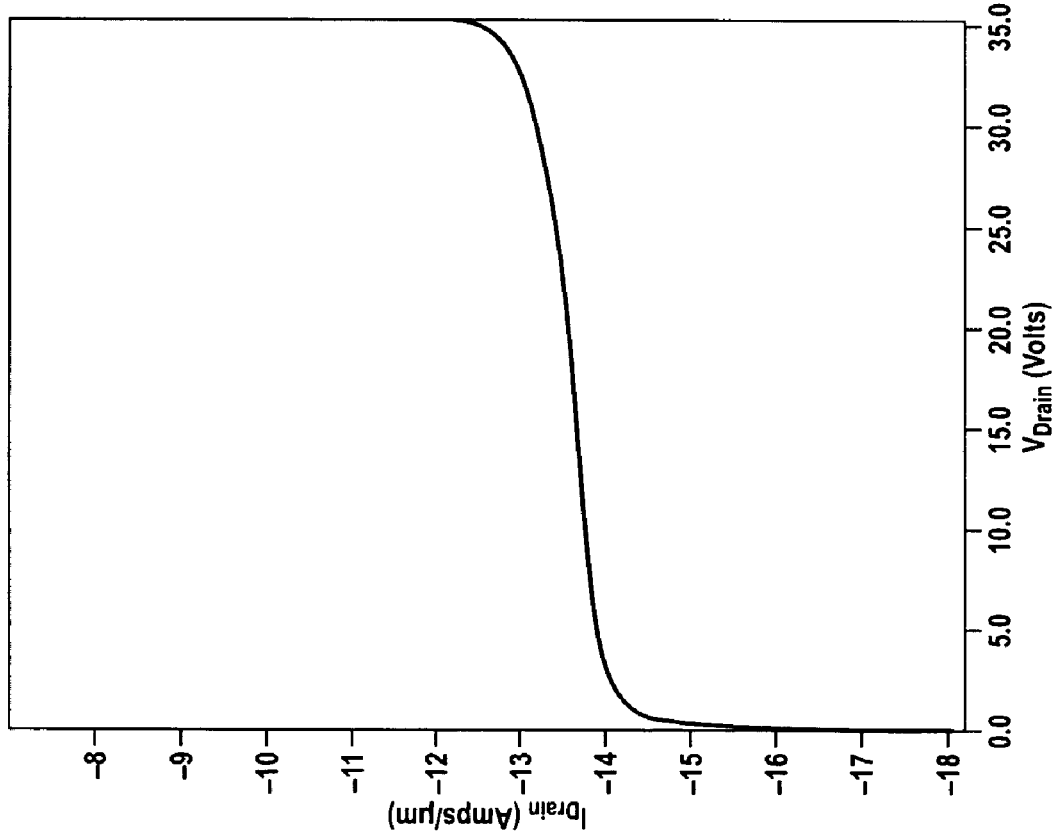

FIG. 14 shows simulation results using the structure in FIG. 1. MEDICI device simulator was used. FIG. 14 includes a left diagram wherein the drain current versus the drain voltage is plotted, and a right diagram wherein the gate voltage versus gate charge is plotted. As the left plot shows, a low leakage current of $1 \times 10^{-14}$ Amperes/μm and a BVDSS of greater than 35V are obtained, and as the right plot shows, the shield electrodes help eliminate the miller capacitance.

In the exemplary process sequences depicted by FIGS. 9A-9H, 9I-1, 9J-1, 9I-2, and 9J-2 and the exemplary transistor structures in FIGS. 10 and 11 no diffusion or implantation processes are used. While these process sequences and structures can be used with conventional crystalline silicon material, they are particularly suitable for use with such other types of materials as silicon carbide (SiC), gallium nitride (GaN), gallium arsenide (GaAs) where diffusion, implantation, and dopant activation processes are difficult to accomplish and control. In such embodiments, the substrate, the epitaxial layer over the substrate, the source regions, as well as other regions of the transistor may be from one of SiC, GaN, and GaAs. Further, in conventional silicon carbide based enhancement mode FETs, the contribution of the inversion channel to the on resistance is particularly high. In contrast, the contribution to the on resistance of the accumulated channel in the silicon carbide embodiment of the accumulation transistors in FIGS. 9J-1, 9J-2, 10, and 11 is substantially low.

While the above embodiments are described using mostly accumulation mode FETs, many of the above features and advantages may be realized in enhancement mode FETs. For example, the process sequences in FIGS. 2A-2I and 3A-3E may be modified by forming p-type well regions in lower epitaxial layer 204 prior to forming upper epitaxial layer 205. The process sequences in FIGS. 9A-9H, 9I-1, 9J-1, and 9A-9H, 9I-2 and 9J-2 may also be modified by forming p-type well regions in epitaxial layer 1204 prior to forming source spacers 1214 and 1215. Many other ways of modifying the above described structures and process sequence embodiments in order to obtain enhancement mode FETs integrated with Schottky diode would be obvious to one skilled in the art in view of this disclosure.

Figure 15A:
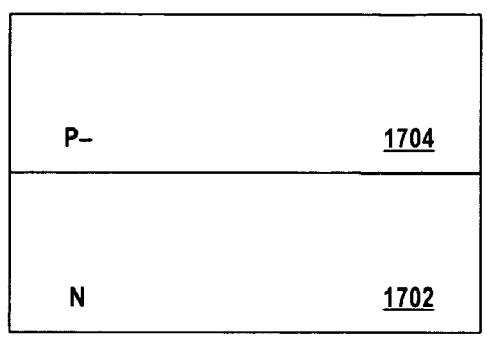
FIGS. 15A-15H are simplified cross section views depicting various process steps for forming a trenched-gate FET with self-aligned features in accordance with another embodiment of the invention.

FIGS. 15A-15H are simplified cross section views at different processing steps for forming a trenched-gate FET in accordance with another embodiment of the invention. In FIG. 15A, lightly doped p-type body region 1704 is formed in n-type region 1702 using conventional implant and drive techniques. In one embodiment, n-type region 1702 comprises a highly doped substrate region over which a lower doped n-type epitaxial layer is formed. In such embodiment, body region 1704 is formed in the n-type epitaxial layer.

Figure 15B:
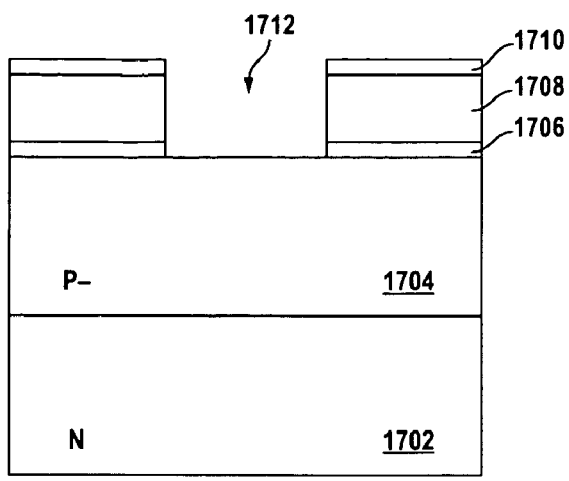

In FIG. 15B, a dielectric stack comprising a lower dielectric layer 1706, a middle dielectric layer 1708, and an upper dielectric layer 1710 is formed over body region 1704. The middle dielectric layer is required to be of a different dielectric material than the upper dielectric material. In one embodiment, the dielectric stack comprises oxide-nitride-oxide. As will be seen, the thickness of the middle dielectric layer 1708 impacts the thickness of a dielectric cap 1720 (FIG. 15D) formed over the gate in a later step of the process, and thus must be carefully selected. The lower dielectric layers is relatively thin in order to minimize the reduction in thickness of dielectric layer 1720 during removal of lower dielectric layer 1706 in a later step of the process. As shown, the dielectric stack is patterned and etched to define opening 1712 through which a gate trench is later formed.

Figure 15C:
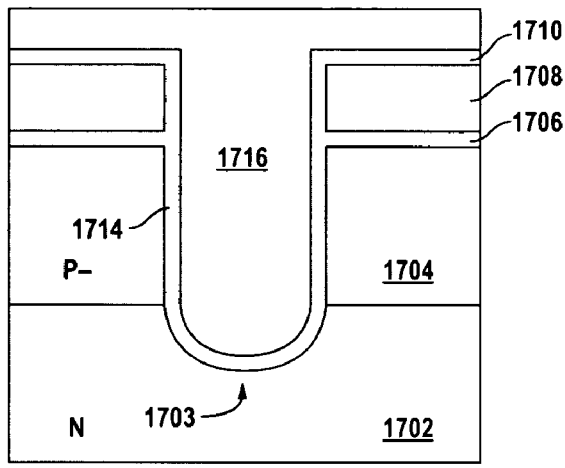
Figure 15D:
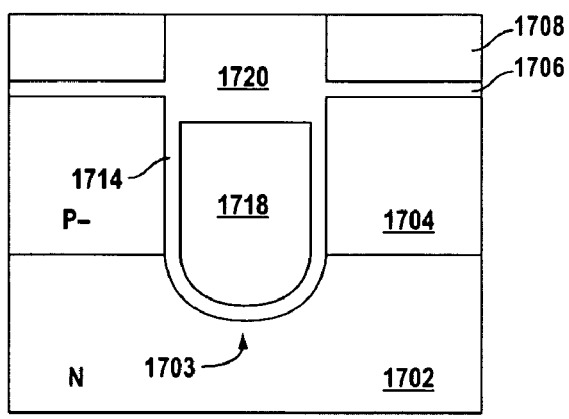
Figure 15E:
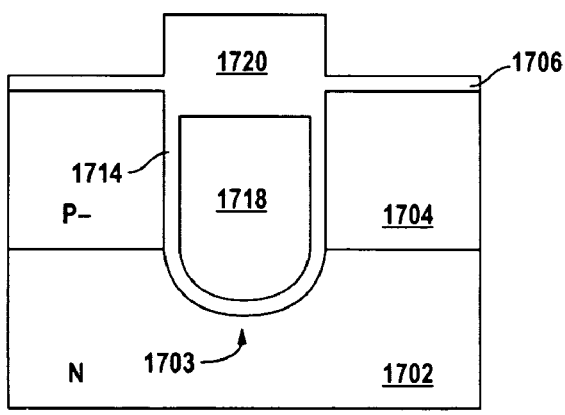

In FIG. 15C, a conventional silicon etch is carried out to form a trench 1703 extending through body region 1704 and terminating in n-type region 1702. A gate dielectric layer 1714 lining the trench sidewalls and bottom is then formed followed by deposition of a polysilicon layer 1716 using conventional techniques. In FIG. 15D, polysilicon layer 1716 is recessed into the trench to form gate 1718. A dielectric layer is formed over the structure and then etched back such that dielectric cap 1720 remains directly above gate 1718. Nitride layer 1708 serves as an etch stop or etch stop detection layer during the etch back of the dielectric layer. In FIG. 15E, nitride layer 1708 is selectively stripped to expose sidewalls of dielectric cap 1720, using known techniques. The bottom oxide layer 1706 thus remains over body region 1704, and dielectric cap 1720 also remains intact over gate 1718.

Figure 15F:
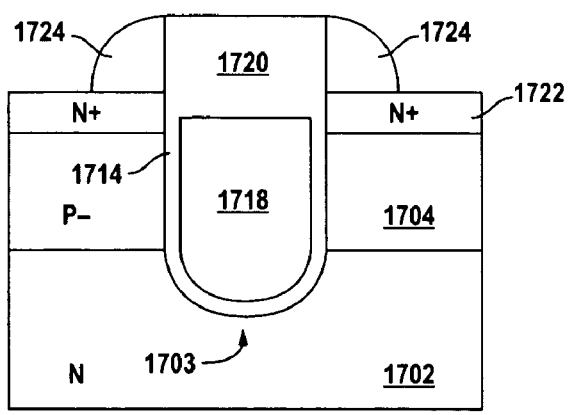
Figure 15G:
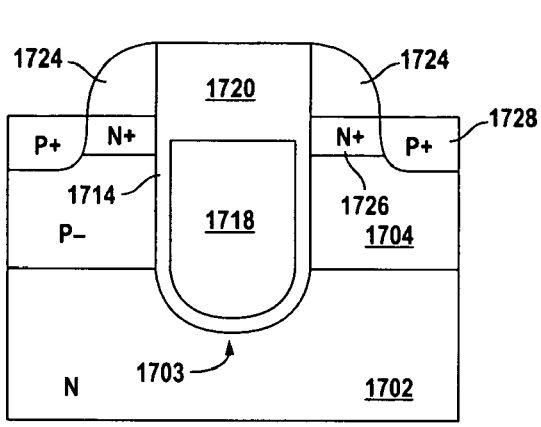

In FIG. 15F, a blanket source implant is carried out in the active region of the device to form highly doped n-type regions 1722 in body regions 1704 on either sides of trench 1703. Dielectric spacers 1724 (e.g., comprising oxide) are then formed along the exposed sidewalls of dielectric cap 1720 using conventional techniques. The activation and drive-in of the implanted dopants can be carried out at this or a later stage of the process sequence. In FIG. 15G, a silicon etch is carried out to recess the exposed surfaces of n-type regions 1722 clear through n-type regions 1722 and into body regions 1704 as shown. Portions 1726 of n-type regions 1722 remaining directly under spacers 1724 form the source regions of the device. Heavy body regions 1728 are then formed in the recessed regions. In one embodiment, heavy body regions 1728 are formed by filling the etched silicon with p+ type silicon using conventional silicon epitaxial growth. Heavy body regions 1728 and source regions 1726 are thus self-aligned to trench 1703.

Figure 15H:
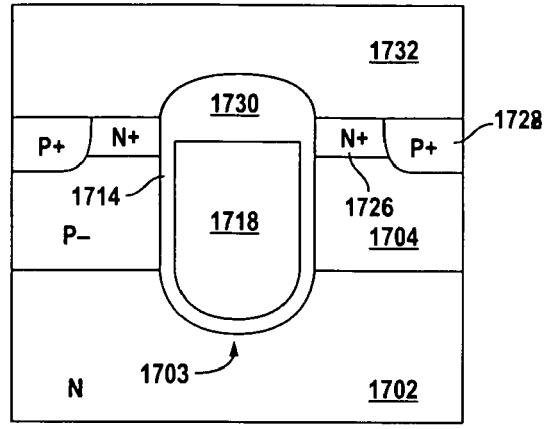

In FIG. 15H, dielectric cap 1720 and spacers 1724 are then partially etched back to expose surface areas of source regions 1726. After the etch, domed dielectric 1730 remains over gate 1718. Top conductor layer 1732 is then formed to contact source regions 1726 and heavy body regions 1728. Domed dielectric 1730 serves to electrically insulate gate 1718 from top conductor layer 1732. In one embodiment, n-type region 1702 is a lightly doped epitaxial layer with a highly doped n-type substrate (not shown) extending below the epitaxial layer. In this embodiment, a back side conductor layer (not shown) is formed to contact the substrate, the back side conductor layer forming the device drain terminal. A trenched-gate FET with self-aligned source and heavy body regions is thus formed.

In an alternate embodiment, a thick dielectric layer (e.g., comprising oxide) is formed along a bottom portion of trench 1703 before forming gate 1718. The thick bottom dielectric has a greater thickness than gate dielectric 1714, and serves to reduce the gate to drain capacitance thus improving the device switching speed. In yet another embodiment, a shield electrode is formed below gate 1718 similar to those shown in FIGS. 4 and 10-13.

In yet another variation of the process sequence depicted by FIGS. 15A-15H, after the steps corresponding to FIG. 15F, the exposed silicon surfaces are not recessed, and instead a heavy body implant and drive-in process is carried out to form heavy body regions extending through n-type regions 1722 and into body regions 1704. A similar cross section view to that in FIG. 15G is obtained except that heavy body regions 1728 extend under dielectric spacers 1724 due to side diffusion during the drive-in process. Dielectric spacers 1724 need to be wide enough to ensure that the n-type region 1722 is not entirely consumed during side diffusion of the heavy body region. This can be achieved by selecting a thicker middle dielectric layer 1708.

The technique of using a dielectric stack to obtain self-aligned source and heavy body regions as illustrated in FIGS. 15A-15H can be similarly implemented in a number of the process embodiments disclosed herein. For example, in the process embodiment depicted by FIGS. 3A-3E, the process steps corresponding to FIGS. 3A-3B may be replaced with the process steps depicted by FIGS. 15B-15E in order to obtain self-aligned source regions and Schottky contacts, as described next.

The mask used to form trenches 306 in FIG. 3A is replaced with a dielectric stack of three dielectric layers which is patterned and etched to form openings through which trenches are formed (similar to that shown in FIGS. 15B and 15C). Then, in FIG. 3B, with the opening in the ONO composite layer filled with a dielectric cap (similar to dielectric cap 1720 in FIG. 15D), the top oxide and the intermediate nitride layer of the ONO composite layer are removed to expose sidewalls of the dielectric cap (similar to that shown in FIG. 15E). The remainder of the process sequence depicted by FIGS. 3C-3E remains unchanged. Recessing of n+ epi layer 305 carried out in FIG. 3B in order to expose sidewalls of dielectric 312 is no longer necessary, and a thinner epitaxial layer 305 may be used.

The dielectric stack technique may also be implemented in the process embodiment depicted by FIGS. 9A-9J by replacing the process steps corresponding to FIGS. 9B-9 with the process steps depicted by FIGS. 15B-15E in a similar manner to that described above.

Figure 16:
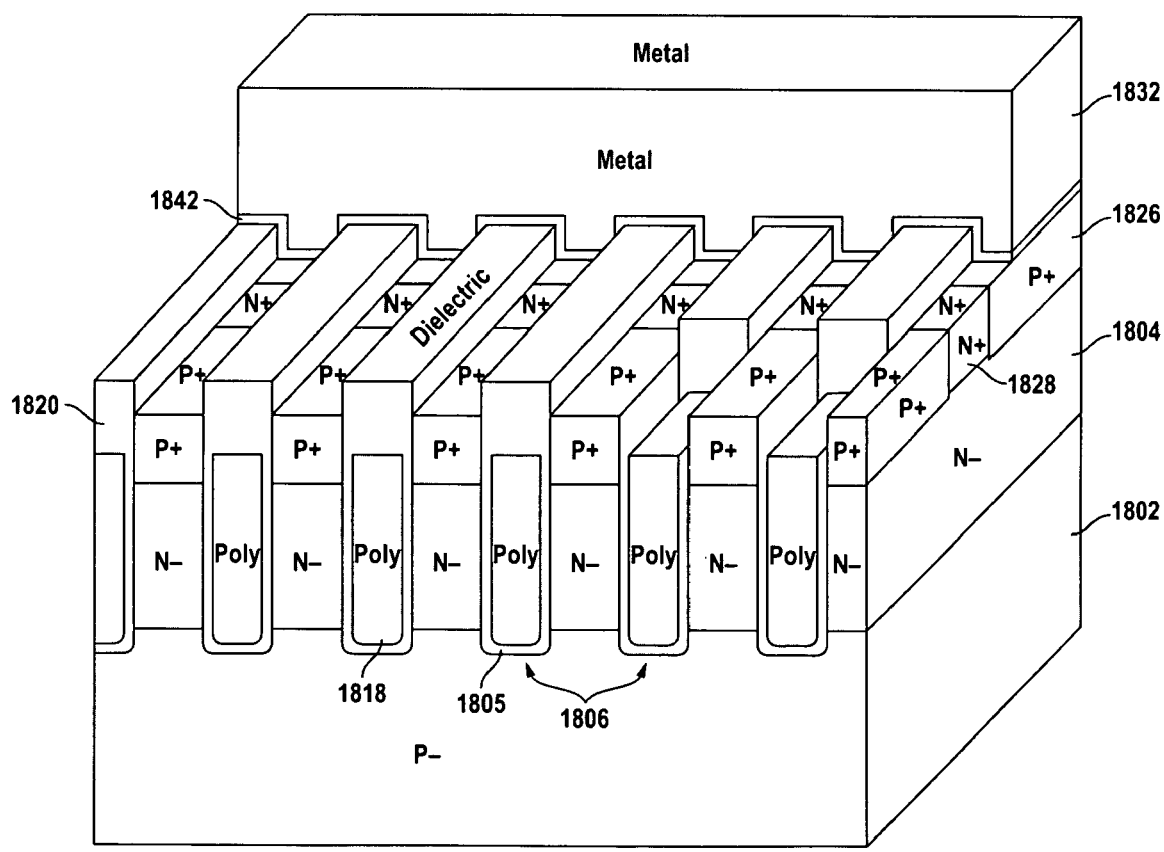
FIG. 16 shows an isometric view of a p-channel trenched-gate FET with a non-planar top surface (prior to top metal formation) in accordance with another embodiment of the invention.

FIG. 16 shows a simplified isometric view of a p-channel trenched-gate FET having a non-planar top surface (prior to top metal formation) in accordance with another embodiment of the invention. This invention is not limited to p-channel FETs. One skilled in this art would know how to implement the invention in an n-channel FET or other types of power transistors in view of this disclosure. In FIG. 16, top metal layer 1832 is peeled back to reveal the underlying regions. Similarly, dielectric caps 1820 are partially removed from over the right two gates 1818 for illustration purposes. As shown, a lightly-doped n-type body region 1804 extends over a lightly doped p-type region 1802. In one embodiment, p-type region 1802 is an epitaxial layer formed over a highly doped p-type substrate (not shown), and body region 1804 is formed in epitaxial layer 1802 by implanting and driving in appropriate dopants as know in this art.

Gate trenches 1806 extend through body region 1804 and terminate in p-type region 1802. Each gate trench 1806 is lined with a gate dielectric 1805 and then filled with polysilicon which is recessed relative to a top surface of the adjacent silicon mesa regions. A dielectric cap 1820 extends vertically over each gate 1818. Heavily doped p-type source regions 1826 are formed in body region 1804 between adjacent trenches. As shown, a top surface of dielectric cap 1820 is at a higher plane than the top surface of source regions 1826, resulting in a non-planar top surface. In one embodiment, this non-planarity is obtained by recessing the silicon mesa between dielectric caps 1820. Heavy body regions 1828 are intermittently formed along the stripe-shaped body regions 1804 between adjacent trenches. A top side metal layer 1832 is formed over the structure to make electrical contact to both source regions 1826 and heavy body regions 1828. This FET structure is advantageous in that the cell pitch is reduced by forming the heavy body region intermittently along the source stripe, and thus a high density FET is achieved.

Figure 17A:
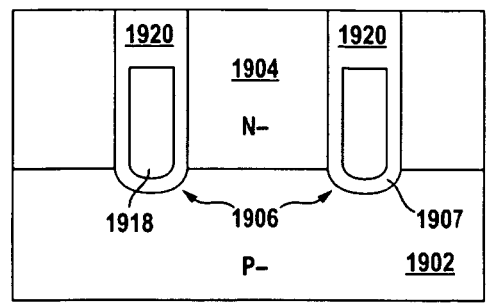

FIGS. 17A, 17B-1, and 17B-2 will be used to describe two ways of forming the FET in FIG. 16. These figures do not show the heavy body regions because these figures correspond to cross section views along the front face of the isometric view in FIG. 16. In FIG. 17A, n-type body region 1904 is formed in p-type epitaxial layer 1902 using conventional implant and drive-in techniques. Trenches 1906, gate insulator 1907 lining trenches 1906, and the recessed polysilicon gates 1918 are formed using known techniques. A dielectric layer is formed over the structure, is then planarized, and finally uniformly detached back until the silicon surface is exposed. The space directly over each gate is thus filled with dielectric cap 1920. In one embodiment, the exposed silicon mesa surfaces between adjacent dielectric regions 1920 are recessed to a depth intermediate the top and bottom surfaces of dielectric region 1920, followed by a source implant to form p-type source regions. In an alternate embodiment, the source formation is carried out before recessing the silicon. The heavy body regions (not shown) can be formed before or after forming the source regions.

Figures 1, 17B:
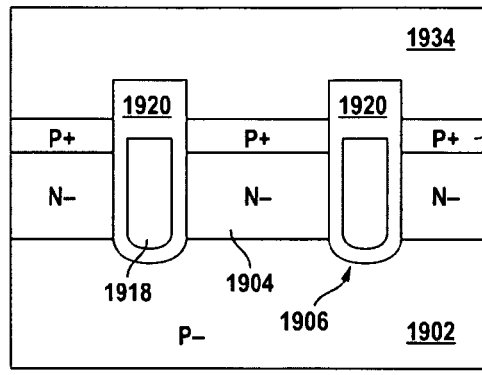
Figures 2, 17B:
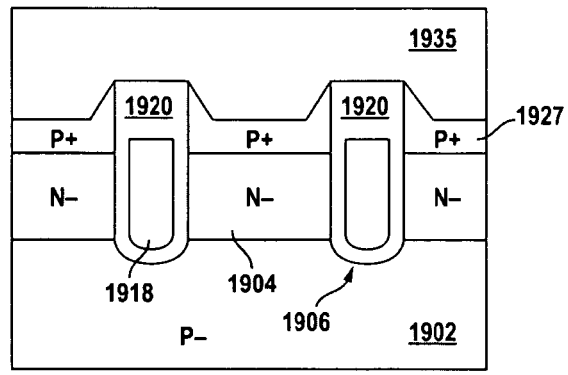

FIG. 17B-1 shows a variation wherein the silicon recess is carried out so that upper sidewalls of dielectric regions 1920 become exposed (i.e., source regions 1926 have flat top surfaces). FIG. 17B-2 shows another variation wherein the silicon recess is carried out so that the top surface of the source regions between adjacent trenches is bowl-shaped and thus sidewalls of dielectric regions 1920 are not exposed. In one embodiment, this is achieved by performing an anisotropic silicon etch. An advantage of the FIG. 17B-2 variation is that a larger source surface area is provided for contact with the top conductor layer 1935, and thus the source contact resistance is reduced. Also, a tighter cell pitch and thus a high density FET is obtained by forming the heavy body regions intermittently along the source stripes.

Figure 18:
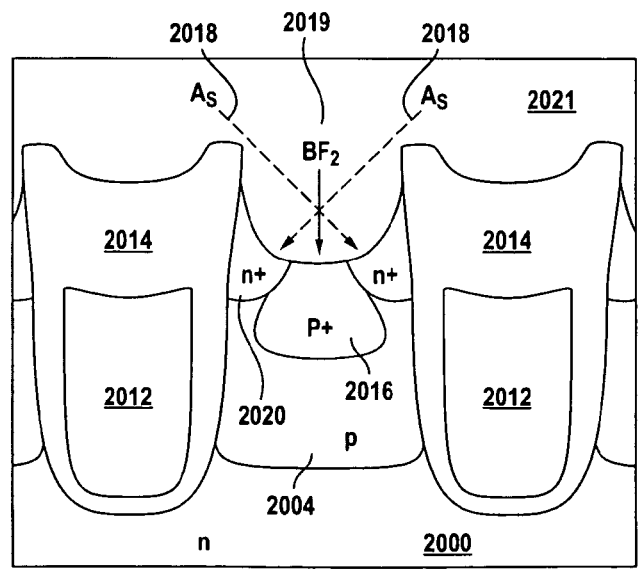
FIG. 18 is cross section view illustrating a technique for forming self-aligned source and heavy body regions, in accordance with an embodiment of the invention.

FIG. 18 is a simplified cross section depicting a technique for obtaining a highly compact trenched-gate FET with self-aligned heavy body and source regions. In FIG. 18, gate trenches with gates 2012 therein extend through p-well region 2004 and terminate within n-type drift region 2000. In one embodiment, n-type drift region 2000 is an epitaxial layer formed over a highly doped n-type substrate (not shown). Each gate trench includes a dielectric cap 2014 over gate 2012. As shown, the mesa regions between the two trenches is recessed such that the silicon recess has sloped outer walls extending from near the top of dielectric cap 2014 to the bottom of the mesa recess.

As indicated by the solid line arrow 2019 extending perpendicularly to the bottom surface of the mesa recess, highly doped p-type heavy body region 2016 is formed by carrying out a blanket implant of dopants (e.g., $BF_2$) at a zero degree angle. Given the zero degree angle of the heavy body implant, the opposite slopes of each trench sidewall and its immediately adjacent outer wall of the mesa recess, together with careful selection of the implant dopant type and such implant variables as implant energy, ensure that the implanted dopants do not reach the channel regions extending along the trench sidewalls in well regions 2004.

As indicated by the two angled dashed line arrows 2018, a blanket two-pass angled implant of n-type dopants is performed to form source regions 2020 along the sloped walls of each mesa recess. As shown, the upper trench corners block the source implants from entering the central portion of the heavy body region. As can be seen no mask is used during either the heavy body implant or the two-pass angled source implant. The mesa recess, in effect, creates a natural mask enabling formation of self-aligned heavy body and source regions.

The self-aligned heavy body and source regions enable a significant reduction in the cell pitch resulting in a highly dense cell structure which in turn helps reduce the transistor on-resistance. Further, self-aligned heavy body regions help improve the unclamped inductive switching (UIL) ruggedness. Also, forming the source and heavy body regions in a self-aligned manner, reduces the number of masks thus reducing the manufacturing cost while simplifying the process sequence and improving manufacturing yield. Moreover, the particular profile of the source and heavy body regions are advantageous in that: (i) the sloped outer walls the mesa recess provides a large source surface area which helps reduce the source contact resistance, and (ii) the heavy body region overlaps under the source regions which helps improve the transistor UIL ruggedness. Further, as will be seen, the technique illustrated in FIG. 18 is compatible with many thick bottom dielectric processes, and lends itself well to the LOCOS process.

FIGS. 18A-18I, 19A-19H, 20A-20G, 21A-21H, and 22A-22F show various process sequences wherein the technique illustrated in FIG. 18 is used to form various FET structures with self-aligned features. Many other process sequences or variations of those disclosed herein with the technique illustrated in FIG. 18 implemented therein can be envisioned by one skilled in this art in view of this disclosure.

Figure 18A:
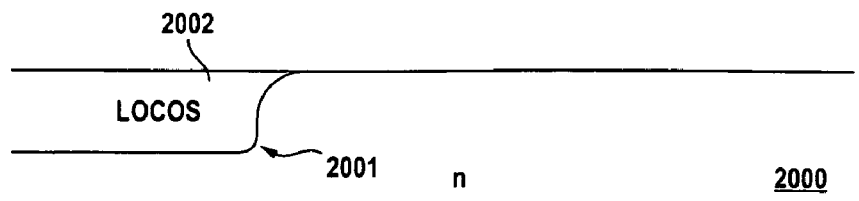
FIGS. 18A-18I are cross section views at different processing steps for forming the trenched-gate FET shown in FIG. 18, in accordance with an exemplary embodiment of the invention.

FIGS. 18A-18I show cross section views at different processing steps for forming a trenched-gate FET with self-aligned source and heavy body regions in accordance with another embodiment of the invention. In FIG. 18A, conventional silicon etch and LOCOS processes are used to form insulation-filled trench 2001 in the termination region. A pad oxide layer (not shown) and a nitride layer (not shown) are first formed over n-type silicon region 2000. A first mask is then used to define the portion of silicon region 2000 in the termination region where silicon is to be removed. The nitride layer, pad oxide and the underlying silicon region are removed through the first mask to form trench 2001 in the termination region. Local oxidation is then carried out to fill trench 2001 with insulating material 2002. Although not shown, the starting material may comprise a highly doped n-type substrate over which n-type region 2000 is formed, for example, epitaxially.

Figure 18B:
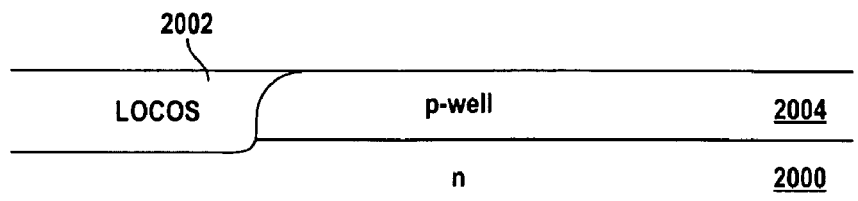
Figure 18C:
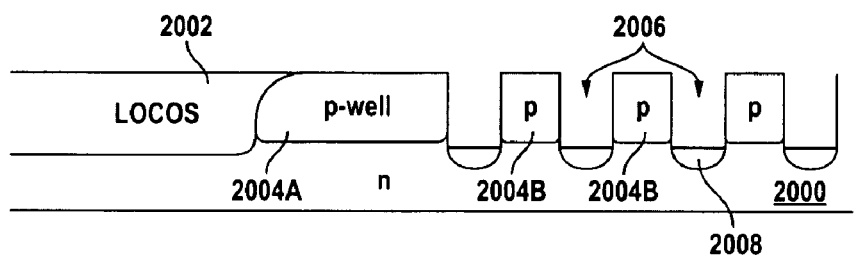

In FIG. 18B, a blanket well implant and drive-in is carried out to form p-type well region 2004 in silicon region 2000. The implanted impurities may alternatively be driven in at a later stage of the process. In FIG. 18C, a second masking step is carried out to define and etch trenches 2006 which extend through well region 2004 and terminate within silicon region 2000. A bottom portion of trenches 2006 is filled with insulating material by, for example, depositing high density plasma (HDP) oxide and then etching the deposited HDP oxide to form thick bottom oxide 2008.

Figure 18D:
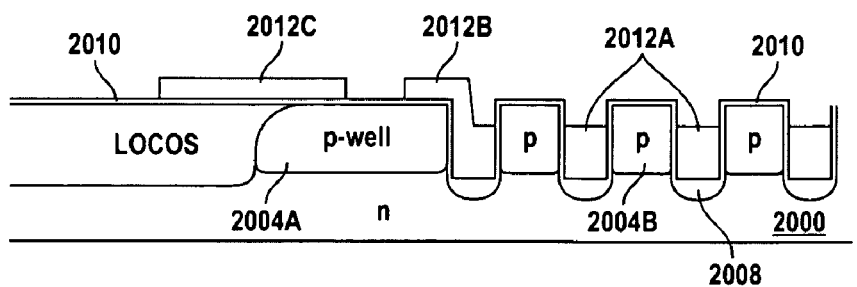
Figure 18E:
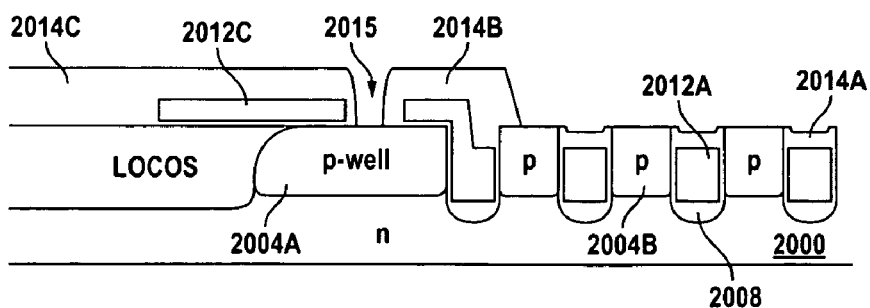

In FIG. 18D, a gate insulating layer 2010 is formed along all surface areas including the trench sidewalls. Polysilicon is then deposited and doped (e.g., in situ). A third mask is used to define and etch the polysilicon to form recessed gates 2012A in the active area, termination trench gate 2012B and the surface gate 2012C. In FIG. 18E, a dielectric layer is formed over the structure. A fourth mask is then used to define the portion of the active region and the opening 2015 in the termination region where the dielectric layer is to be etched back. The dielectric layer is etched through the mask openings until silicon is reached. Thus, in the active region, the space directly over each gate 2012A remains filled with dielectric material 2014A, while opening 2015 is formed in the termination region. As can be seen, surfaces of well regions 2004B in the active region and well region 2004A in the termination region are exposed.

Figure 18F:
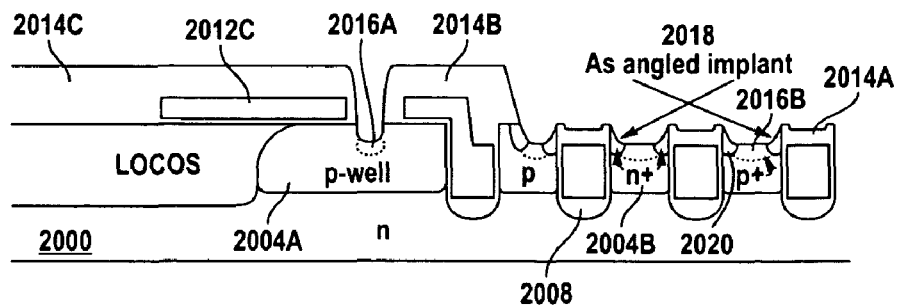

In FIG. 18F, a silicon etch step is carried out to recess the exposed silicon surface areas in the active and termination regions. An almost bowl-shaped silicon surface is formed in well regions 2004B between adjacent trenches in the active region and in well region 2004A in the termination region. Next, a zero degree heavy body implant (e.g., $BF_2$) is carried out to form p-type heavy body regions 2016B in well regions 2004B of the active region, and to form heavy body region 2016A in well region 2004A of the termination region. Source regions 2020 are then formed using a two-pass angled source implant as depicted by arrows 2018. In the two-pass angled implant, n-type impurities are implanted at such angle that the upper trench corners prevent a central portion 2016B of the heavy body regions from receiving the implant. Source regions 2020 are thus formed immediately adjacent the trenches while a central portion 2016B of the heavy body regions remains intact as shown. Because of the aspect ratio of the opening 2015 (FIG. 18E) and the angle of the two-pass source implant, termination well region 2004A does not receive the source implants.

Figure 18G:
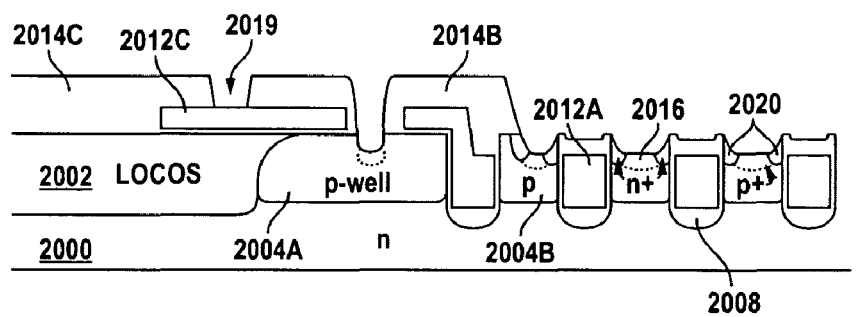
Figure 18H:
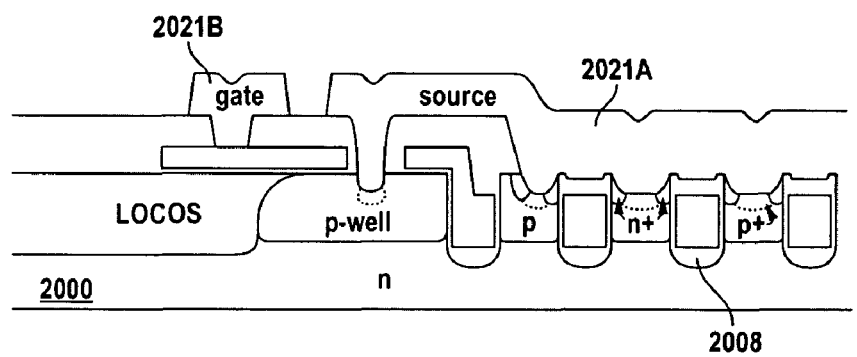
Figure 18I:
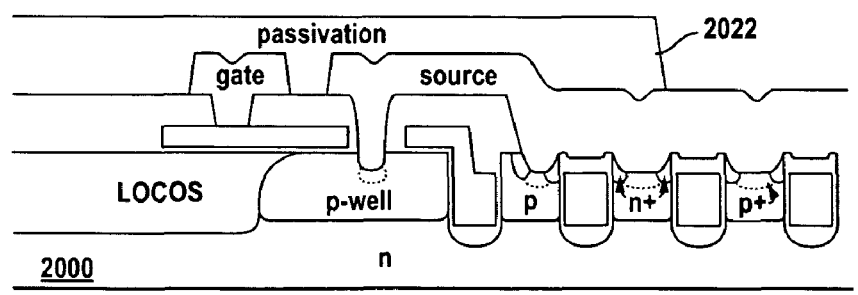

In FIG. 18G, an implant activation step is carried out to drive in the implanted dopants. A fifth mask is then used to define and etch insulating layer 2014C to form gate contact opening 2019. In FIG. 18H, a conductor layer (e.g., comprising metal) is then formed over the structure. A sixth mask is used to define and etch the conductor layer in order to isolate source conductor 2021A from gate conductor 2021B. In FIG. 18I, a passivation layer is deposited. A seventh mask is then used to etch portions of the passivation layer to thereby define source and gate areas where wirebond contacts are to be made. In embodiments wherein a passivation layer is not necessary, the corresponding mask and process steps are eliminated.

As can be seen no mask is used in forming heavy body regions 2016B and source regions 2020. Also, both the heavy body and source regions are self-aligned with the trench edges. Further, heavy body region 2016B overlaps beneath source regions 2020 but does not extend into the channel regions. A tight cell pitch with an exceptional snapback and UIL ruggedness is thus achieved. The small cell pitch helps achieve a lower Rdson. Also, since source regions 2020 are formed along the outer curved surfaces of well regions 2004B, a larger source contact area is obtained and thus a lower source contact resistance is achieved. Moreover, the simple process sequence uses a reduced number of masking steps, is compatible with many thick bottom oxide (TBO) process modules, and lends itself well to the LOCOS method of forming the TBO.

The cross sections in FIGS. 18A-18I depict merely an exemplary process sequence and an exemplary termination structure. This process sequence may be optimized in various ways to further reduce the number of masks and implement different termination structures including those illustrated by the process sequences in FIGS. 19A-19H, 20A-20G, 21A-21H, and 22A-22F described next.

Figure 19A:
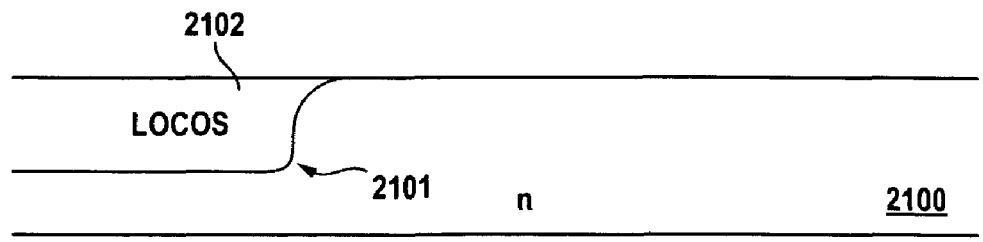
FIGS. 19A-19H are cross section views at various process steps of a process sequence in which no surface polysilicon is formed and the number of masks is reduced compared to that in the process of FIGS. 18A-18I, in accordance with another exemplary embodiment of the invention.
Figure 19B:
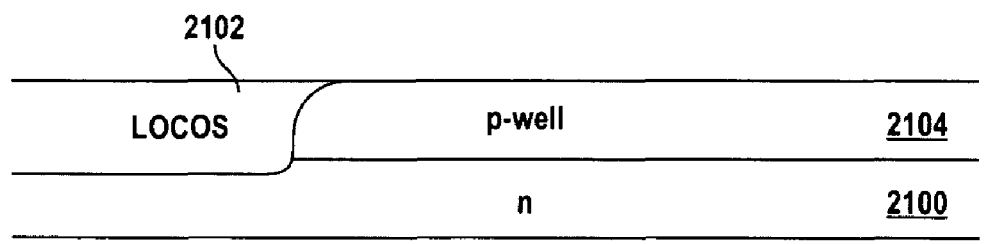
Figure 19C:
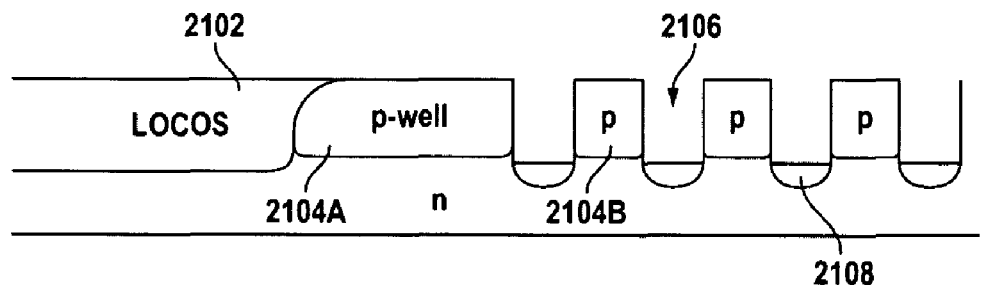
Figure 19D:
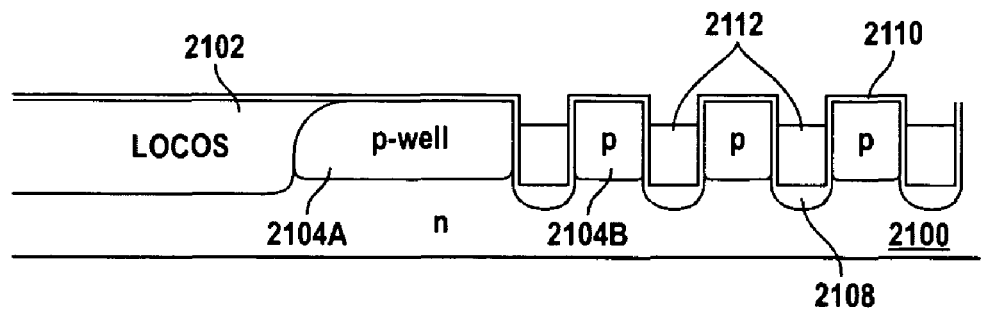
Figure 19E:
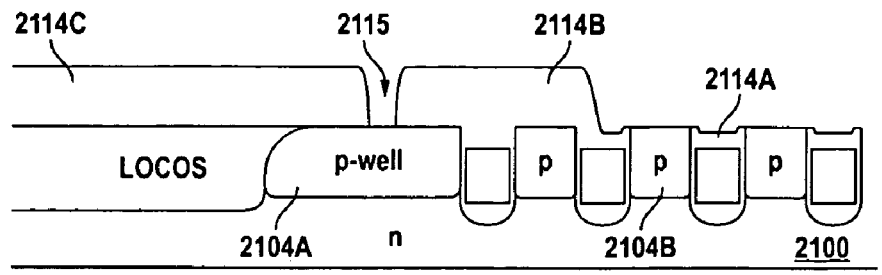
Figure 19F:
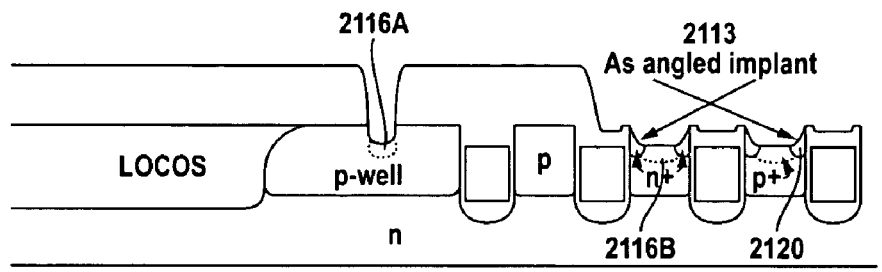

FIGS. 19A-19H are cross section views of a process sequence in which instead of a surface polysilicon a trenched polysilicon is formed which enables reducing the number of masks by one compared to that in the process of FIGS. 18A-18I. The process steps corresponding to FIGS. 19A-19C are similar to those corresponding to FIGS. 18A-18C and thus will not be explained. In FIG. 19D, gate insulator 2110 is formed and then polysilicon is deposited and doped. A blanket etch of the deposited polysilicon is carried out so that recessed gates 2112 remain in the trenches. Here, the gate mask in FIG. 18D of the previous embodiment is eliminated. In FIG. 19E, a similar sequence of process steps to that in FIG. 18E is carried out so that the space directly over each gate 2112 is filled with dielectric material 2114A, while opening 2115 is formed in the dielectric layer over termination p-well 2014A. In FIG. 19F, a similar sequence of process steps to that in FIG. 18F is carried out to form self-aligned heavy body regions 2116A and 2116B and self-aligned source regions 2120.

Figure 19G:
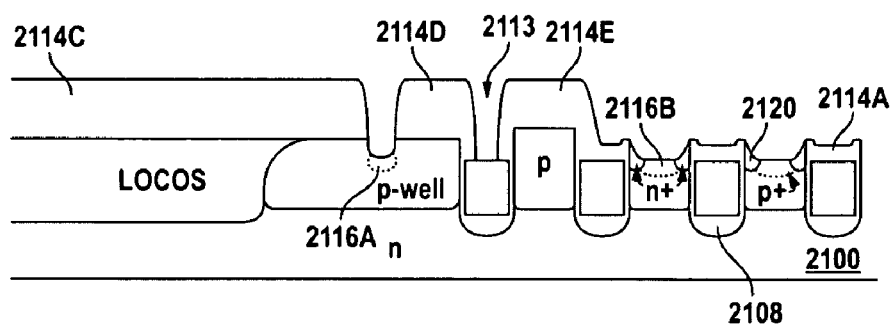

In FIG. 19G, a gate contact mask (the fourth mask) is used to define and etch a gate contact opening 2113 in the dielectric layer over the far left gate trench, followed by activation of the implanted dopants. Gate contact opening 2113 provides electrical access to the trenched polysilicon gates which are interconnected along a third dimension not shown in FIG. 19G. In an alternate embodiment, termination p-well 2104A is allowed to float thus eliminating the need for termination source conductor 2121A.

Figure 19H:
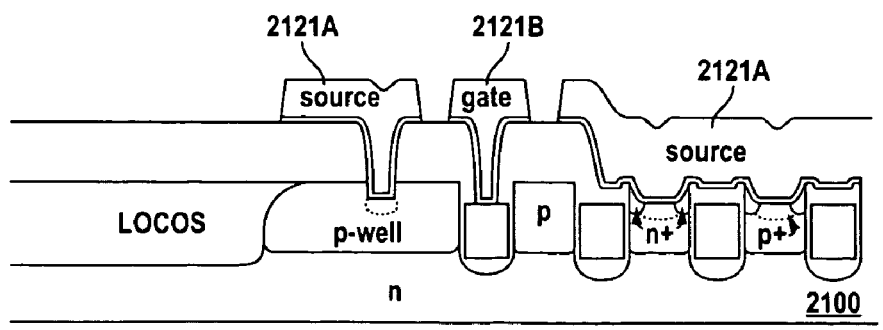

In FIG. 19H, a conductor layer (e.g., comprising metal) is deposited followed by a masking step (fifth) to define and isolate source conductor portions 2121A from gate conductor portion 2121B. As can be seen, only five masks are used in the process depicted by FIGS. 19A-19H. The thin layer directly beneath the gate and source conductor layers is an optional barrier metal.

Figure 20A:
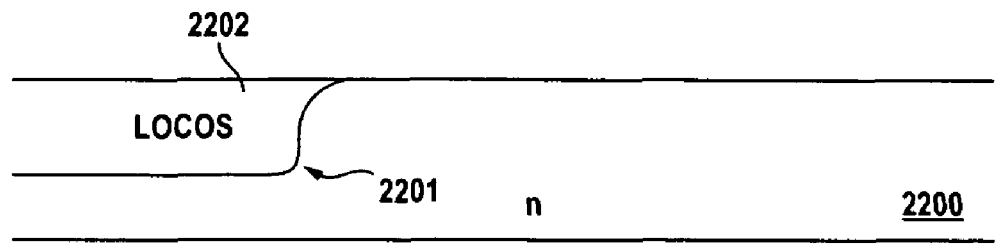
FIGS. 20A-20G are cross section views depicting another process sequence in which the number of masks is reduced compared to that in FIGS. 18A-18I in accordance with yet another exemplary embodiment of the invention.
Figure 20B:
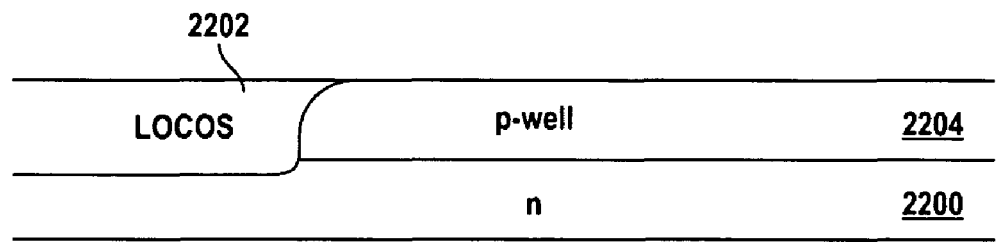
Figure 20C:
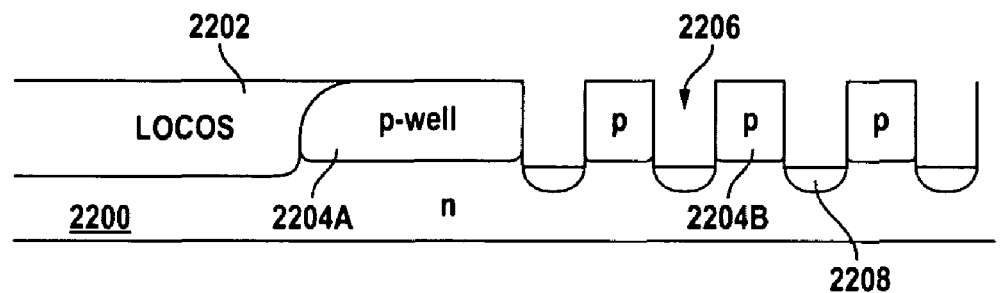
Figure 20D:
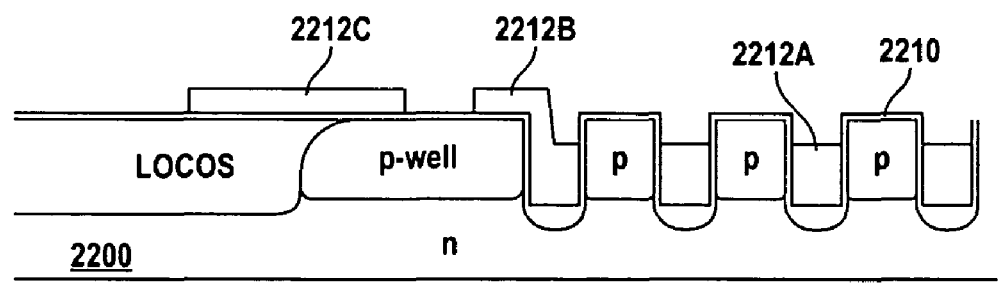
Figure 20E:
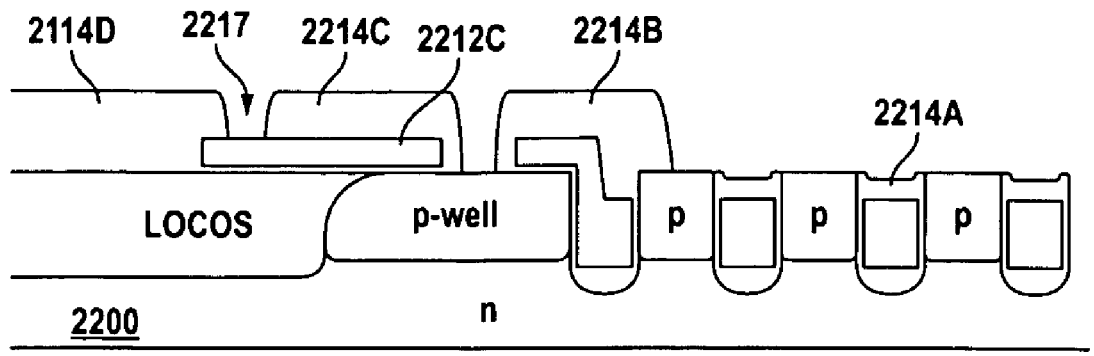
Figure 20F:
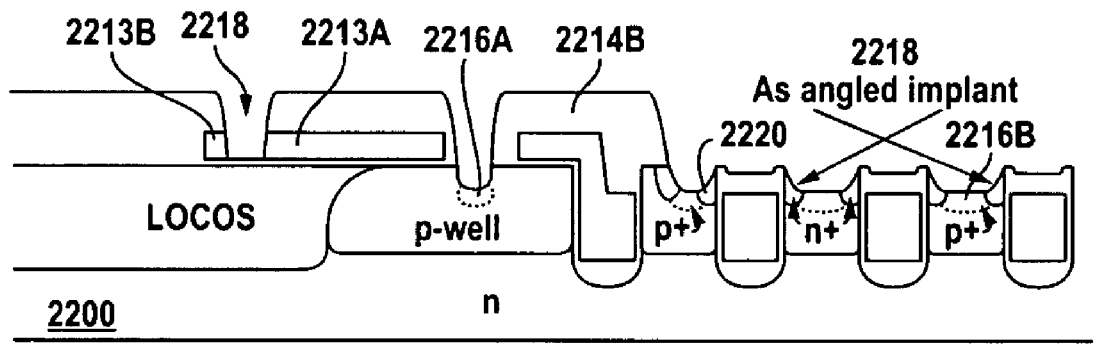

FIGS. 20A-20G are cross section views of another process sequence using fewer masks as compared to the process depicted by FIGS. 18A-18I. The process steps corresponding to FIGS. 20A-20D are similar to those corresponding to FIGS. 18A-18D, and thus will not be explained. The process sequence corresponding to FIG. 20E is similar to that corresponding to FIG. 18E expect that the fourth mask is used to form an additional opening 2217 in the termination dielectric layer over surface polysilicon 2212C. The process sequence corresponding to FIG. 20F is similar to that corresponding to FIG. 18F. However, because of opening 2217 (in FIG. 20E) over surface polysilicon 2212C, the silicon etch for recessing the exposed mesa surfaces also etches the exposed portion of surface polysilicon 2212C creating an opening 2218 therein. Sidewalls of the surface polysilicon thus become exposed through contact opening 2218. Depending on the depth of mesa recess in the active area and the thickness of surface polysilicon 2212C, the mesa recess etch may etch clear through surface polysilicon 2212C or leave a thin layer of polysilicon along the bottom of opening 2218. In one embodiment, opening 2218 is formed such that its aspect ratio allows the two angled source implants 2218 to reach the sidewalls of surface polysilicon portions 2213A and 2213B. This advantageously minimizes the contact resistance between later formed gate conductor layer 2221B (FIG. 20G) and surface polysilicon portions 2213A and 2213B.

Figure 20G:
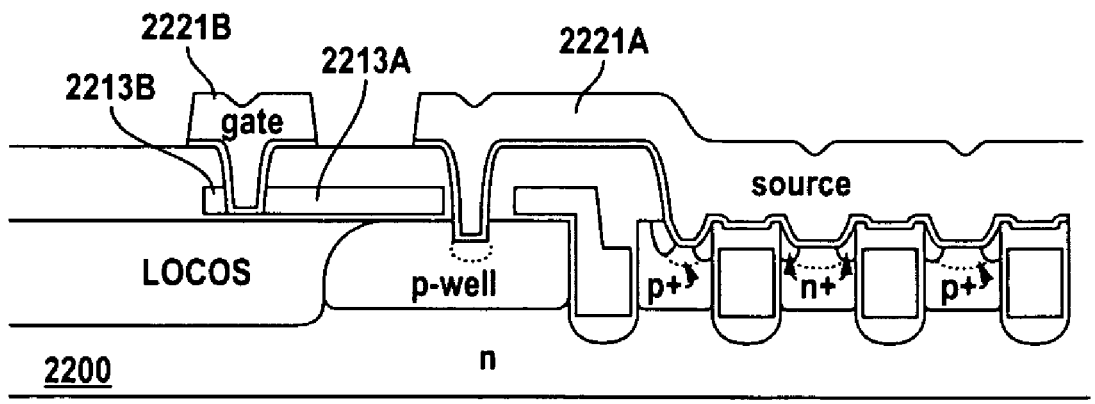

The process sequence corresponding to FIG. 20G is similar to that corresponding to FIG. 18H except that the FIG. 20G process sequence includes activation of the implanted regions. Also, unlike FIG. 18H wherein gate conductor 2021B contacts a top surface of polysilicon 2012C, gate conductor 2221B in FIG. 20G contacts the sidewalls of the surface polysilicon through opening 2218. If after the silicon recess step in FIG. 20F the surface polysilicon 2212C is not fully etched through (i.e., a portion of it remains along the bottom of opening 2218), then gate conductor 2021B would also contact a surface area of the remaining polysilicon in opening 2218.

In FIG. 20G, the thin layer directly beneath the source and gate conductor layers is an optional barrier metal. This embodiment is advantageous in that similar to the FIGS. 19A-19H embodiment only five masks are used up through the step of forming the top-side conductors, and also surface area is preserved by eliminating the need for source conductor layer 2121A (FIG. 19H) surrounding the peripheral gate conductor layer 2121B (FIG. 19H).

Figure 21A:
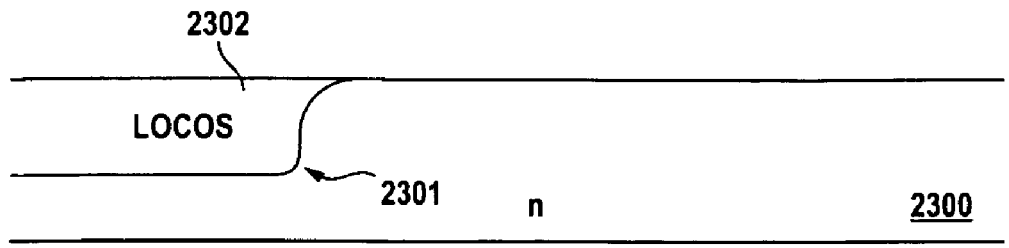
FIGS. 21A-21H are cross section views depicting a process sequence for forming a similar trenched-gate FET to that resulting from FIGS. 18A-18I except that a Schottky diode is integrated with the FET, in accordance with an exemplary embodiment of the invention.
Figure 21B:
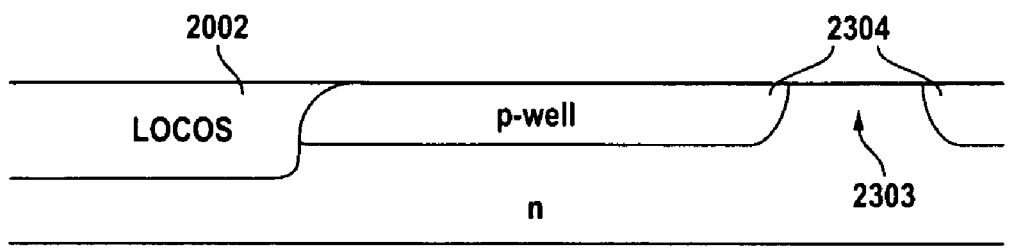

FIGS. 21A-21H are cross section views at different processing steps for forming a similar trenched-gate FET to that resulting from the process depicted by FIGS. 18A-18I, except that a Schottky diode is integrated with the FET. The process sequence corresponding to FIG. 21A is similar to that corresponding to FIG. 18A and thus will not be explained. In FIG. 21B, using a p-well blocking mask (the second mask), p-type impurities are implanted and driven in to form well regions 2304 in n-type silicon region 2300. The implanted impurities may alternatively be driven in at a later stage of the process sequence. The p-well blocking mask prevents the p-type impurities from being implanted into a portion 2303 of silicon region 2300 which, as will be seen, forms the Schottky region.

Figure 21C:
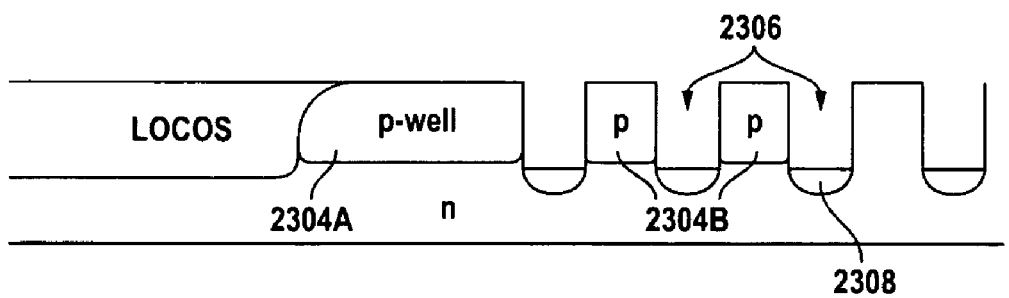
Figure 21D:
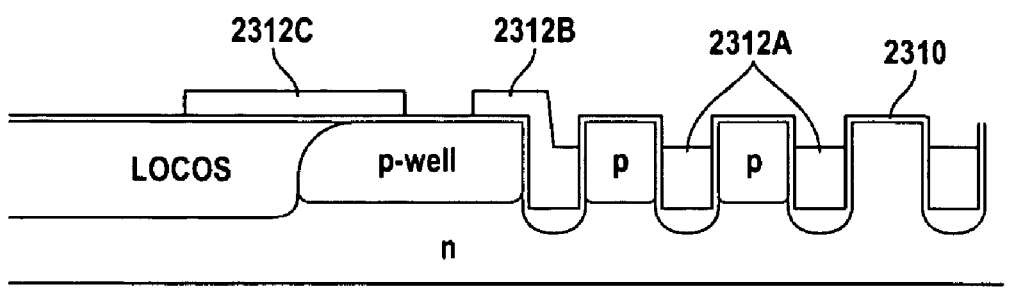
Figure 21E:
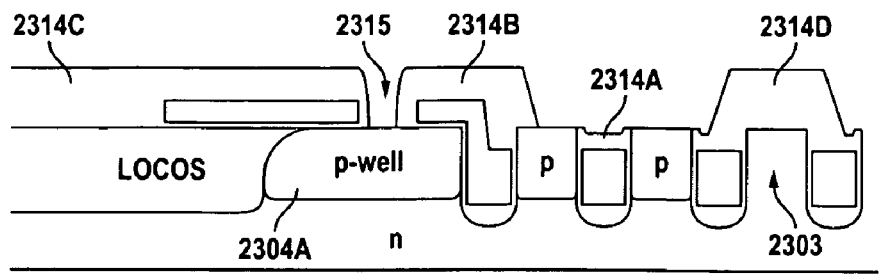
Figure 21F:
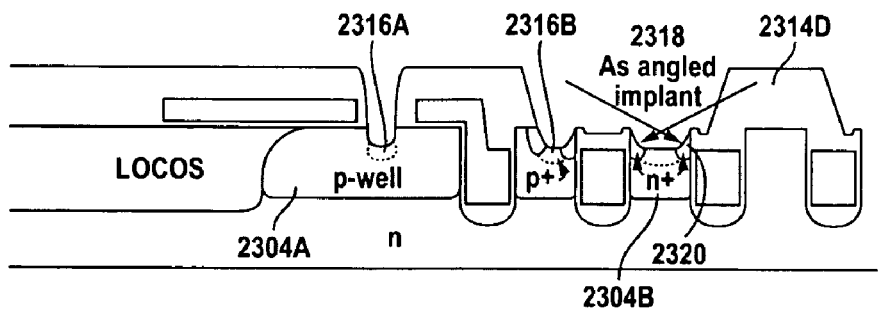

In FIGS. 21C and 21D, similar sets of process steps to those for FIGS. 18C and 18D are carried out and thus will not be described. In FIG. 21E, similar process steps to those for FIG. 18E are carried out however, the contact mask (fifth) and dielectric planarization steps are carried out such that portion 2314D of the insulating layer remains over Schottky region 2303 to prevent this region from receiving dopants during the later source and heavy body implant steps (FIG. 21F). The process sequence corresponding to FIG. 21F is similar to that corresponding to FIG. 18F and thus will not be described.

Figure 21G:
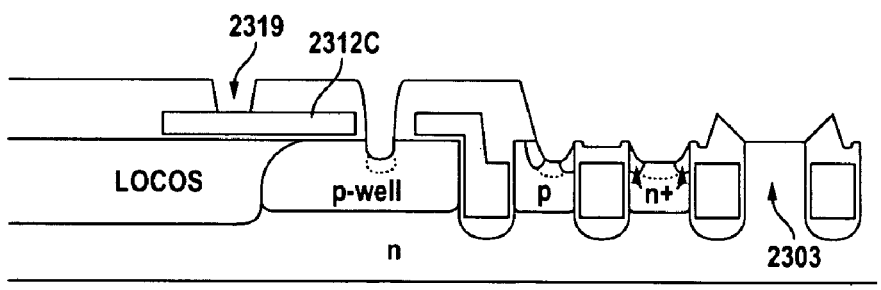
Figure 21H:
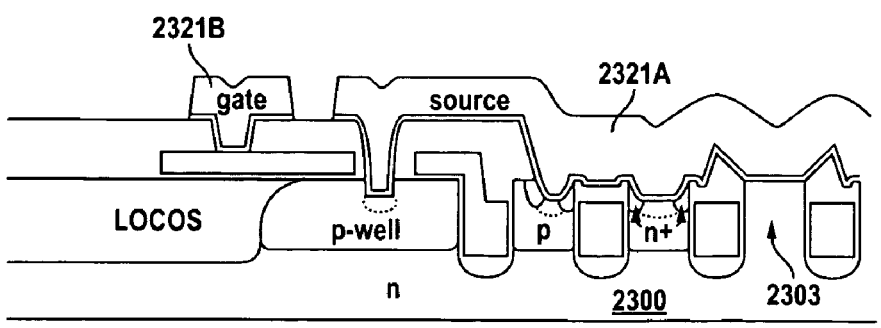

In FIG. 21G, an implant activation step is carried out to drive in the implanted dopants. A sixth mask is then used to define and etch both the insulating region 2314D from over the Schottky region 2303 and to form gate contact opening 2319 over the surface gate 2312C. The process sequence corresponding to FIG. 21H is the same as that corresponding to FIG. 18H, except that source conductor 2321A, in addition to contacting the source and heavy body regions, contacts Schottky region 2303 to form a Schottky contact with silicon region 2300 using, for example, titanium silicide as a barrier metal. A trenched-gate FET with an integrated Schottky diode is thus formed.

While FIGS. 21A-21H show how a Schottky diode is integrated with the process sequence depicted by FIGS. 18A-18I, the process sequences depicted by each of FIGS. 19A-19H, 20A-20G, 21A-21H, 22A-22F, 23A-23I, and 24A-24I may similarly be modified to integrate a Schottky diode therewith.

Figure 22A:
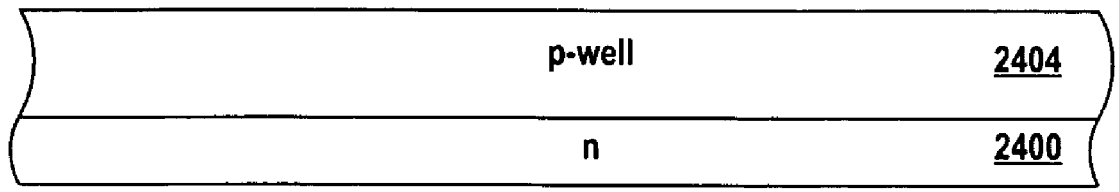
FIGS. 22A-22F are cross section views depicting yet another process sequence for forming a trenched-gate FET with reduced number of masks, in accordance with another embodiment of the invention.
Figure 22B:
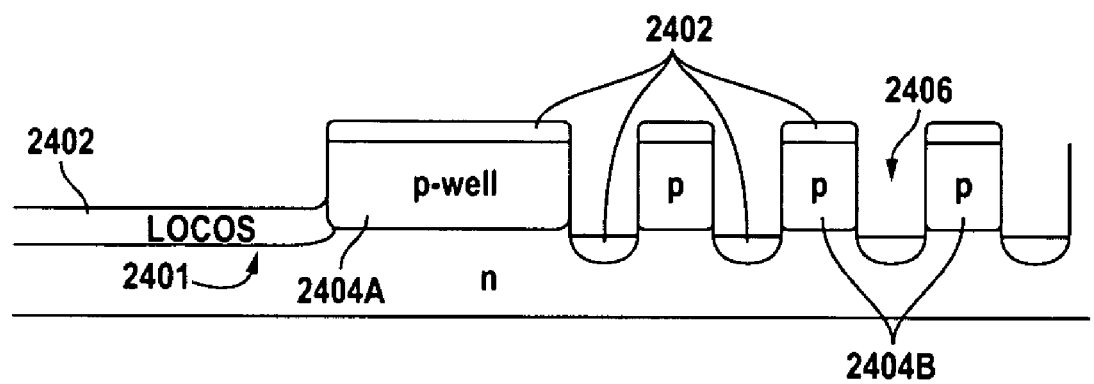

FIGS. 22A-22F are cross section views of another process sequence for forming a trenched-gate FET in accordance with an embodiment wherein the number of masks through formation of the top-side source and gate conductors is reduced to four. In FIG. 22A, a pad oxide layer (not shown) is formed over n-type silicon region 2400. Dopants of p-type conductivity are implanted and driven in to form p-well region 2404 in n-type silicon region 2400. The implanted impurities may alternatively be driven in at a later stage of the process sequence. A first mask is used to define and etch both trenches 2406 in the active region and wide trench 2401 in the termination region. A LOCOS thick bottom oxide (TBO) process is then used to form a layer of insulating material 2402 along the bottom portion of both the active trenches 2406 and the wide termination trench 2401 trench, as well as over a top surface of the silicon mesa between adjacent trenches.

Figure 22C:
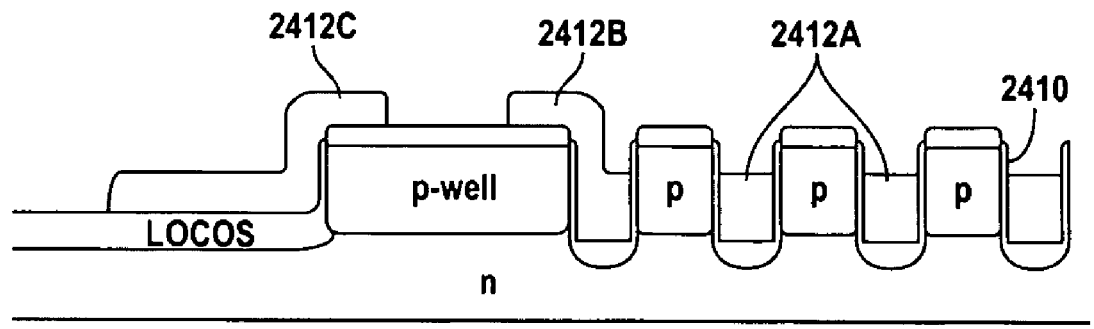
Figure 22D:
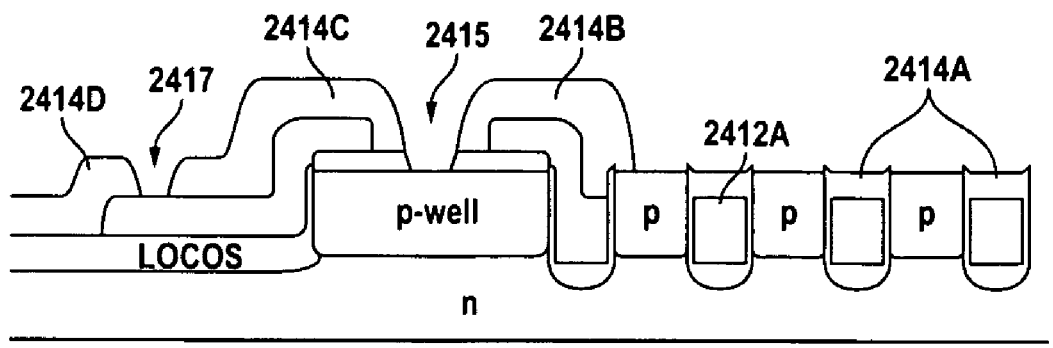
Figure 22E:
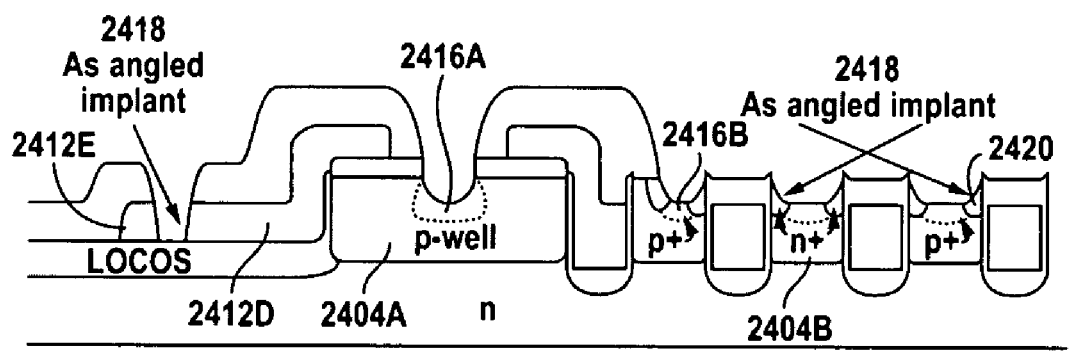
Figure 22F:
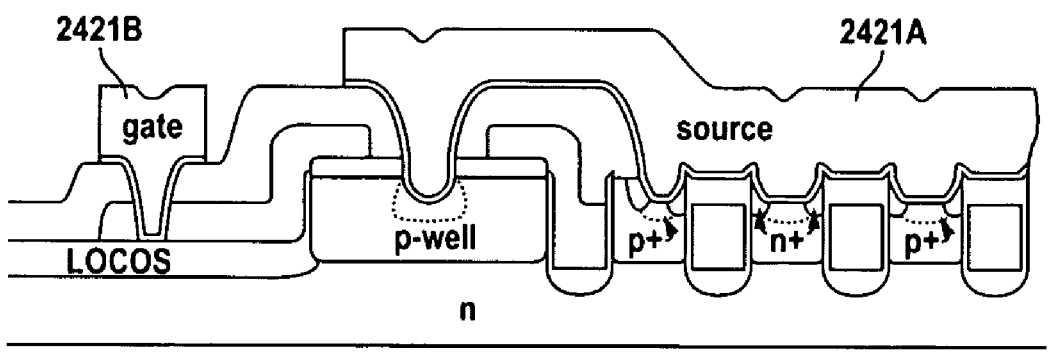

The process steps corresponding to FIG. 22C are similar to those corresponding to FIG. 20D, however in FIG. 22C instead of forming a planar surface polysilicon 2212C as in FIG. 20D, polysilicon 2412C extends over termination p-well 2204A and down into wide trench 2401. The process steps corresponding to each of FIGS. 22D, 22E, and 22F are similar to those corresponding to each of FIGS. 20E, 20F, and 20G, respectively, and thus will not be described. As can be seen in FIG. 22F, the gate conductor 2421B makes contact to sidewalls of gate 2412D inside the wide trench in the termination region. As in the FIGS. 20A-20G embodiment, if after the silicon recess step in FIG. 22E, the termination polysilicon 2412C is not fully etched through (i.e., a portion of it remains along the bottom of opening 2218 in polysilicon 2412C), then gate conductor 2021B would also contact a surface area of the remaining polysilicon in opening 2218. A total of 4 masks are used, which together with the passivation pad mask (as, for example, identified in the process sequence corresponding to FIG. 18I) makes a total of 5 masks.

Figure 23A:
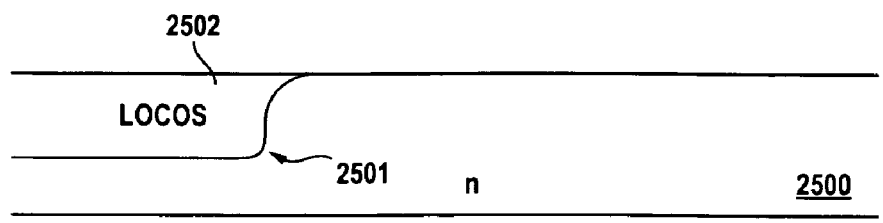
FIGS. 23A-23I are cross section views at different processing steps for forming a trenched-gate FET with self-aligned features, in accordance with yet another embodiment of the invention.
Figure 23B:
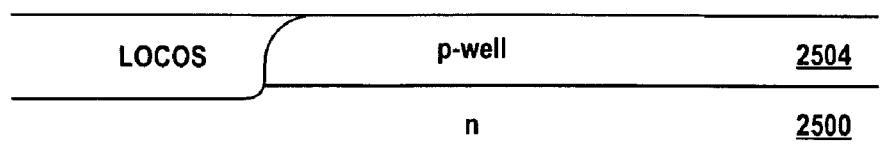
Figure 23C:
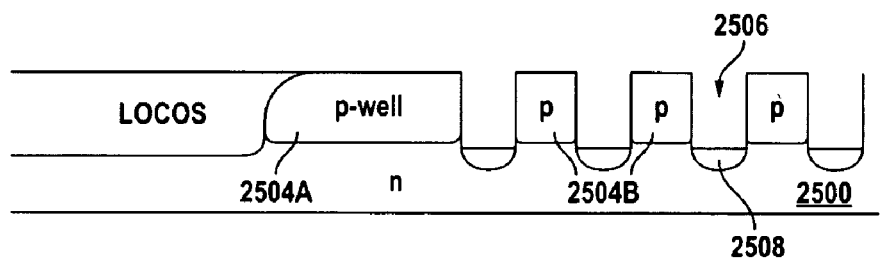
Figure 23D:
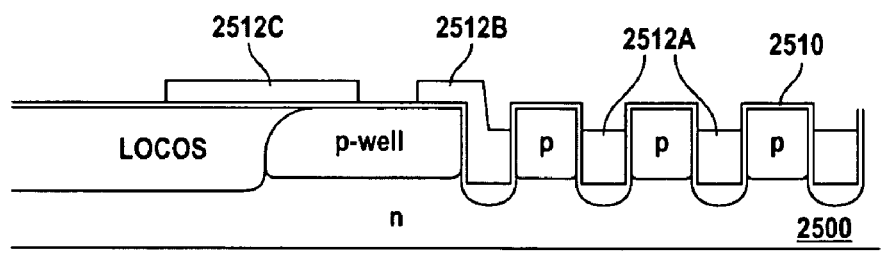
Figure 23E:
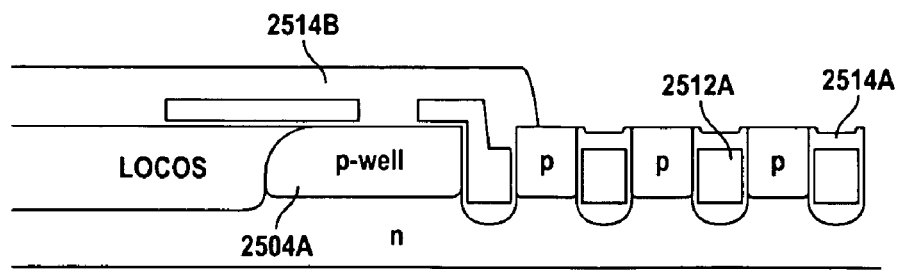
Figure 23F:
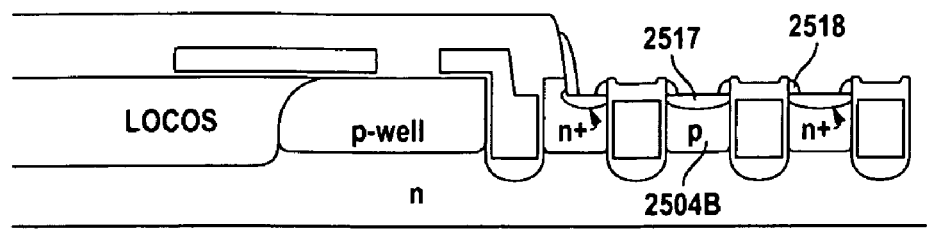
Figure 23G:
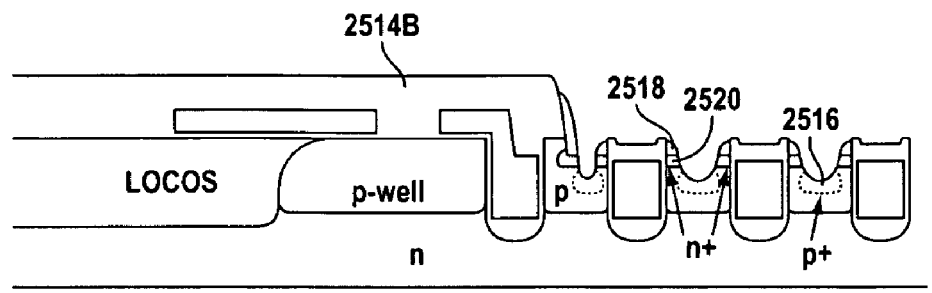

FIGS. 23A-23I are cross section views at different processing steps for forming a trenched-gate FET with self-aligned features, in accordance with yet another embodiment of the invention. The process steps corresponding to FIGS. 23A-23D are similar to those corresponding to FIGS. 18A-18D, and thus will not be described. In FIG. 23E, a dielectric layer is formed over the structure. A fourth mask is then used to cover the termination region as a dielectric planaraization etch is carried out in the active region so that dielectric caps 2514A remain over each trench gate 2512A. In FIG. 23F, a mesa recess etch is carried out to recess the p-type well regions 2504B below the top surface of dielectric caps 2514A such that upper sidewalls of dielectric caps 2514A become exposed. A blanket implant of dopants (e.g., arsenic) is then carried out to form n+ regions 2517 in well regions 2504B between adjacent trenches. Nitride spacers 2518 are then formed over n+ regions 2517 along the exposed sidewalls of dielectric caps 2514A using conventional techniques. In FIG. 23G, the exposed silicon mesa between adjacent spacers 2518 are recessed to a depth within well regions 2504B. The silicon recess removes the middle portion of n+ region 2517 (FIG. 23F), leaving outer portions 2520 of n+ regions 2517 extending directly below spacers 2518 intact. Portions 2520 form the transistor source regions. Dopants of p-type impurity are then implanted to form heavy body regions 2516.

Figure 23H:
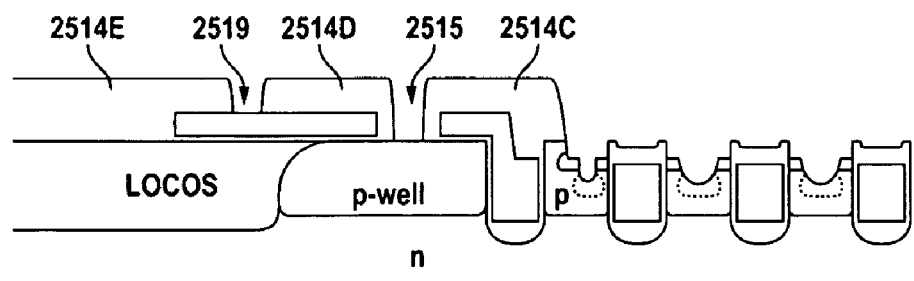
Figure 23I:
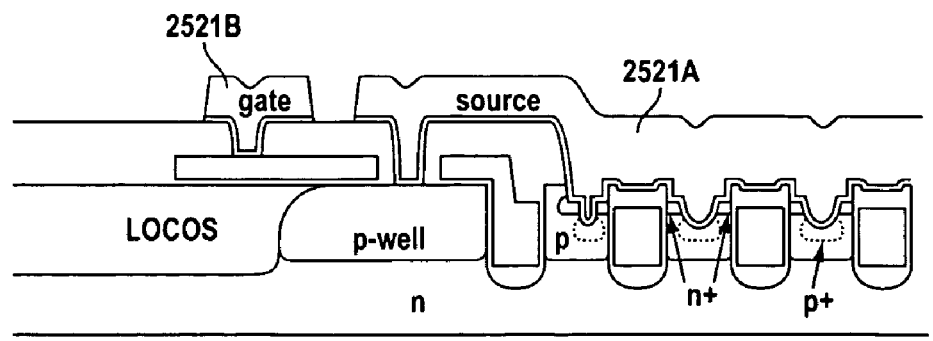

In FIG. 23H, nitride spacers 2518 are removed using conventional techniques. A fifth mask is then used in the termination region to create openings 2515 and 2519 in dielectric region 2514B. In FIG. 23I, source and gate conductors are formed in a similar manner to those in FIG. 18I. A total of six masks are thus used. This process sequence is particularly suitable for forming trench gate FETs with wide pitch body. Also, this process sequence advantageously results in formation of source and heavy body regions which are self-aligned to the trenches.

Figure 24A:
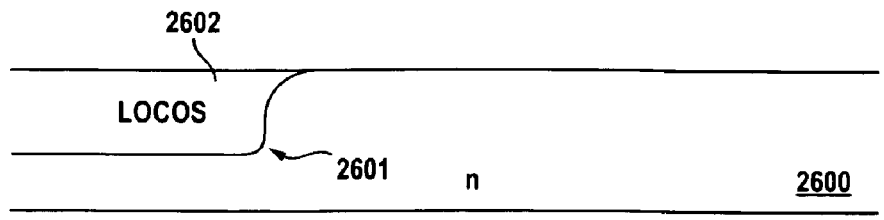
FIGS. 24A-24I show cross section views at different processing steps for forming a trenched-gate FET with self-aligned features in accordance with yet another embodiment of the invention.
Figure 24B:
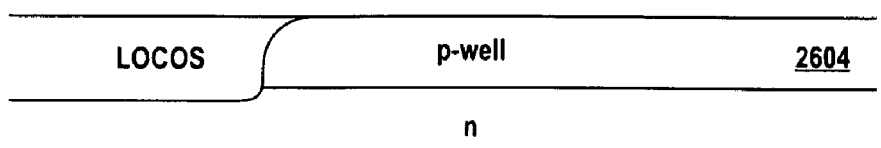
Figure 24C:
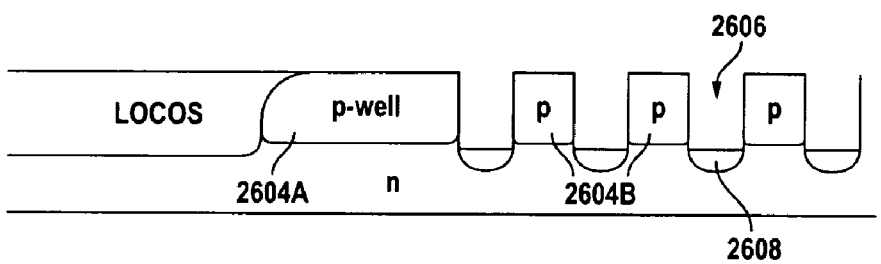
Figure 24D:
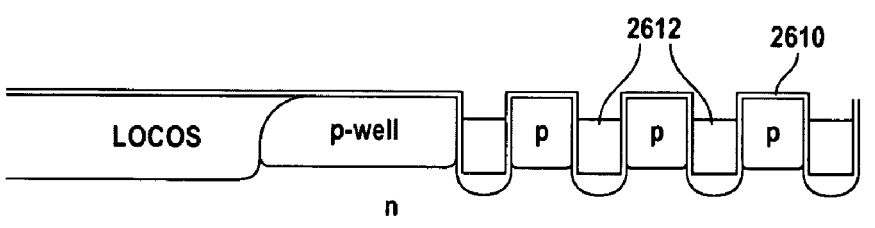
Figure 24E:
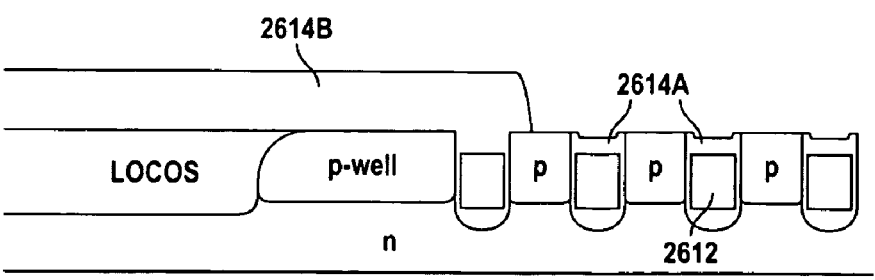
Figure 24F:
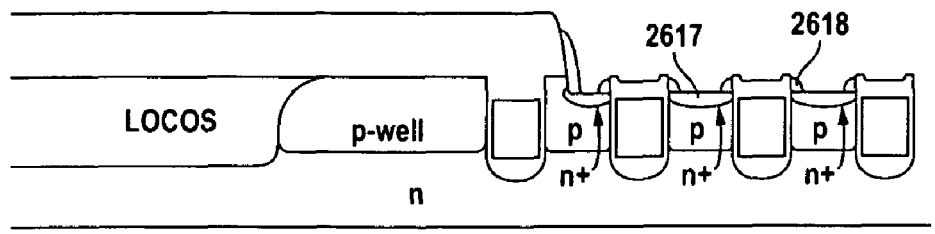
Figure 24G:
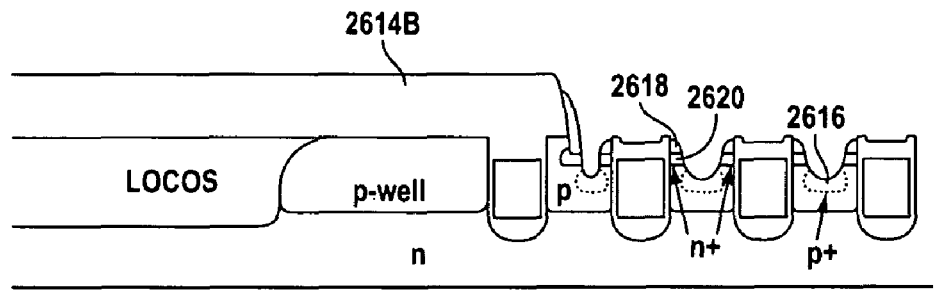

FIGS. 24A-24I are cross section views at different processing steps for forming a trenched-gate FET in accordance with yet another embodiment of the invention. The process steps corresponding to FIGS. 24A-24D are similar to those corresponding to FIGS. 19A-19D and thus will not be described. In FIG. 24E, a dielectric layer is formed over the structure. A third mask is then used to cover the termination region as a dielectric planaraization etch is carried out in the active region so as to form dielectric caps 2614A over each trench gate 2612. The process steps corresponding to FIGS. 24F and 24G are similar to those corresponding to FIGS. 23F and 23G, respectively, and thus will be not described.

Figure 24H:
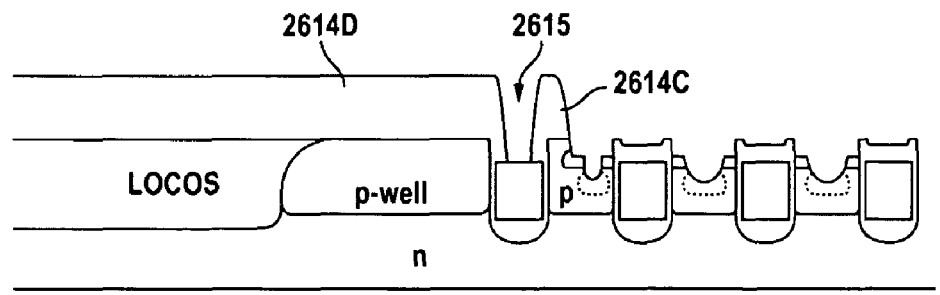
Figure 24I:
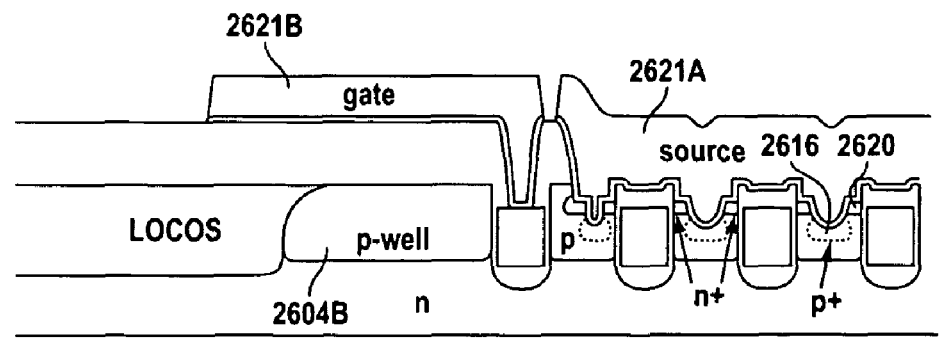

In FIG. 24H, nitride spacers 2618 are removed using conventional techniques. A fourth mask is then used in the termination region to create opening 2615 in dielectric region 2614B (FIG. 24G). In FIG. 24I, a metal layer is formed over the structure, and a fifth mask is used to define source conductor 2621A and gate conductor 2621B. As shown, source conductor 2621A contacts heavy body regions 2616 and source regions 2620 along their top surface and sidewall. Termination well region 2604B electrically floats. Alternatively, well region 2604B may be biased via an electrical contact made along the dimension into the page.

Similar to the embodiment represented by FIGS. 23A-23I, this embodiment is suitable for forming trench gate FETs with wide pitch body, and has source and heavy body regions which are self-aligned to the trenches. However, this embodiment advantageously requires one less mask than the FIG. 23A-23I embodiment.

While the various process sequences depicted by FIGS. 18A-18I, 19A-19H, 20A-20G, 21A-21H, 22A-22F, 23A-23I, and 24A-24I are shown in the context of a single gate trench structure, modifying these process sequence to include a shield electrode beneath the gate, similar to shield gate 1324 in FIG. 10, would be obvious to one skilled in this art in view of this disclosure.

The various structures and methods of the present invention may be combined with one or more of a number of charge spreading techniques disclosed in the above-referenced commonly assigned application Ser. No. 11/026,276, to achieve even a lower on-resistance, higher blocking capability and higher efficiency.

The cross-section views of the different embodiments may not be to scale, and as such are not intended to limit the possible variations in the layout design of the corresponding structures. Also, the various transistors can be formed in open cell architecture (e.g., stripe) or closed cell architecture (e.g., hexagonal or square shaped cells).

Although a number of specific embodiments are shown and described above, embodiments of the invention are not limited thereto. For example, it is understood that the doping polarities of the structures shown and described could be reversed and/or the doping concentrations of the various elements could be altered without departing from the invention. As another example, various exemplary accumulation-mode and enhancement mode vertical transistors described above have the trenches terminating in the drift region (a lightly doped epitaxial layer extending over the substrate), but they can also terminate in the more heavily doped substrate. Also, the features of one or more embodiments of the invention may be combined with one or more features of other embodiments of the invention without departing from the scope of the invention. For this and other reasons, therefore, the above description should not be taken as limiting the scope of the invention, which is defined by the appended claims.

What is claimed is:

1. A method of forming a field effect transistor having an active area and a termination region surrounding the active area, comprising:
    forming a well region in a first silicon region, the well region and the first silicon region being of opposite conductivity type;
    forming gate trenches extending through the well region and terminating within the first silicon region;
    forming a recessed gate in each gate trench;
    forming a dielectric cap over each recessed gate;
    removing a portion of the well region between adjacent trenches to expose upper sidewalls of each dielectric cap;
    performing a blanket source implant to form a second silicon region in an upper portion of the recessed well region between every two adjacent trenches, the second silicon region being of the same conductivity type as first silicon region;
    thereafter, forming a dielectric spacer along each exposed upper sidewall of the dielectric cap, every two adjacent dielectric spacers located between every two adjacent gate trenches forming an opening over the second silicon region; and recessing the second silicon region through the opening between every two adjacent dielectric spacers so that only portions of the second silicon region directly below the dielectric spacers remain, the remaining portions of the second silicon region forming source regions.

2. The method of claim 1 further comprising removing the dielectric spacers before forming the top-side conductor layer so that the top-side conductor layer contacts a top surface of each source region.

3. The method of claim 1 further comprising:
prior to forming the recessed gate, forming a thick bottom dielectric along a bottom portion of each gate trench; and
prior to forming the recessed gate, forming a gate dielectric lining the sidewalls of each gate trench, wherein the thick bottom dielectric is thicker than the gate dielectric.

4. The method of claim 1 further comprising:
prior to forming the recessed gate, forming a shield electrode along a bottom portion of each gate trench; and
prior to forming the recessed gate, forming a dielectric layer over each shield electrode.

5. The method of claim 1 further comprising:
forming a wide trench in the termination region; and
filling the wide trench with LOCOS.

6. The method of claim 1 further comprising forming a surface gate in the termination region simultaneously with forming the recessed gate in the gate trenches.

7. The method of claim 6 further comprising:
forming an opening over the surface gate; and
forming a gate conductor contacting the surface gate through the opening.

8. The method of claim 1 further comprising:
forming a termination trench in the termination region simultaneously with forming the gate trenches;
forming a recessed gate in the termination trench simultaneously with forming the recessed gate in the gate trenches;
forming an opening over the recessed gate in the termination trench; and
forming a gate conductor contacting the recessed gate in the termination trench through the opening.

9. A method of forming a field effect transistor having an active area and a termination region surrounding the active area, comprising:
forming a well region in a first silicon region, the well region and the first silicon region being of opposite conductivity type;
forming gate trenches extending through the well region and terminating within the first silicon region;
forming a recessed gate in each gate trench;
forming a dielectric cap over each recessed gate;

removing a portion of the well region between adjacent trenches to expose upper sidewalls of each dielectric cap;
thereafter, performing a blanket source implant to form a second silicon region in an upper portion of the recessed well region between every two adjacent trenches, the second silicon region being of the same conductivity type as first silicon region;
forming a dielectric spacer along each exposed upper sidewall of the dielectric cap, every two adjacent dielectric spacers located between every two adjacent gate trenches forming an opening over the second silicon region; and
recessing the second silicon region through the opening between every two adjacent dielectric spacers so that only portions of the second silicon region directly below the dielectric spacers remain, the remaining portions of the second silicon region forming source regions.

10. The method of claim 9 further comprising removing the dielectric spacers before forming the top-side conductor layer so that the top-side conductor layer contacts a top surface of each source region.

11. The method of claim 9 further comprising:
prior to forming the recessed gate, forming a thick bottom dielectric along a bottom portion of each gate trench; and
prior to forming the recessed gate, forming a gate dielectric lining the sidewalls of each gate trench, wherein the thick bottom dielectric is thicker than the gate dielectric.

12. The method of claim 9 further comprising:
prior to forming the recessed gate, forming a shield electrode along a bottom portion of each gate trench; and
prior to forming the recessed gate, forming a dielectric layer over each shield electrode.

13. The method of claim 9 further comprising:
forming a wide trench in the termination region; and
filling the wide trench with LOCOS.

14. The method of claim 9 further comprising forming a surface gate in the termination region simultaneously with forming the recessed gate in the gate trenches.

15. The method of claim 14 further comprising:
forming an opening over the surface gate; and
forming a gate conductor contacting the surface gate through the opening.

16. The method of claim 9 further comprising:
forming a termination trench in the termination region simultaneously with forming the gate trenches;
forming a recessed gate in the termination trench simultaneously with forming the recessed gate in the gate trenches;
forming an opening over the recessed gate in the termination trench; and
forming a gate conductor contacting the recessed gate in the termination trench through the opening.

* * * * *